United States Patent
Honda et al.

(10) Patent No.: US 6,512,693 B2
(45) Date of Patent: Jan. 28, 2003

(54) SEMICONDUCTOR DEVICE THAT ENABLES SIMULTANEOUS READ AND WRITE/ERASE OPERATION

(75) Inventors: Yasuhiko Honda, Yokohama (JP); Hideo Kato, Kawasaki (JP); Hidetoshi Saito, Yokohama (JP); Masao Kuriyama, Fujisawa (JP); Tokumasa Hara, Yokohama (JP); Takafumi Ikeda, Yokohama (JP); Tatsuya Hiramatsu, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/987,981

(22) Filed: Nov. 16, 2001

(65) Prior Publication Data

US 2002/0031038 A1 Mar. 14, 2002

Related U.S. Application Data

(62) Division of application No. 09/563,348, filed on May 3, 2000, now Pat. No. 6,377,502.

(30) Foreign Application Priority Data

May 10, 1999 (JP) .......................................... 11-129321
Mar. 9, 2000 (JP) .......................................... 2000-65397

(51) Int. Cl.[7] ............................................. G11C 16/04
(52) U.S. Cl. ........................... 365/185.13; 365/185.11; 365/189.04; 365/230.05
(58) Field of Search ....................... 365/185.11, 185.13, 365/185.29, 185.33, 189.04, 230.03, 230.05

(56) References Cited

U.S. PATENT DOCUMENTS

| | | | |
|---|---|---|---|
| 4,821,240 A | 4/1989 | Nakamura et al. | 365/228 |
| 4,866,603 A | 9/1989 | Chiba | 364/200 |
| 5,418,752 A | 5/1995 | Harari et al. | 365/218 |
| 5,847,998 A | * 12/1998 | Van Buskirk | 365/185.33 |
| 5,867,430 A | 2/1999 | Chen et al. | 365/189.04 |
| 6,016,270 A | * 1/2000 | Thummalapally et al. | 365/185.11 |
| 6,240,040 B1 | * 5/2001 | Akaogi et al. | 365/230.06 |

OTHER PUBLICATIONS

U.S. patent application Ser. No. 09/478,057, Kato, filed Jan. 2000.

U.S. patent application Ser. No. 09/523,729, Kuriyama, filed Mar. 2000.

* cited by examiner

Primary Examiner—Son Mai
(74) Attorney, Agent, or Firm—Banner & Witcoff, Ltd.

(57) ABSTRACT

A semiconductor device has a memory cell array having the arrangement of a plurality of cores, each of which comprises one block or a set of a plurality of blocks, each block defining a range of memory cells serving as a unit of data erase. The semiconductor device has a bank setting memory circuit configured to select an optional number of cores of the cores as a first bank and to set the remaining cores as a second bank, so as to allow a data read operation to be carried out in one of the first and second banks while a data write or erase operation is carried out in the other of the first and second banks.

18 Claims, 47 Drawing Sheets

|  | WRITE | ERASE | READ |
|---|---|---|---|
| DRAIN | 5V | OPEN | 1V |
| GATE | 8V | -7V | 5V |
| SOURCE | 0V | 5V | 0V |

SEMICONDUCTOR DEVICE THAT ENABLES SIMULTANEOUS READ AND WRITE/ERASE OPERATION

This application is a Divisional of U.S. application Ser. No. 09/563,348 filed on May 3, 2000 now U.S. Pat. No. 6,377,502.

RELATED APPLICATION

This application claims benefit of priority under 35 U.S.C. §119 to Japanese Patent Applications No. H11-129321, filed on May 10, 1999, and 2000-65397, filed on Mar. 9, 2000, the entire contents of which are incorporated by reference herein.

BACKGROUND OF THE INVENTION

1. Field of The Invention

The present invention relates generally to a semiconductor device, such as an electrically rewritable nonvolatile semiconductor memory device (EEPROM flash memory). More specifically, the invention relates to a flash memory system capable of simultaneously executing a data write or erase operation and a data read operation.

2. Description of The Related Background Art

Conventionally, there are various electronic systems wherein a plurality of memory devices are incorporated. For example, there is an electronic system wherein an EEPROM flash memory and an SRAM are incorporated to store data of the flash memory in the SRAM to exchange data between a CPU and the flash memory via the SRAM and to be capable of directly rewriting data of the flash memory without passing through the SRAM.

On the other hand, there is recently known a memory system called a read while write (RWW) type memory system capable of reading data out from a certain memory region while writing or erasing data in another memory region in order to reduce the number of memory chips necessary for the system. In order to form a memory device of this type, completely independent two memory regions may be simply provided in the memory device.

However, if the independently accessed regions are only simply provided in the memory device, there are problems as an RWW type memory system. First, since each of the memory regions independently requires a decoder and a sense amplifier, the layout area thereof is large. Secondly, if bit lines and word lines are continuously arranged independently every one of the memory regions, it is not possible to divide each of the memory regions into blocks to read and write data every block. That is, the range of the parallel execution of a data read operation and a data write operation is fixed, so that the system can not be applied to many uses. In order for the system to be applied many uses, a plurality of kinds of systems having different capacities of memory regions must be prepared.

In a conventional flash memory capable of simultaneously executing a data write or erase operation and a data read operation, a memory cell array is physically fixed to two banks. For example, considering a 32-Mbit flash memory chip, the capacity thereof is fixed so that one of the banks has 0.5 Mbits and the other bank has 31.5 Mbits. Therefore, users must newly buy another chip when requiring a different bank size.

In addition, as a circuit construction, dedicated address and data lines are provided every bank. When a write or erase operation is executed in blocks of one of banks, the power supply line of the one of the banks is connected to a writing or erasing power supply line by a power supply switch, and the power supply line of the other bank is connected to a reading power supply side. If the opposite operation instruction is inputted, each of the banks is connected to the power supply line on the opposite side by a corresponding one of the power supply switches.

Moreover, a set of sense amplifiers for detecting memory cell data are provided exclusively for each of the banks. For that reason, although it is possible to execute a read operation from memory cells in one of the banks while executing a write or erase in blocks in the other bank, it is impossible to simultaneously execute a write or erase operation and a read operation in the same bank.

In addition, since the banks are physically fixed, there is a severe limit to addresses capable of being simultaneously executed, and the size of each of the banks is also fixed, so that the degree of freedom is very low.

SUMMARY OF THE INVENTION a memory cell array having the arrangement of a plurality of cores, each of which comprises one block or a set of a plurality of blocks, each block defining a range of memory cells serving as a unit of data erase, each of said memory cells being an electrically rewritable nonvolatile memory cell;

a core selecting portion configured to select an optional number of cores from said plurality of cores for writing or erasing data;

a data writing portion configured to write data in a selected memory cell in a core selected by said core selecting portion;

a data erasing portion configured to erase data from a selected block in a core selected by said core selecting portion;

a data reading portion configured to read data out from a memory cell in a core which is not selected by said core selecting portion; and a bank setting memory circuit configured to select an optional number of cores of said plurality of cores as a first bank and to set the remaining cores as a second bank, so as to allow a data read operation to be carried out in one of said first and second banks while a data write or erase operation is carried out in the other of said first and second banks.

According to another aspect of the present invention, a nonvolatile semiconductor memory device having a power supply control circuit for detecting an internal power supply voltage to hold a transition in the internal power supply voltage at a set level, wherein said power supply control circuit has a dummy load capacity selectively connected in accordance with a load capacity of an internal power supply.

According to a further aspect of the present invention, a nonvolatile semiconductor memory device having a power supply control circuit for detecting an internal power supply voltage to hold a transition in the internal power supply voltage at a set level, wherein said power supply control circuit has a circuit for changing an internal power supply driving capability in accordance with a load capacity of an internal power supply.

According to a still further aspect of the present invention, a semiconductor device comprising:

a plurality of functional blocks, each of which is arranged as a certain lump of circuit functions;

a signal line, arranged in a region of each of said functional blocks, for exchanging a signal between each of said functional blocks and the outside; and a common bus line which is provided on a region of said plurality of functional blocks and commonly for said plurality of blocks and which is connected to said signal line via a contact.

According to still further aspect of the present invention, a nonvolatile semiconductor memory device which has the arrangement of a plurality of cores comprising a set of electrically rewritable nonvolatile memory cells and which is capable of reading data in an optional core of said plurality of cores while rewriting/erasing data in another optional core of said plurality of cores, said nonvolatile semiconductor memory device comprising:

a first data comparator circuit for comparing current of a first data line, which is selected in a verify read operation for data write/erase in one core of said plurality of cores, with current of a first reference signal line;

a second data comparator circuit for comparing current of a second data line, which is selected in a usual data read operation in the other core of said plurality of cores, with current of a second reference signal line;

first and second current source transistors for allowing a constant current to pass through each of said first and second reference signal lines; and a reference constant current source circuit for driving said first and second current sources in parallel.

DESCRIPTION OF THE PREFERRED EMBODIMENTS

Referring now to the accompanying drawings, the preferred embodiments of the present invention will be described below.

(First Preferred Embodiment)

Figure 1:
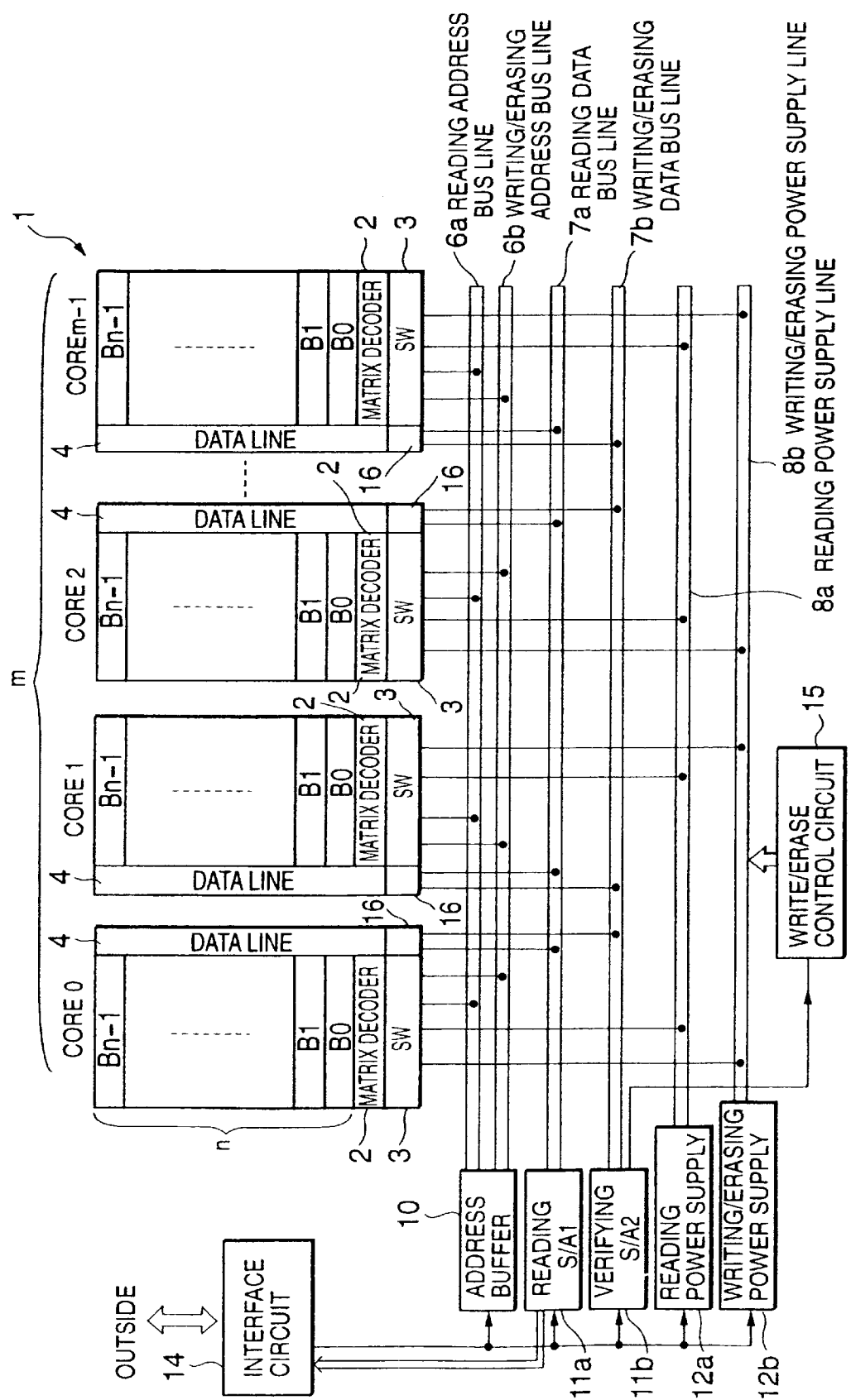
FIG. 1 is a block diagram of a principal part of a preferred embodiment of a flash memory according to the present invention.

FIG. 1 shows the construction of a flash memory chip using a free core system according to the present invention. A memory cell array 1 comprises m cores 0 through m-1, each of which has the arrangement of n blocks B0 through Bn-1. Each of the blocks B0 through Bn-1 is the minimum unit of data erase, and has the arrangement of a plurality of memory cells. Each of the memory cells is, e.g., a nonvolatile memory cell having a stacked gate structure. Although a core is defined as one block or a set of a plurality of blocks, each of the cores comprises n Blocks B0 through Bn-1 in the shown example.

Each of the cores is provided with a decoder circuit 2 including row and column decoders for selecting memory cells, and a local data line 4.

Commonly for all of such cores of the memory cell array 1, a first address bus line (a reading address bus line) 6*a* for selecting a memory cell during a data read operation, and a second address bus line (a writing/erasing address bus line) 6*b* necessary for an automatic operation during a data read or erase operation are provided.

Address signals are inputted from the outside by an address input circuit provided in an interface circuit 14, and supplied to an address buffer circuit 10. From this address buffer 10, a reading address and a writing/erasing address are supplied to the address bus lines 6*a* and 6*b*, respectively, in accordance with an operation mode. The addresses supplied to the address bus lines 6*a* and 6*b* are selectively transferred to the decoder circuit 2 of each of the cores by a switching circuit 3 for switching address and power supply lines provided for each of the cores.

Commonly for all of the cores, a first data bus line (a reading data bus line) 7*a* used for a data read operation, and a second data bus line (a writing/erasing data bus line) 7*b* are provided. A first sense amplifier circuit (a reading sense amplifier circuit) 11*a* used for a data read operation, and a second sense amplifier circuit (a verifying sense amplifier) 11*b* used for a verify read operation during a data write or erase operation are provided so as to correspond to the data bus lines 7*a* and 7*b*, respectively.

By a data line switching circuit 16, the local data line 4 provided for each of the cores is connected to the reading data bus line 7*a* during a data read operation and to the writing/erasing data bus line 7*b* during a data write or erase operation. That is, data of selected memory cells of each of the cores are read out to the local data line 4, to be transferred to the data bus line 7*a* or 7*b* by the data line switching circuit 16 in accordance with an operation mode, to be detected and amplified by the reading sense amplifier circuit 11*a* and the verifying sense amplifier circuit 11*b*, respectively.

The read results of the verifying sense amplifier circuit 11*b* are fed to a write/erase control circuit 15. In the write/erase control circuit 15, it is determined whether write or erase is sufficient. If it is insufficient, the control of rewrite or re-erase is carried out.

In addition, commonly for all of the cores, a first power supply line (a reading power supply line) 8*a*, to which a reading power supply potential is supplied from a reading power supply 12*a*, and a second power supply line (a writing/erasing power supply line) 8*b*, to which a data writing or erasing power supply potential is supplied from a writing or erasing power supply 12*b*, are provided. A voltage boosted by a power supply VCC is applied to the reading power supply line 8*a* during a data read operation, to be supplied to the gate of a memory cell to allow a high-speed read operation. These power supply lines 8*a* and 8*b* are selectively switched by the switching circuit 3 to be supplied to the decoder circuit 2 of each of the cores.

With the above described construction, even if a data read operation and a data write or erase operation are simultaneously executed, the respective operations can be controlled by the independent address bus lines, data bus lines, sense amplifier circuits and power supply circuits.

Specifically, the operation of simultaneously executing data write and erase operations in the flash memory in this preferred embodiment will be described below.

Now, a case where a data write operation is carried out with respect to core 0 and where cell data are read out from another core will be described. If a selecting address signal for core 0 part is inputted from the outside of the chip and if a write command is inputted, the write command is determined by the interface circuit 14, and a write flag rises. By this flag, the address signal of the writing/erasing address bus line 6b is inputted to the decoder circuit 2 of core 0 by the switching circuit 3 of core 0 part, so that the power supply of the writing/erasing power supply 12b is supplied. In addition, the data line 4 of core 0 part is connected to the writing/erasing data bus line 7b which is connected to the verifying sense amplifier circuit 11b.

By thus setting the address bus lines, data bus lines and power supply lines, a boosted write voltage is applied to a selected word line in core 0, and a high voltage or a low voltage is applied to bit lines from the write control circuit 15 in accordance with write data. Thus, if the memory cells have a floating gate type MOS transistor structure, hot electrons are injected into the floating gate of a selected memory cell to carry out a data write operation. When one write operation is completed, data are read out to be detected by the verifying sense amplifier circuit 11b. Then, a verify determination is carried out by the write control circuit 15. If write is sufficient, the operation is completed, and if write is insufficient, additional write is carried out.

During the above described data write operation in core 0, a data read operation can be carried out in another optional core, e.g., core 1. That is, by the address inputted from the outside, the address signal of the reading address bus line 6a is supplied to the decoder circuit 2 of core 1 including a memory cell, from which data are intended to be read out, and the power supply output of the reading power supply 12a is supplied thereto. In addition, the data line 4 is connected to the reading data bus line 7a via the switching circuit 16. No data write and read are carried out. To the decoder circuits 2 of other cores, no address signal is inputted, and no data bus line is connected. The data read out from the selected memory cell of core 1 are detected and amplified by the reading sense amplifier circuit 11a via the reading data bus line 7a. The read data are outputted to the outside of the chip via the interface circuit 14.

In this preferred embodiment, in the above described operation, there is no concept of conventional banks dividing area. That is, it is possible to optionally read data in any one of cores other than core 0, in which the data write operation is being carried out, e.g., in core 2, core 3 or core m−1. It is prohibited to input the address of core 0, in which the data write operation is being carried out, to execute a data read operation therein. Thus, if a read demand is made with respect to a core, in which a data write operation is being carried out, a polling signal indicating that a write operation is being carried out in the selected core is outputted to inform of this, as will be described later.

The operation of simultaneously executing data erase and read operations is basically the same. For example, a case where a data erase operation is carried out with respect to a selected block of core 0 and where cell data are read out from another core will be described. If a selecting address signal for a block in core 0 is inputted from the outside of the chip and if an erase command is inputted, the erase command is determined by the interface circuit 14, and an erase flag rises. By this flag, the address signal of the writing/erasing address bus line 6b is inputted to the decoder circuit 2 of core 0 by the switching circuit 3 of core 0, so that the erasing power supply potential of the writing/erasing power supply 12b is supplied. In addition, by the data line switching circuit 16, the data line 4 of core 0 part is connected to the writing/erasing data bus line 7b which is connected to the verifying sense amplifier circuit 11b.

By thus setting the address bus lines, data bus lines and power supply lines, a negative voltage is applied to all of word lines of a selected block of selected core 0 to open bit lines, and a high positive voltage for erase is applied to source lines to erase data every block. When one data erase operation is completed, data are read out to be detected by the verifying sense amplifier circuit 11b. In the write control circuit 15, it is determined whether erase is sufficient. If erase is sufficient, the operation is completed, and if erase is insufficient, additional erase is carried out.

During the data erase operation with respect to core 0, if a data read demand is made with respect to another optional core, a data read operation is carried out with respect to the core.

Furthermore, while the operation of a NOR memory cell wherein a high voltage is applied to a source to carry out an erase operation has been described, the operation of a memory cell of a type wherein a high voltage is applied to the substrate side of a memory cell is the same. In addition, the operation control of a NAND memory cell can be the same.

The detailed construction of the respective parts of FIG. 1 will be described below.

Figure 2A:
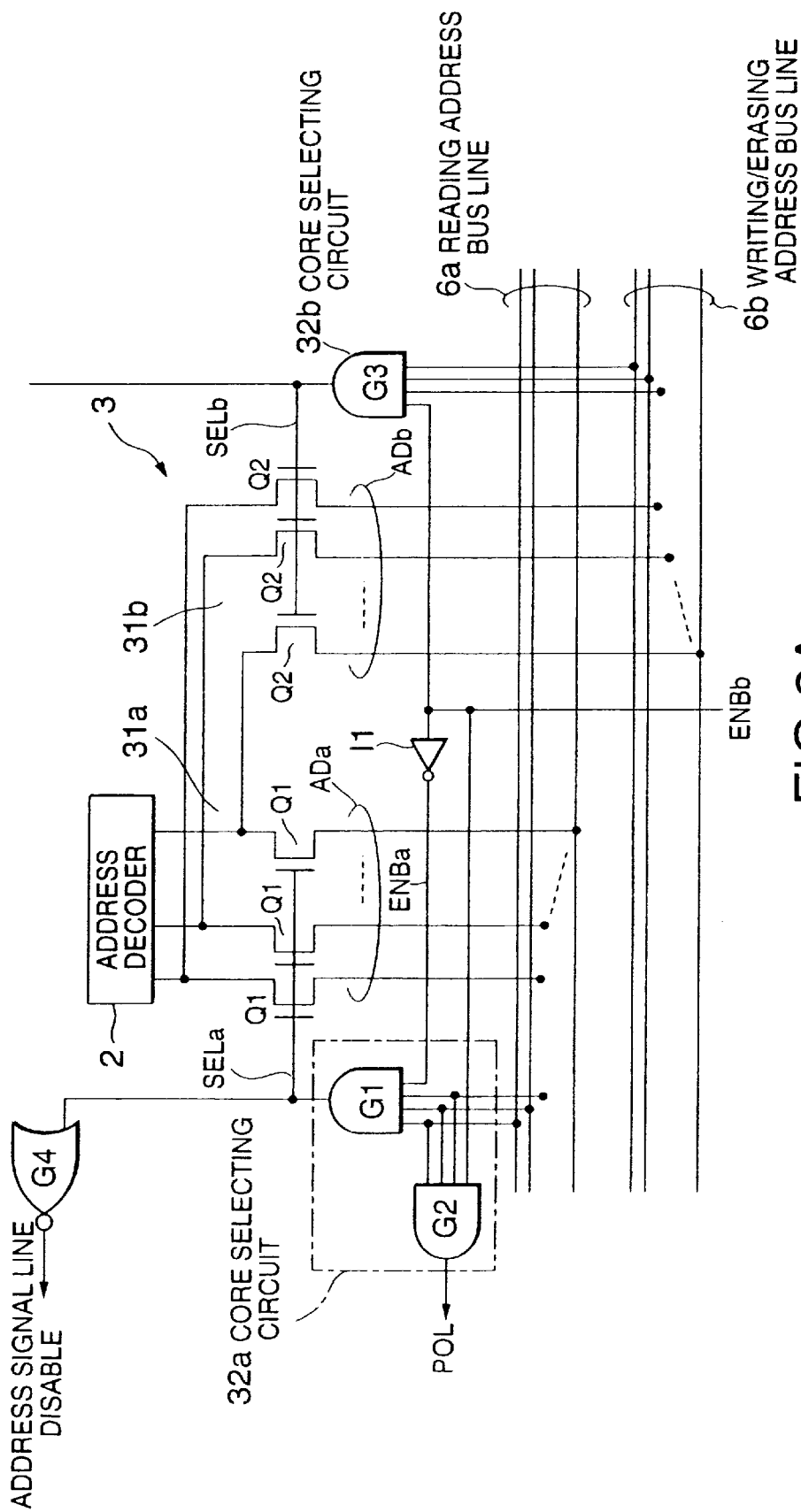
FIG. 2A is a circuit diagram of an address line switching circuit in this preferred embodiment.

FIG. 2A shows the construction of the address line switching circuit part of the switching circuit 3 in each core. The switching circuit 3 has two selecting switch groups 31a, 31b and core selecting circuits 32a, 32b for selectively driving the selecting switch groups. The core selecting circuits 32a and 32b are activated by enable signals ENBa and ENBb, respectively. As will be described later, the enable signal ENBb is a write/erase enable signal which is "H" when a write or erase command is inputted. The enable signal ENBa obtained by inverting the enable signal ENBb by an inverter I1 is a read enable signal which is "H" during a data read operation.

One core selecting circuit 32b comprises an AND gate G3 activated by the enable signal ENBb="H" during a data write or erase operation. A core selecting address signal of the writing/erasing address bus line 6b is inputted to the AND gate G3, which outputs a core selecting signal SELb= "H" to a selected core. By this core selecting signal SELb, the selecting switch group 31b is turned on during a data write or erase operation. Thus, a writing or erasing address signal ADb of the writing/erasing address bus line 6b is supplied to the decoder circuit of the selected core.

The other core selecting circuit 32a comprises an AND gate G1 activated by the read enable signal ENBa. To the AND gate G1, a core selecting address of the reading address bus line 6a is inputted. When the enable signal ENBb is "H", the enable signal ENBa is "L", so that the core selecting signal SELa being the output of the AND gate G1 is "L" when the core is selected for a data write or erase operation. At this time, the selecting switch group 31a remains being OFF. When the core is selected for a data read operation, the selecting signal SELa="H", so that the selecting switch group 31a is turned on to fed a reading address signal ADa of the reading address bus line 6a to the decoder circuit 2.

That is, in this preferred embodiment, it is prohibited that the writing or erasing core selecting signal SELb and the reading core selecting signal SELa simultaneously have "H" (glitch) with respect to one core. Thus, when a data write or erase operation is carried out with respect to a certain core, a data read operation can not be carried out in the same core.

In the core selecting circuit 32a, there is provided another AND gate G2, to which the same reading core selecting address signal as that of the AND gate G1 is inputted. This AND gate G2 is a polling signal generator circuit for informing that a data write or erase operation is being carried out in a core when a read demand is inputted to the core. To the AND gate G2, a write or erase enable signal ENBb is inputted as an activating signal. Therefore, when the read demand enters the core wherein the write or erase operation is being carried out, the AND gate G2 holds the core selecting signal SELa="L" while outputting a data polling signal POL="H".

When both of the two core selecting signals SELa and SELB have "L", this indicates that the core is unselected. This is detected by a NOR gate G4 which outputs a signal DISABLE for deactivating the address line of the unselected core.

Figure 3:
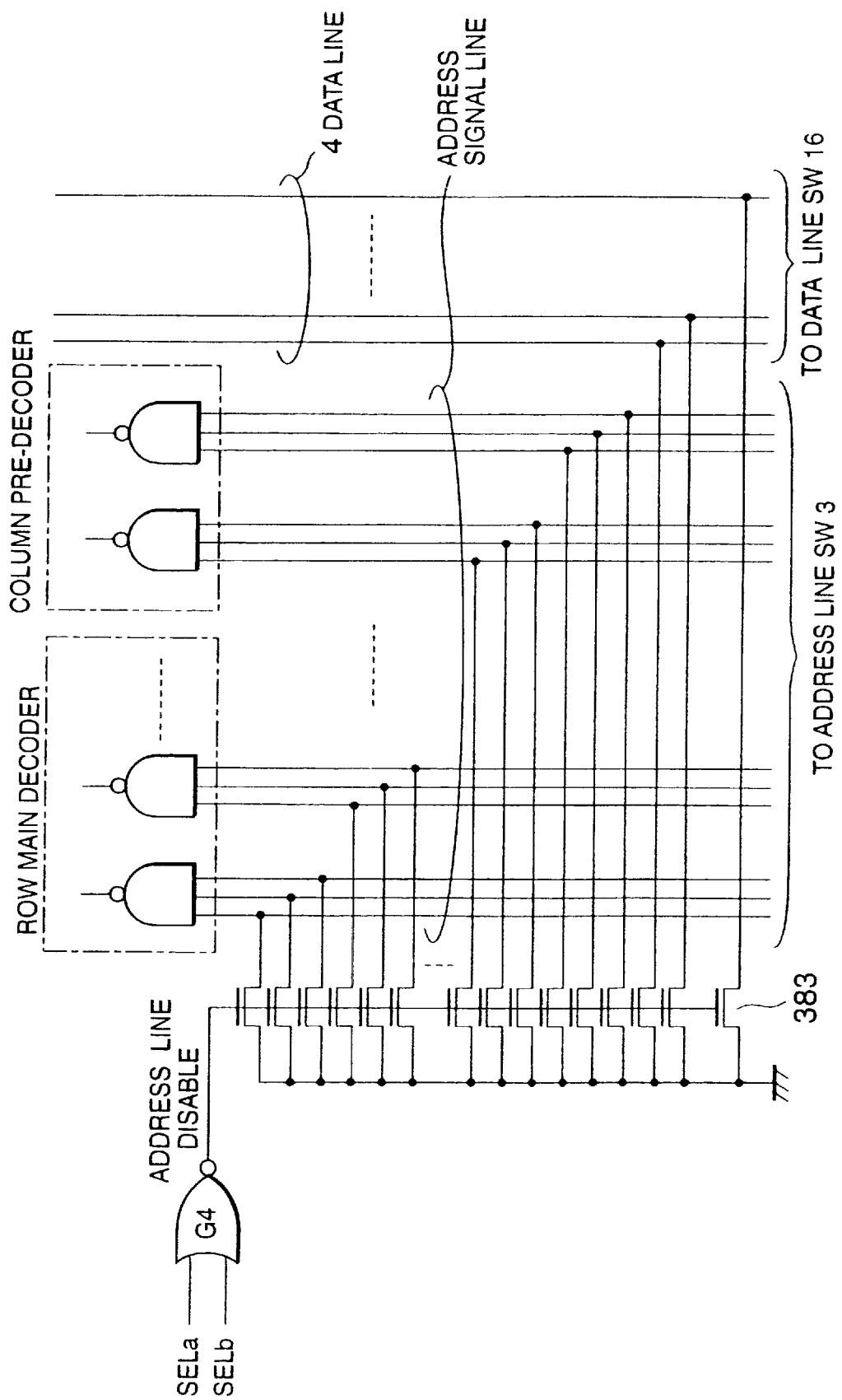
FIG. 3 is a circuit diagram of a circuit for deactivating address lines in an unselected core in the preferred embodiment.

FIG. 3 shows a circuit part for forcing the address signal lines and so forth in the unselected core to be grounded by the above described signal DISABLE. As shown in this figure, a short-circuiting transistor 383 for causing the address lines and data lines 4 to be grounded is provided in each of the cores. The short-circuiting transistor 383 is controlled by the NOR gate G4. When the core is unselected, DISABLE="H", so that the short-circuiting transistor 383 is turned on to discharge electric charges of all of the address and data lines in the core.

Thus, it is prohibited that the address and data lines are floating in the unselected core. As a result, it is possible to prevent malfunction due to electrostatic noises and so forth, destruction of gate insulator films of the respective parts, destruction of data, and so forth.

The address line switching circuit shown in FIG. 2A uses a system wherein when both of the two core selecting signals SELa and SELb have "L", both of the address signal switch groups 31a and 31b are turned off, and the useless wiring capacity of the unselected core is not connected to the reading address bus line 6a and the writing/erasing address bus line 6b.

Figure 2B:
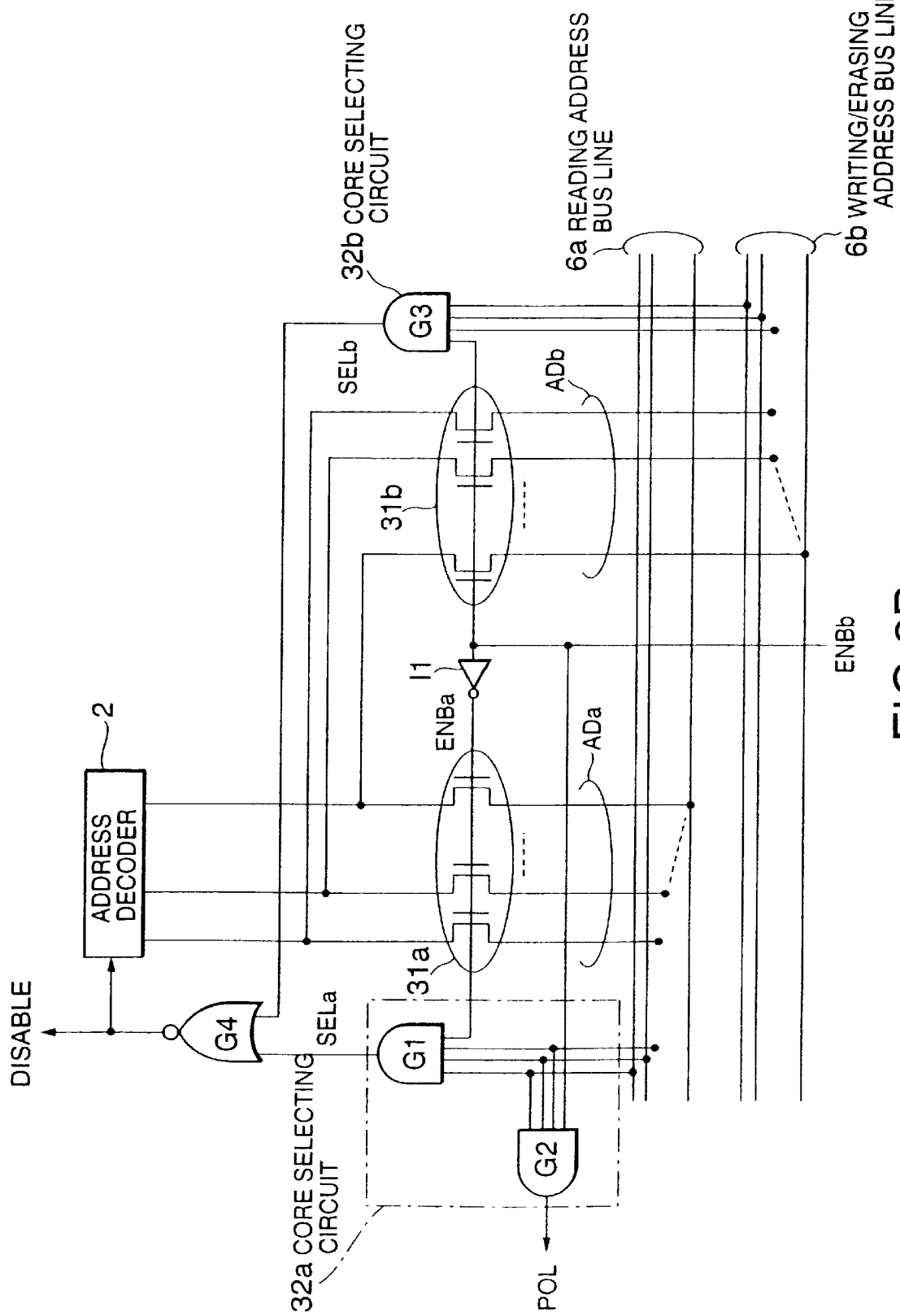
FIG. 2B is a circuit diagram of another address line switching circuit.

On the other hand, as shown in FIG. 2B, the address line switch groups 31a and 31b may be controlled by the enable signals ENBa and ENBb, respectively.

In the system of FIG. 2B, when a write or erase operation is executed in the core, the address line switch group 31b is turned on, so that the writing or erasing address signal ADb of the writing/erasing address bus line 6b is supplied to the decoder circuit 2. When no write or erase operation is executed in the core, the address line switch group 31a is always turned on, and the reading address signal ADa of the reading address bus line 6a is supplied to the decoder circuit 2. In the unselected core, the disable signal DISABLE is "H", all of the decoder circuits are unselected, and the data lines are discharged.

In this system, it is not required to turn the address line switch group 31a on during the data read operation, so that it is possible to reduce the switching time to accelerate the data read operation.

Figure 4:
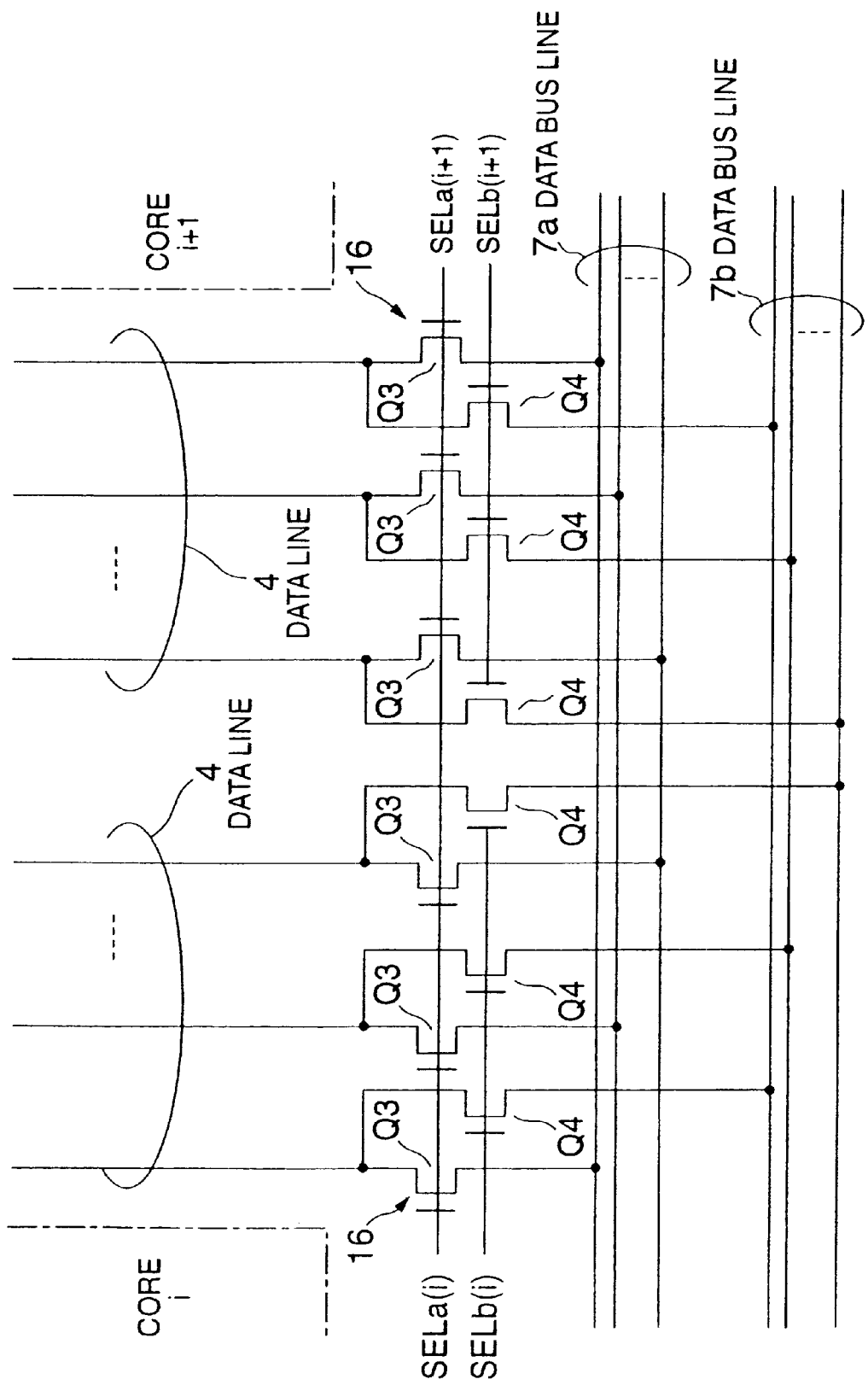
FIG. 4 is a circuit diagram of a data line switching circuit in the prefered embodiment.

FIG. 4 shows a data line switching circuit 16 for switching the connection between the local data line 4 and the reading data bus line 7a and the writing/erasing data bus line 7b, taking notice of adjacent cores i and i+1. The group of NMOS transistors Q3 are controlled by the core selecting signal SELa, which is the output of the core selecting circuit 32a, to switch the connection and disconnection between the local data line 4 and the reading data bus line 7a. The group of NMOS transistors Q4 are controlled by the core selecting signal SELb, which is the output of the core selecting circuit 32b, to switch the connection and disconnection between the local data line 4 and the writing/erasing data bus line 7b.

That is, when a certain core is in a data write or erase mode, the core selecting signal SELb(i) is "H" in the core, so that the transistor Q4 is turned on to connect the local data line 4 to the writing/erasing data bus line 7b. Inversely, when a certain core is in a data read mode; the core selecting signal SELa(i) is "H" in the core, so that the transistor Q3 is turned on to connect the local data line 4 to the reading data bus line 7b.

Figure 5:
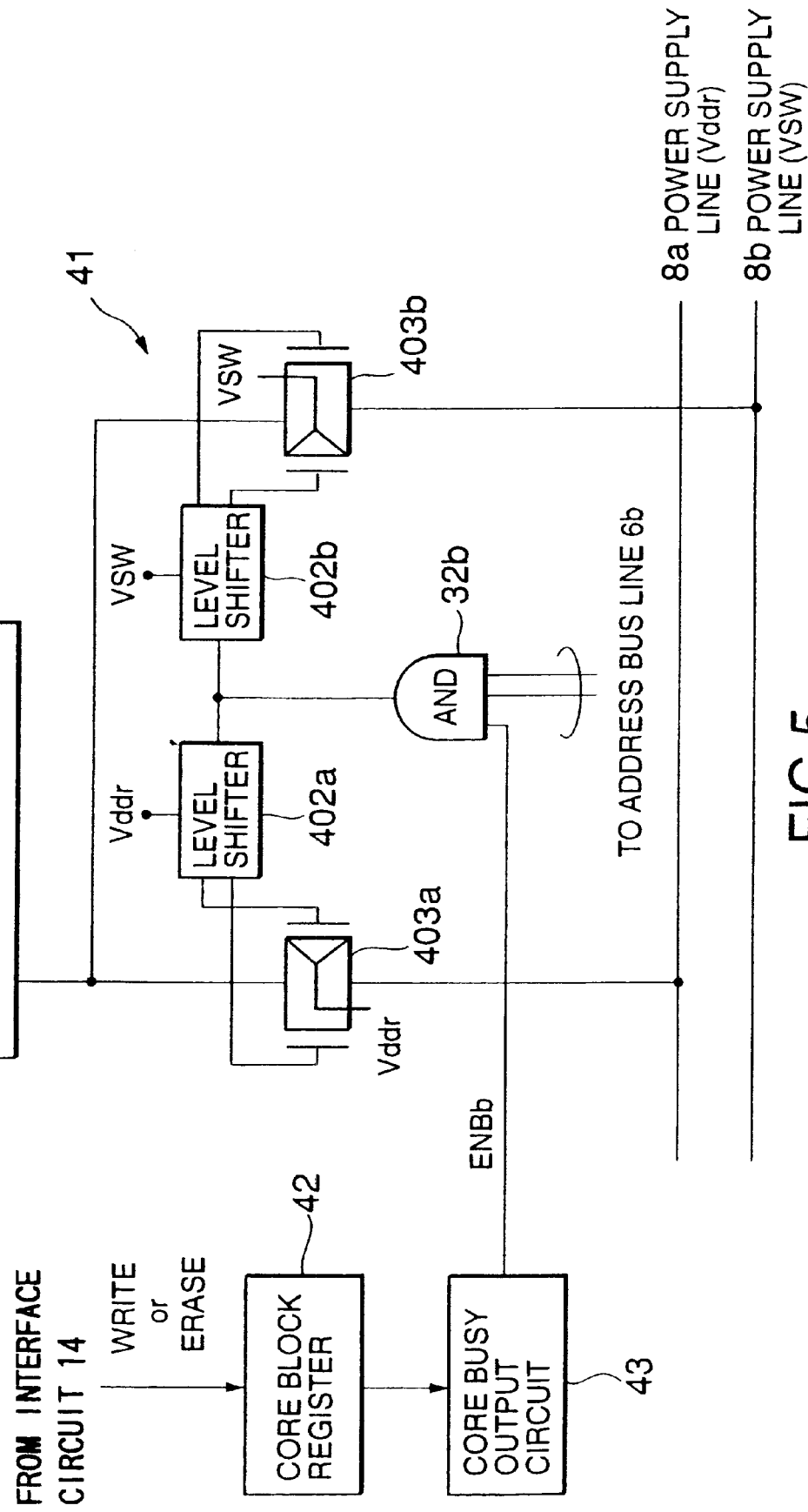
FIG. 5 is a circuit diagram of a power supply line switching circuit in the preferred embodiment.

FIG. 5 shows the construction of the power supply line switching circuit 41 included in the switching circuit 3 in each of the cores. This power supply line switching circuit 41 has level shifters 402a and 402b selectively activated by the core selecting circuit 32b in the address line switching circuit 3 shown in FIG. 2A, and transfer gates 403a and 403b controlled by the outputs of the level shifters 402a and 402b, respectively. The transfer gates 403a and 403b selectively connect the reading power supply line 8a and the writing/erasing power supply line 8b to the decoder circuit 2.

For example, when the core selecting signal SELb being the output of the core selecting circuit 32b is "H", i.e., when the core is in a data write or erase mode, the level shifter 402b is activated. Thus, the transfer gate 403b is turned on by a control signal which is obtained by shifting the voltage level obtained from the level shifter 402b, so that the writing or erasing power supply potential (e.g., a boosted potential VSW) of the writing/erasing power supply line 8b is supplied to the decoder circuit 2. When the core is in a read mode, the core selecting signal SELb is "H". At this time, the level shifter 402a is activated, so that the transfer gate 403a is turned on, so that a reading power supply potential Vddr of the reading power supply line 8a is supplied to the decoder circuit 2 via the transfer gate 403a.

FIG. 5 shows routes for generating the enable signals ENBa and ENBb, which are omitted from FIG. 2A. The data write signal WRITE or erase signal ERASE obtained by decoding a command in the interface circuit 14 is held as information indicating which block in the core has been selected for write or erase, in a core block register 42 prepared for each of the cores. On the basis of the core block register 42, a core busy output circuit 43 outputs an enable signal ENBb="H" as a busy output indicating that the core is in a write or erase mode. The details of the core block register 42 and core busy output circuit 43 will be described later.

Figure 6:
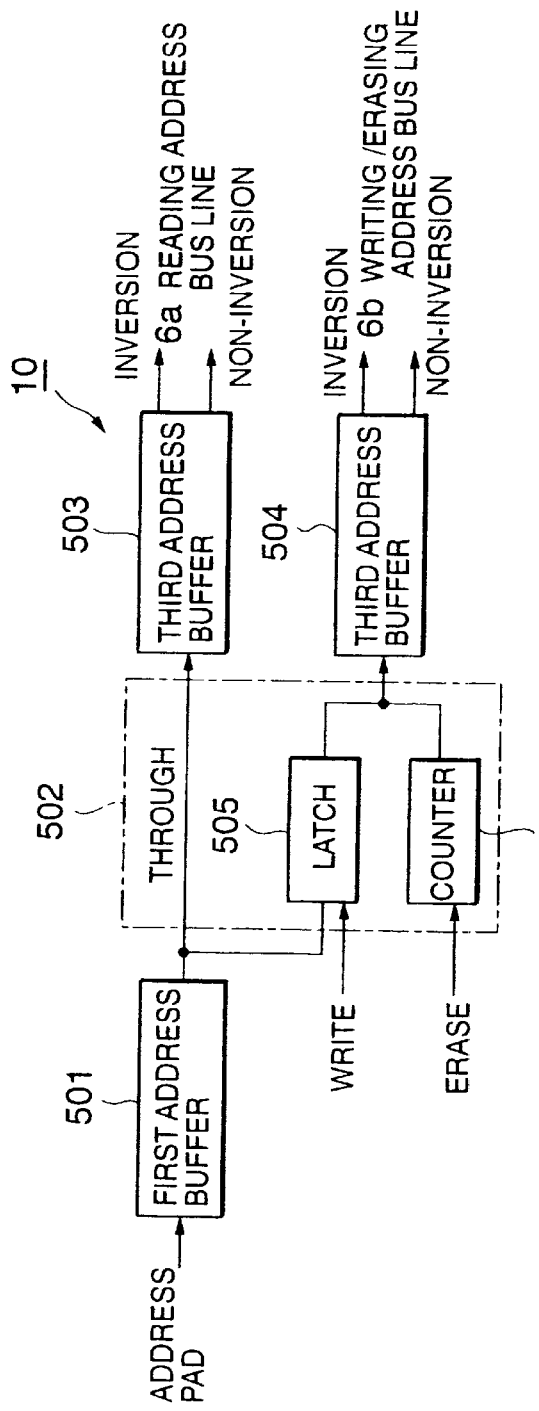
FIG. 6 is a block diagram of an address buffer in the preferred embodiment.

FIG. 6 shows the construction of the address buffer 10 of FIG. 1 The address buffer 10 has a three-stage structure comprising a first buffer stage 501, a second buffer stage 502, and third buffer stages 503 and 504. The first buffer stage 501 has the function of reducing noises of an address signal supplied from the outside of the chip and of protecting the interior thereof. The second buffer state 502 allows the supplied address signal to directly pass therethrough to be supplied to the third buffer stage 503, and supplies the address signal to a latch circuit 505.

In a data read mode, the address signal passing through the second buffer stage 502 is converted into a complementary signal in the third buffer stage 503 to be supplied to the reading address bus line 6a. In a data write mode, the address signal is held in the latch circuit 505 until the operation ends, and the address signal is supplied to the third buffer stage 504 to be converted into a complementary signal to be supplied to the writing/erasing address bus line 6b. In the second buffer stage 502, a counter 506 is provided for incrementing an address during a verify operation in a data erase mode. That is, in an erase verify operation, the address signal sequentially updated by the counter 506 is supplied to the writing/erasing address bus line 6b via the buffer stage 504.

Figure 7:
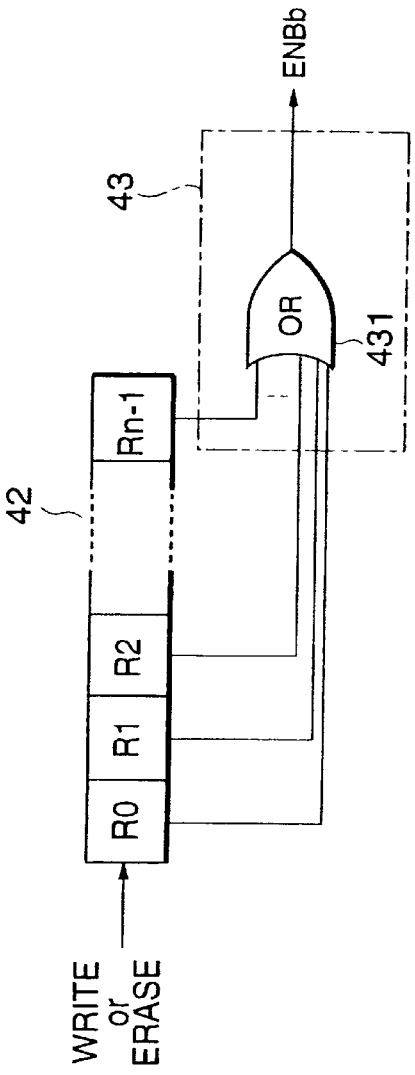
FIG. 7 is a diagram showing the constructions of a core block register and a core busy output circuit in the preferred embodiment.

FIG. 7 shows an example of the core block register 42 and core busy output circuit 43 shown in FIG. 5. The core block register 42 has registers R0 through Rn−1, the number of which is equal to the number n of blocks in each of the cores. When the data write signal WRITE or erase signal ERASE is inputted, a flag "H" is held in a register corresponding to a selected block of a selected core until the operation ends. The core busy output circuit 43 has an OR gate 431 for taking an OR of the outputs of the respective registers of the core block register 42. When at least one of blocks for write or erase is selected, the OR gate 421 outputs a core busy output (i.e., a write or erase enable signal) ENBb="H" in the core busy output circuit 43. In a core wherein write or erase is not selected, ENBb="L" which indicates read enable.

Figure 8:
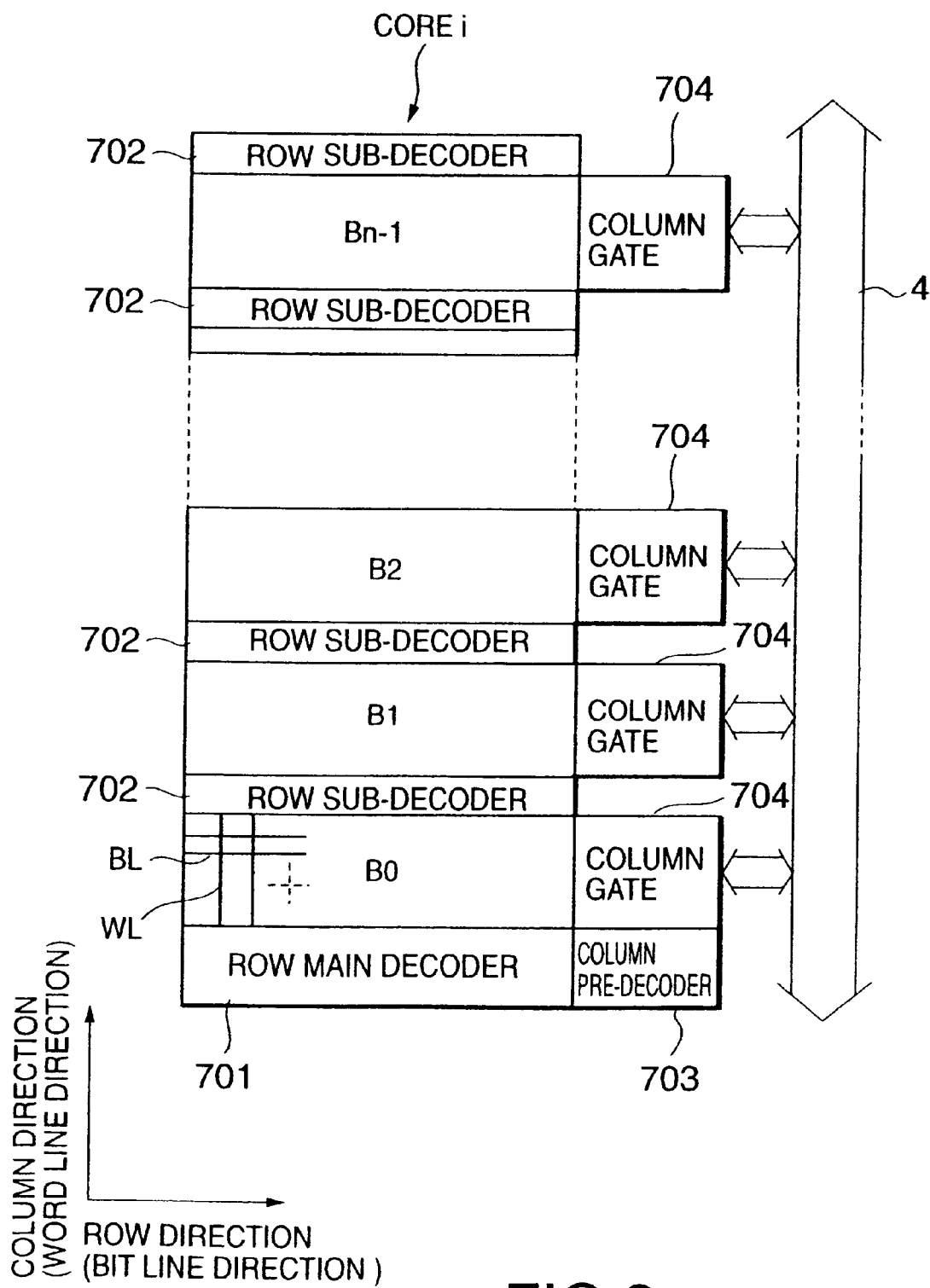
FIG. 8 is a diagram showing the details of a core of a memory cell array in the preferred embodiment.
Figure 9:
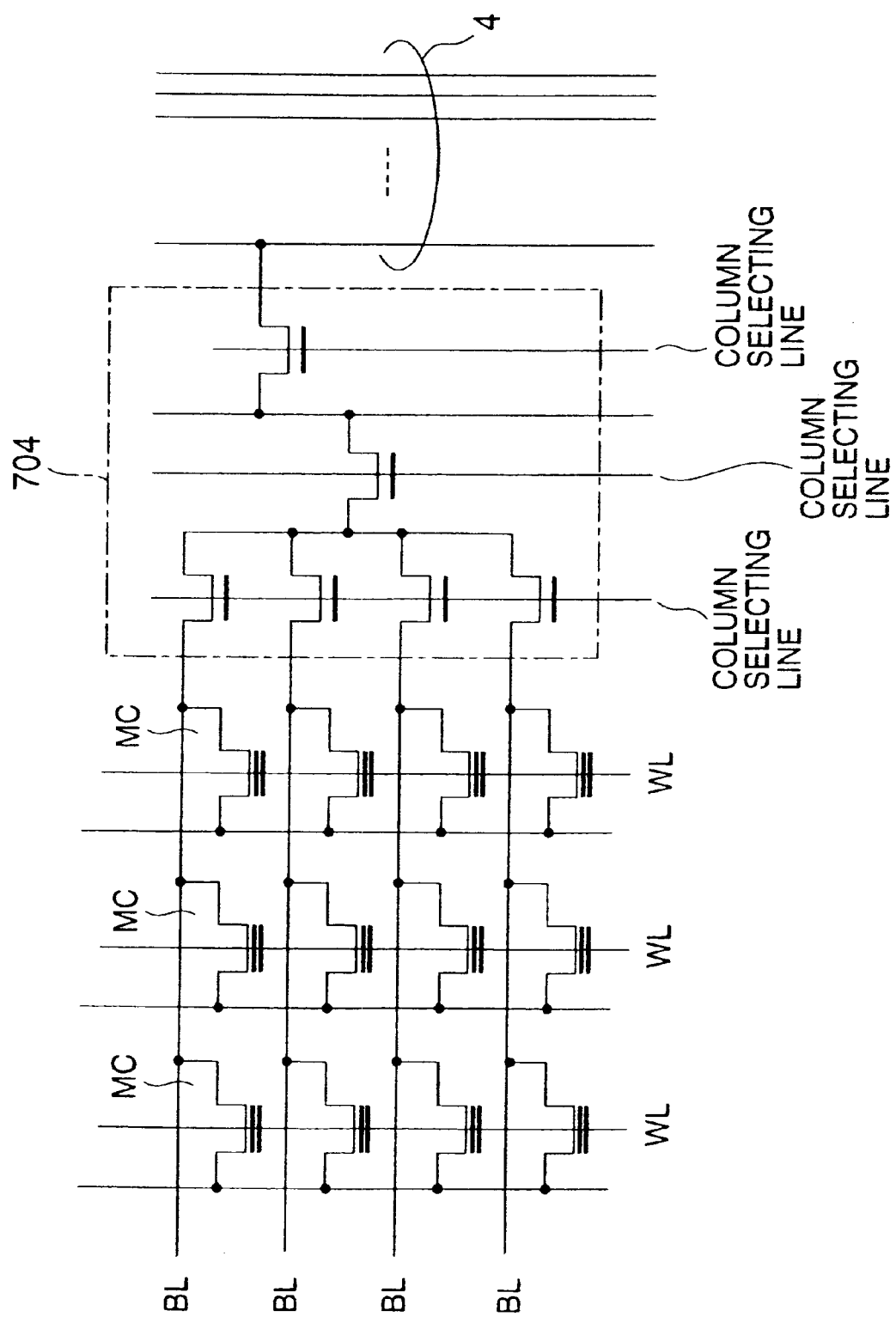
FIG. 9 is a circuit diagram showing the details of a cell array and a column gate.

FIG. 8 shows the detailed construction in a core, and FIG. 9 shows the construction in a block. As shown in FIG. 9, each of the blocks B0 through Bn−1 has a plurality of bit lines BL, a plurality of word lines WL intersecting the bit lines BL; and a plurality of memory cells MC, each of which is arranged at a corresponding one of the intersections therebetween. The bit lines BL and the word lines WL are continuously provided in each of the blocks B0 through Bn−1, which serves as a unit of batch erase. A main row decoder 701 for selecting word lines is arranged at the end portion of the arrangement of the blocks B0 through Bn−1, and row sub-decoders 702 for selecting blocks are provided between adjacent blocks. A column decoder is arranged in the bit line end portion of each of the blocks B0 through Bn−1. The column decoder comprises column gates 704 for selecting bit lines, and a column pre-decoder 703.

Figure 10:
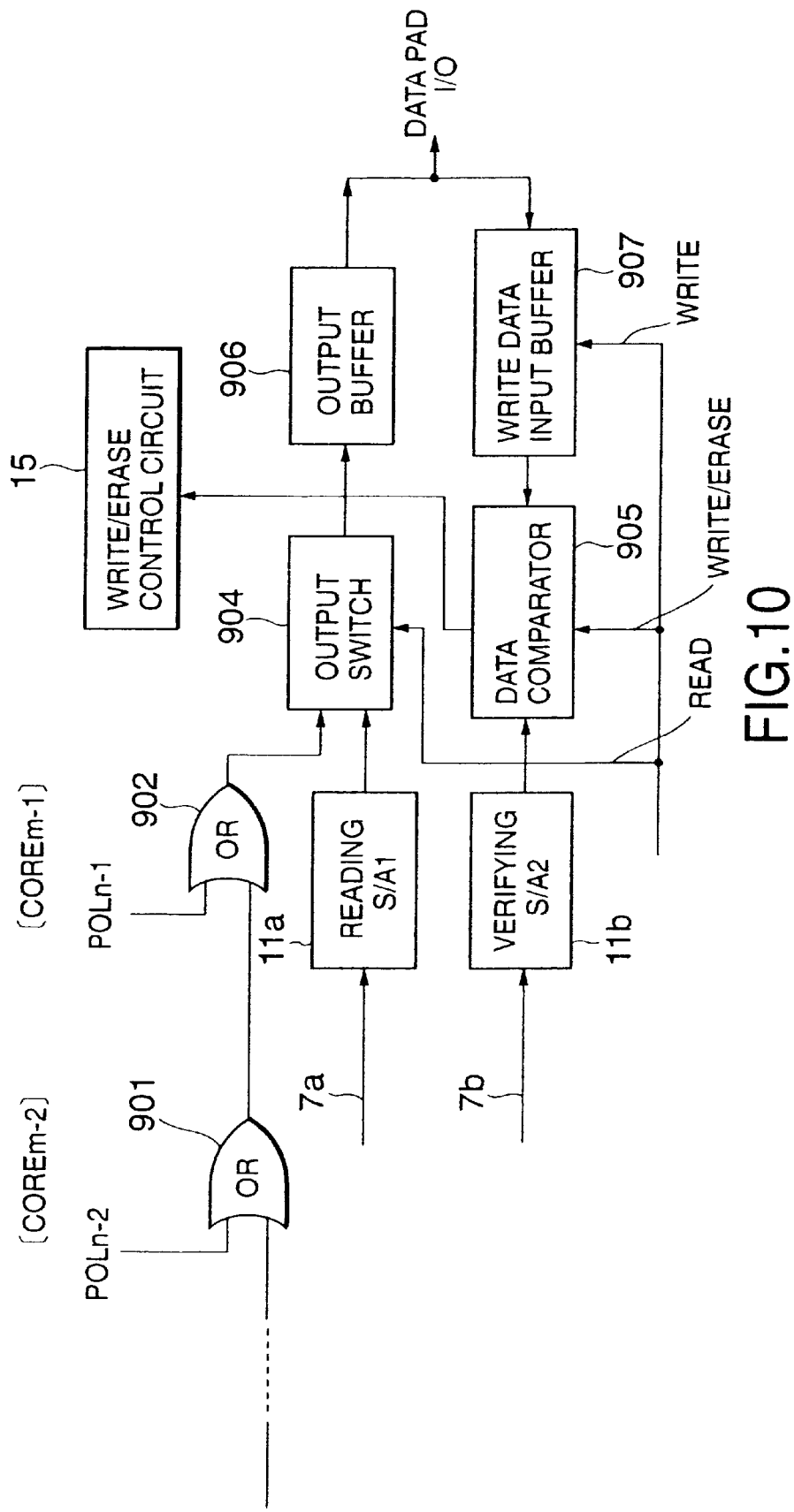
FIG. 10 is a block diagram of an output circuit part in the preferred embodiment.

FIG. 10 shows the construction of an input/output circuit part provided between the reading sense amplifier 11a and the verifying sense amplifier 11b and the external input/output pad in FIG. 1. OR gates 901 and 902 constitute a data polling output circuit for sequentially adding and outputting data polling signals POLi (i=0~m−2) outputted from the core selecting circuit 32a of each of the cores, which has been described in FIG. 2A. An output switching circuit 904 switches the read output of the reading sense amplifier circuit 11a and the data polling signal, which are transferred to an output buffer 906.

A data comparator circuit 905 determines output data which are verify-read out by the verifying sense amplifier circuit 11b during a data write or erase operation. In the case of write, write data supplied from an input buffer 907 are compared with verify read data. If the determined result is NG, the determined result is fed to the write/erase control circuit 15, and the control of rewrite is carried out. Similarly, in the case of erase, if the verified result is NG, the result is fed to the write/erase control circuit 15, and re-erase is carried out.

In the flash memory with the above described construction, the details of the simultaneous execution of a data write operation and a data read operation, specifically the operation of reading data out from a certain core while writing data in another core, will be described below.

When a write command is inputted to the chip, a write flag WRITE is outputted from the interface circuit 14. In response to this internal signal, in the address buffer 10, an address signal for a memory cell to be written is latched until the write operation is completed, and simultaneously, address data latched in the writing/erasing address bus line 6b are outputted. Information of a block including a cell serving as an object to be written is written in a corresponding register of the core block register 42 as busy information "H". It is assumed that the core thus selected is, e.g., core A. In core A, the output circuit 43 outputs a core busy output "H" (i.e., enable signal ENBb="H"). Thus, the core selecting signal SELb of core A is "H", so that the read demand from core A is prohibited.

In addition, by the enable signal ENBb and the core selecting signal SELb, the writing address signal on the writing/erasing address bus line 6b is inputted to the decoder circuit 2 of the selected core A, and simultaneously, the power supply potential of the writing/erasing power supply line 8b is supplied to the power supply of each of the decoder circuits 2, so that the writing/erasing data bus line 7b is connected to the data line 4 of core A. Thus, a data write operation is executed in the selected memory cell of the selected core A.

In a write mode, a write load circuit is controlled so as to correspond to write data which are inputted from an I/O pad to be latched in the data comparator circuit 905 via the data input buffer 907. Meanwhile, if a data read demand is inputted with respect to a memory cell of a core, e.g., core B, other than core A, a core busy output, i.e., the enable signal ENBb, is "L" and the core selecting signal SELb is "L" in core B, so that a data read operation is executed. That is, the address signal of the reading address bus line 6a is supplied to the decoder circuit of core B, and simultaneously, the reading power supply potential is supplied to the decoder circuit. Data of the selected memory cell are read out to the data line 4, and transferred to the reading sense amplifier circuit 11a via the reading data bus line 7a to be detected and amplified therein.

If an address in core A, in which write is being executed, is inputted as a read address, the data polling signal POL in core A is "H" since the enable signal ENBb is "H" in core A. This data polling signal is outputted to the outside by the output switching circuit 904.

A data read operation can be executed anywhere with respect to data of memory cells other than core A, in which the write operation is being executed, so that there is no limit to bank area.

Then, the operation of a circuit for carrying out a data read operation during a data erase operation will be described. If a data erase command is inputted, an erase flag ERASE is outputted from the interface circuit 14. Thus, busy information "H" is written in a block register serving as an object to be erased. Simultaneously, in the address buffer 10, the counter circuit 506 is operated to sequentially search all of block registers. Then, if it is coincident with the address of core A including the block, in which the busy information "H" is written, the core selecting signal SELb is "H". Then, similar to the case of write, the erasing power supply of the writing/erasing power supply line 8b is supplied to the decoder circuit of core A, and the address of the writing/erasing address bus line 6b is supplied thereto, so that the local data line is connected to the writing/erasing data bus line 7b. Thus, an erase voltage is applied to the object block. Thereafter, the memory cell of the object block is incremented by the counter circuit 506 to sequentially execute verify.

The read operation during the execution of erase is the same as the above described operation during the execution of write.

Then, the operation of the data polling circuit will be described. When a read command is inputted to core A while executing a write or erase operation in core A, the enable signal ENBa of core A is "L", and the selecting signal SELa of core A is also "L". Thus, the read operation in core A is prohibited. At this time, the data polling signal POL is "H" in core A, and this is outputted to the polling bus line to be inputted to the output switching circuit 904 as a data polling signal. In response to this signal, the output switching circuit 904 outputs polling data, not the output of the sense amplifier circuit 11a, to the output buffer circuit 906.

Figure 11:
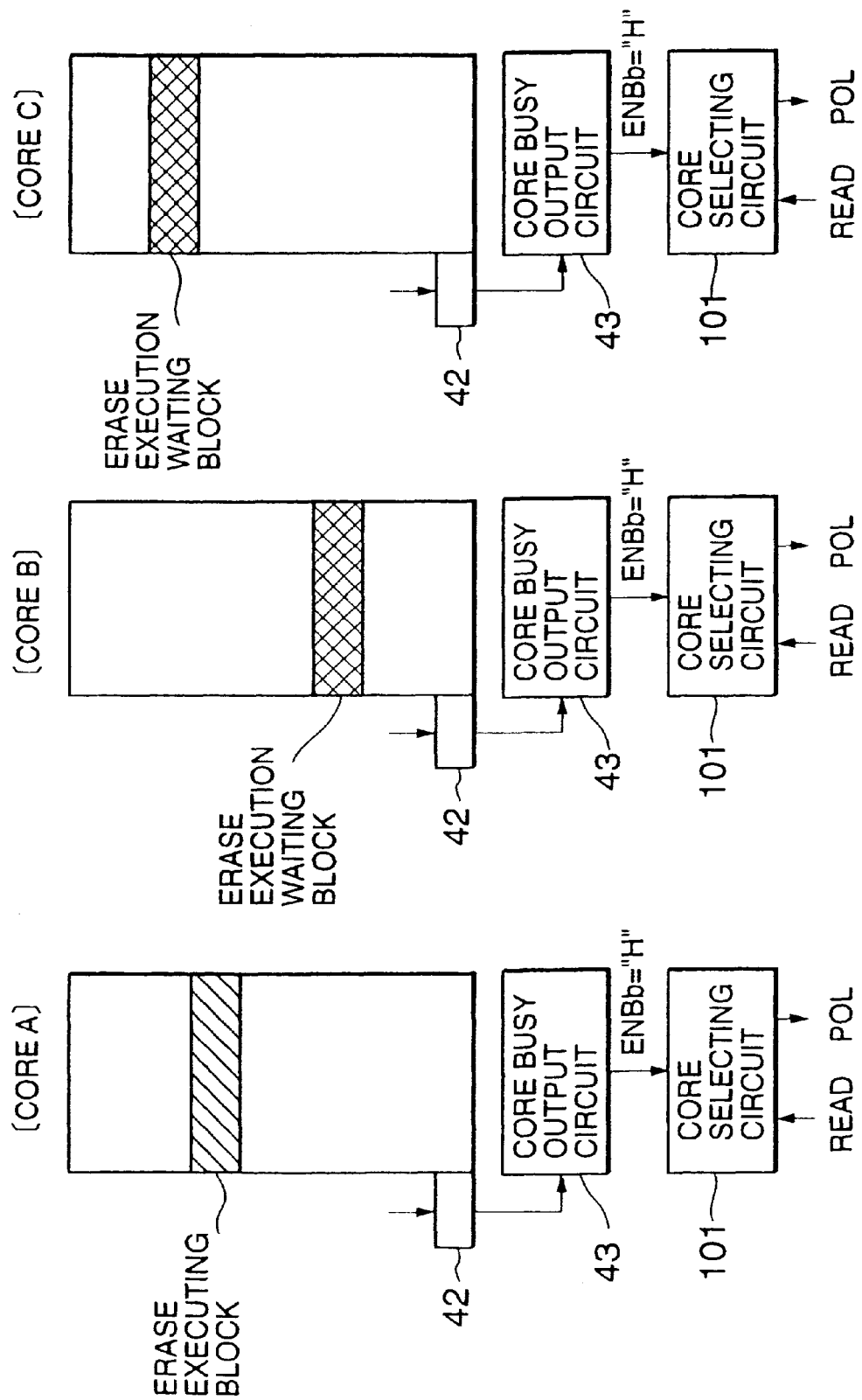
FIG. 11 is an illustration for explaining the operation of a plurality of core selections in the preferred embodiment.

FIG. 11 shows the operation in a case where data erase commands are given to a plurality of cores A, B and C. In this case, busy information is stored in the core block registers 42 of cores A, B and C. Thus, the core busy circuits 43 of cores A, B and C, each of which includes a block to be erased, output busy information "H", i.e., an enable signal ENBb="H", so that the execution of read is prohibited with respect to these cores to carry out the data polling.

(Second Preferred Embodiment)

With respect to the above described preferred embodiment of a flash memory according to the present invention, a preferred embodiment of a free bank system constituting a bank having an optional size, according to the present invention, will be described below.

Figure 12:
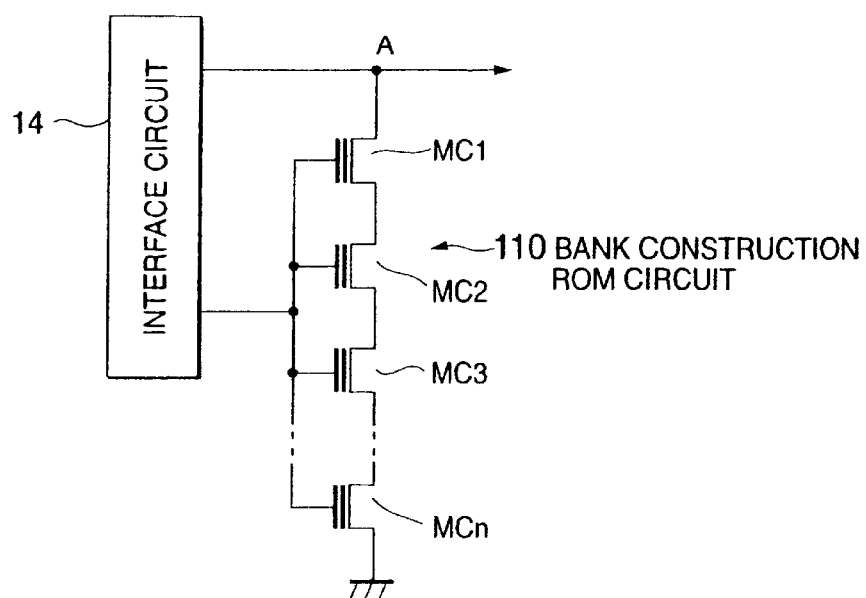
FIG. 12 is a diagram showing the construction of a bank construction ROM circuit for use in a preferred embodiment for a free bank system.

In order to realize a free bank system, a bank construction ROM circuit 110 shown in FIG. 12 is prepared for each of cores. The bank construction ROM circuit 110 constitutes a memory circuit wherein an optional number of data rewritable nonvolatile memory cells MC1, MC2, . . . , MCn are connected in series. Although the memory circuit may comprise a single memory cell in principle, the plurality of memory cells are used for safety.

In the bank construction ROM circuit 110, data write is selectively executed from the outside of the chip via the interface circuit 14. That is, when no write is carried out, the threshold Vth of each of the memory cells MC1 through MCn of the bank construction ROM circuit 110 is low. Therefore, by reading this, node A has "L". When data write is executed in all of the memory cells MC1 through MCn to raise Vth, the memory cells MC1 through MCn are turned off, so that node A has "H". That is, by this write in the bank construction ROM circuit 110, a plurality of cores are divided into two groups, i.e., a group having node A of "L" (which will be referred to as "L" group), and a group having node A of "H" (which will be referred to as "H" group).

Figure 13:
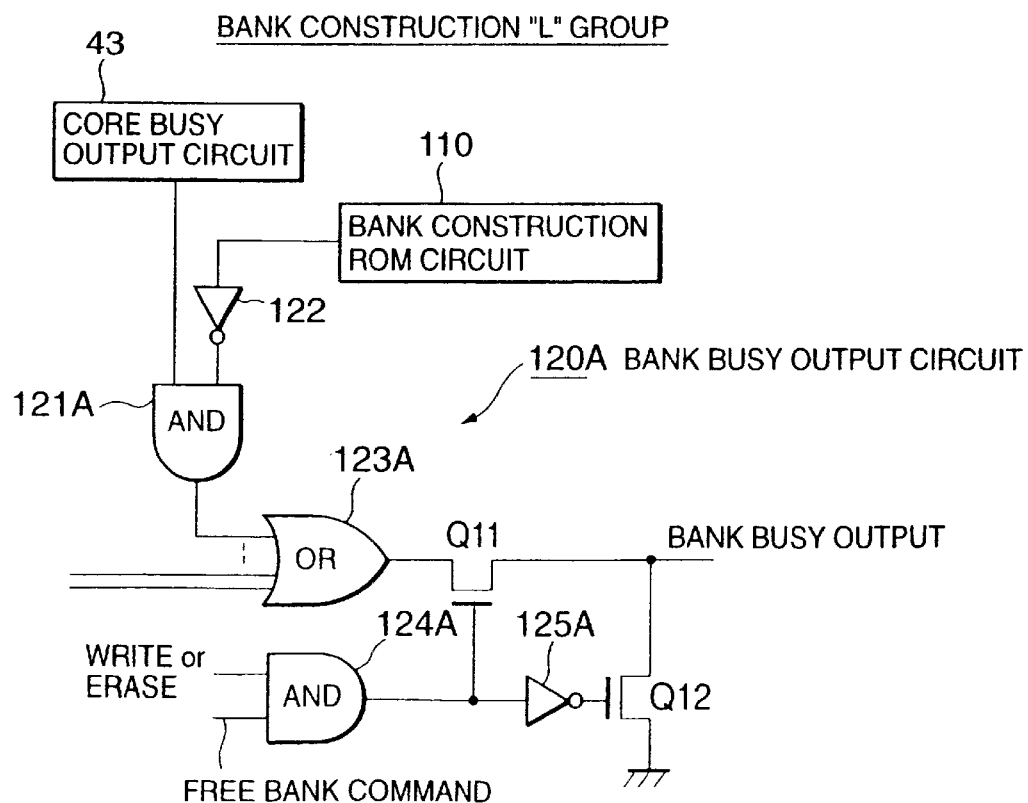
FIG. 13 is a diagram showing the construction of a bank busy output circuit in the preferred embodiment.
Figure 14:
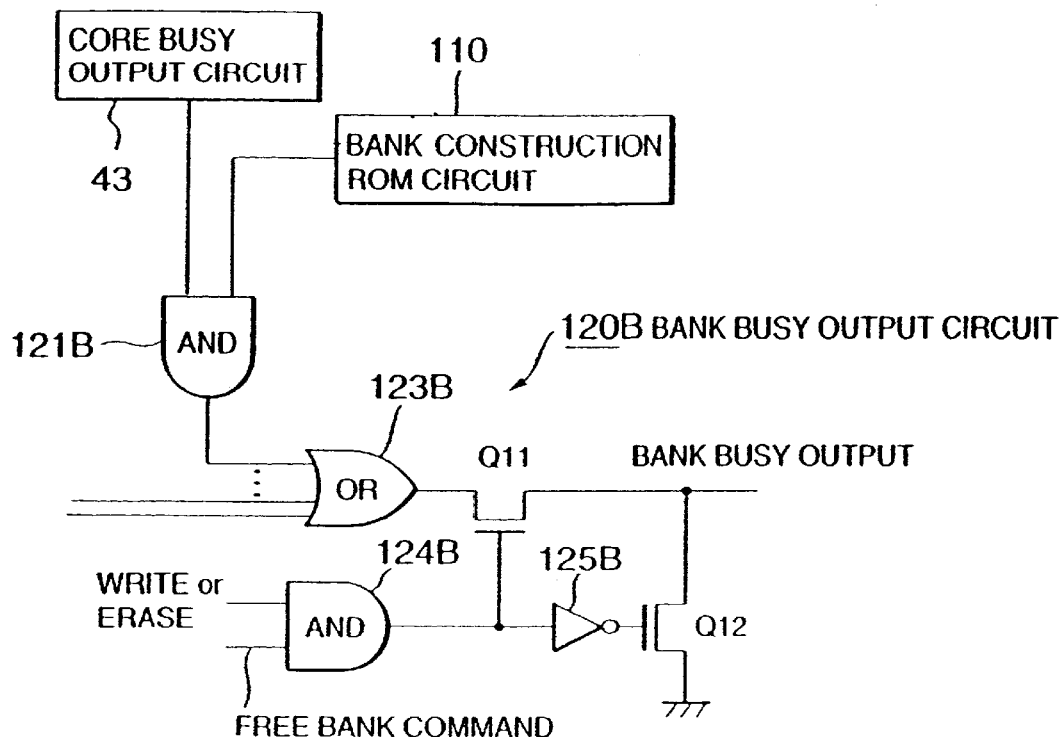
FIG. 14 is a diagram showing the construction of another bank busy output circuit in the preferred embodiment.

A bank busy output circuit 120A in the "L" group and a bank busy output circuit 120B in the "H" group are formed as shown in FIGS. 13 and 14, respectively. As shown in FIG. 13, the bank busy output circuit 120A in the "L" group derives a product of "H" output, which is derived by inverting the output of the bank construction ROM circuit 110 by an inverter 122 using an AND gate 121A provided for each of cores, and the core busy output of the core busy output circuit 43. Then, the sum of the outputs of corresponding AND gates 121A in all of other cores is derived by an OR gate 123A. Thus, an "H" output is obtained in the OR gate 123A when any one of cores in banks in the "L" group is in a write or erase mode (i.e., when the core busy output is "H"). This becomes a bank busy output "H" via a transistor Q11.

However, when a write command WRITE or an erase command ERASE is inputted and when a free bank command is inputted, the bank busy output is outputted. At this time, the output of an AND gate 124A is "H", so that the transistor Q11 is turned on. In other cases, the transistor Q11 is turned off, and a resetting transistor Q12 is turned on by means of an inverter 125A, so that a bank busy output terminal is reset to "L".

As shown in FIG. 14, the bank busy output circuit 120B in the "H" group derives a product of the output "H" of the bank construction ROM circuit 110 and the core busy output of the core busy output circuit 43 by means of an AND gate 121B. Thus, an "H" output is obtained in an OR gate 123B when any one of cores in banks in the "H" group is in the write or erase mode (i.e., the core busy output is "H").

Figure 15:
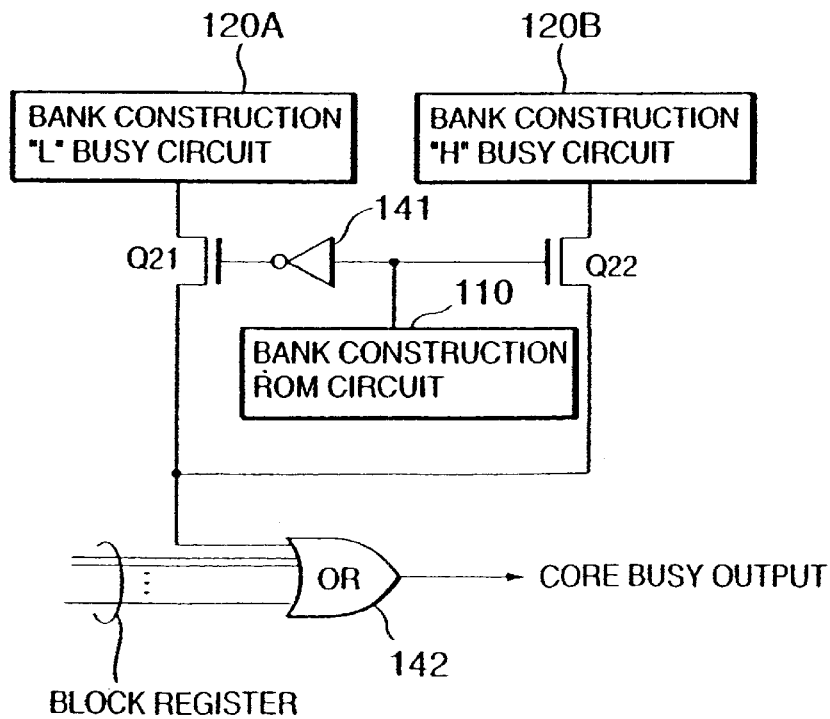
FIG. 15 is a diagram showing the construction of a core busy output circuit in the preferred embodiment.

FIG. 15 shows a core busy output circuit, provided in each of cores, for busying all of cores in a bank when a data write or erase operation is carried out in an optional block in the bank, in a free bank system in this preferred embodiment. The outputs of the bank busy output circuits 120A and 120B shown in FIGS. 13 and 14 are OR-connected via transfer gate transistors Q21 and Q22. On transistor Q21 is controlled by a signal which is derived by inverting the output of the bank construction ROM circuit 110 by an inverter 141, and the other transistor Q22 is controlled directly by the output of the bank construction ROM circuit 110.

Therefore, in the case of the "L" group, the output of the bank "L" busy circuit 120A enters an OR gate 142 via the transistor Q21. On the other hand, in the case of the "H" group, the output of the bank "H" busy circuit 120B enters the OR gate 142 via the transistor Q22. The register information of the block register of each of cores also enter the OR gate 142. Thus, if any one of banks is busy, core busy outputs "H" are obtained with respect to all of cores belonging the bank. Thus, the data read of the bank is prohibited, and a data polling signal is outputted to the outside of the chip.

When the data write or erase operation is completed, the output of the AND gates 124A, 124B shown in FIG. 13 or 14 is "L", so that the bank busy output is reset. At this time, the register output of all of the block registers is also "L", so that the core busy output of FIG. 15 is also reset at "L".

Change from the free bank system to a free core system can be realized by setting a free bank command entering the bank busy output circuits 120A, 120B at "H" and by turning the bank busy output circuits 120A, 120B off. The free bank command can be stored by means of, e.g., a rewritable ROM circuit. By rewriting this ROM circuit, the free bank system and the free core system can be freely set.

Figure 16:
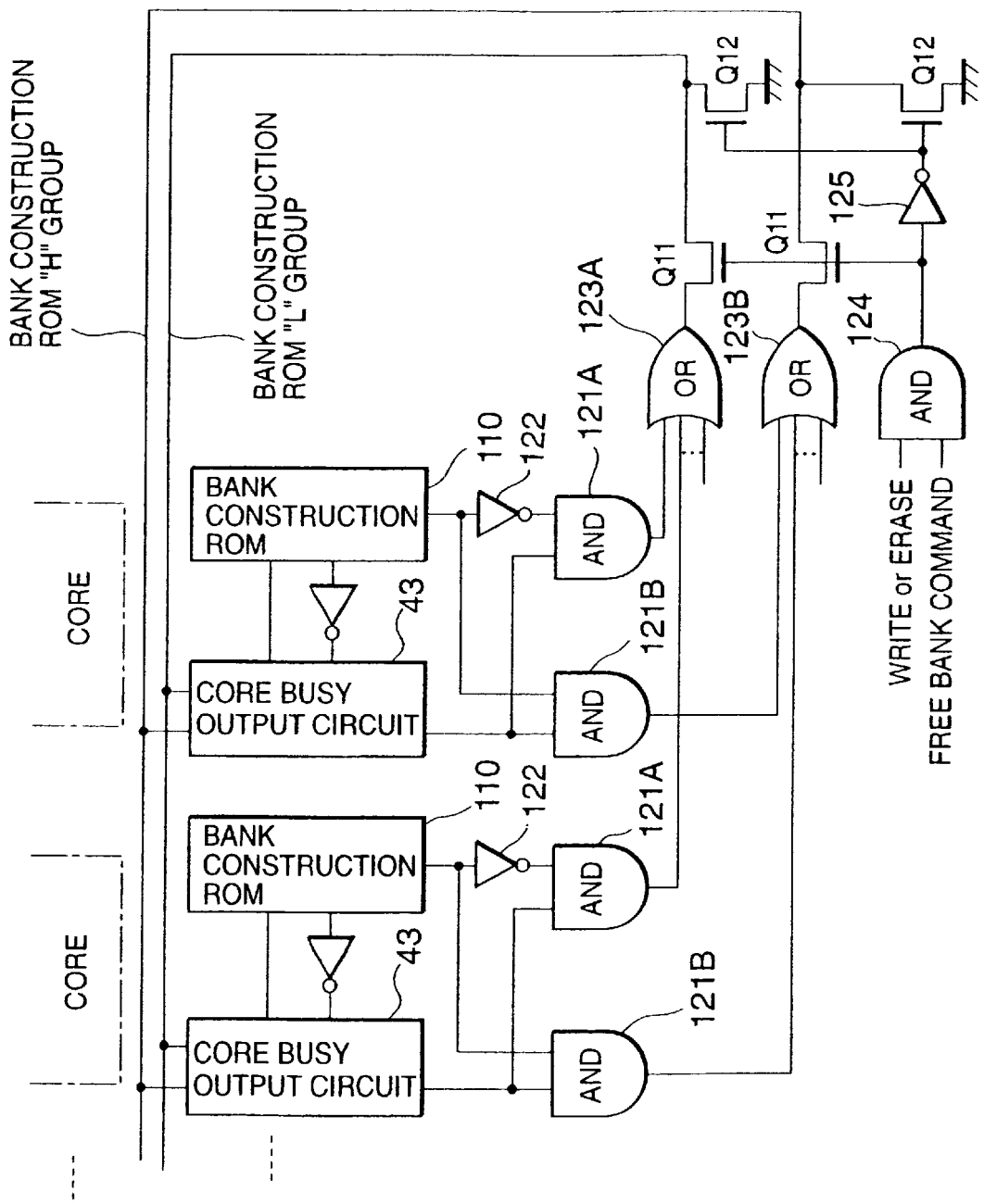
FIG. 16 is a diagram showing an example of a bank construction circuit in the preferred embodiment.

FIG. 16 shows an example of the whole connection of the bank construction circuit. As can be clearly seen from the description with respect to FIGS. 13 through 15, if the bank busy output of each bank is fed back to the core busy output circuit 43 of each core, the cores of the "H" group can be linked to each other to form one bank, and the cores of the "L" group can be linked to each other to form another bank.

The operation of the simultaneous execution of data write or erase and data read in each bank is basically the same as that in the free core system.

In this preferred embodiment, by the data rewrite in the bank construction ROM circuit 110, it is possible to optionally change the bank constructions of the "L" and "H" groups.

(Third Preferred Embodiment)

Figure 17:
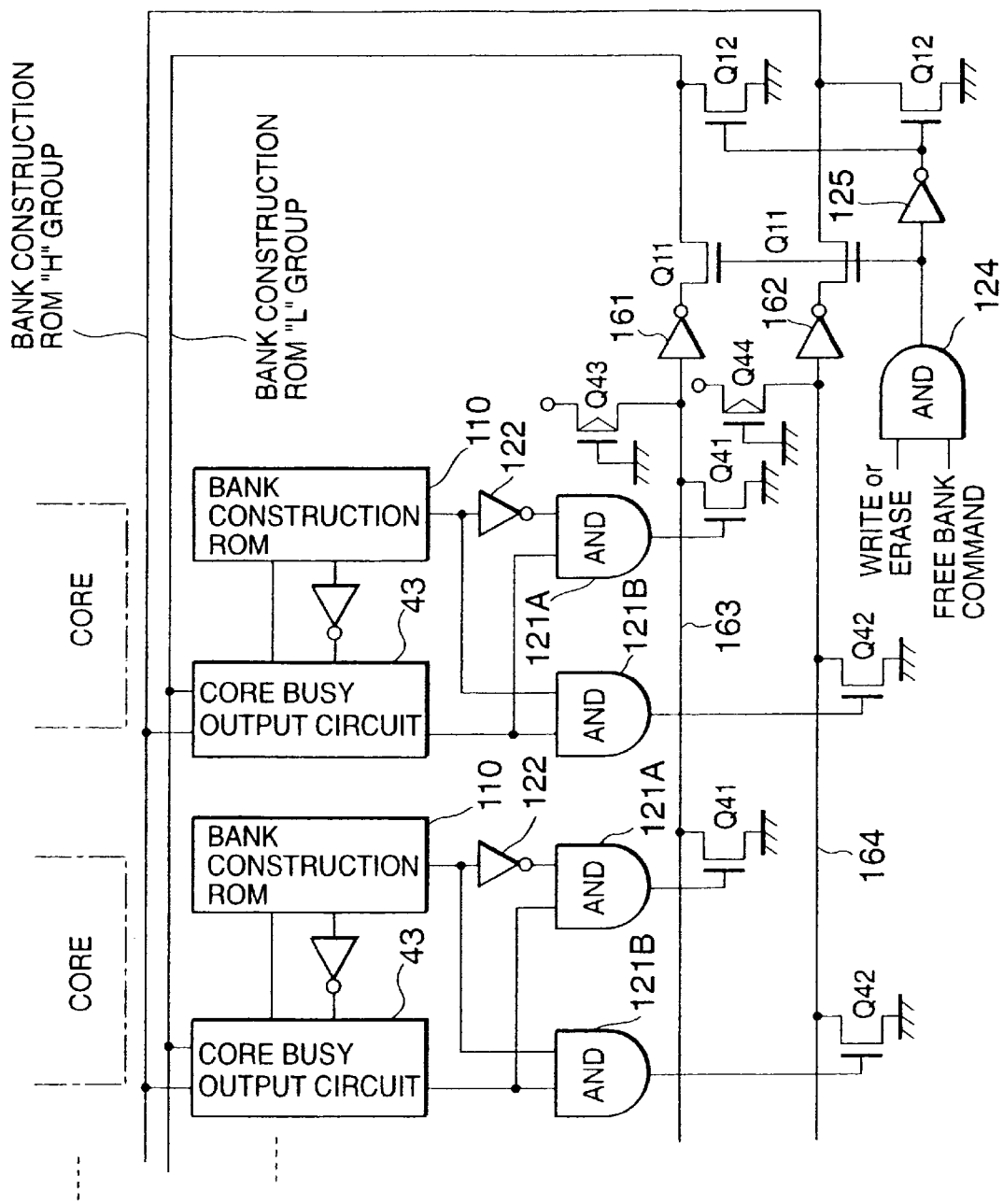
FIG. 17 is a diagram showing another example of a bank construction circuit in the preferred embodiment.

FIG. 17 shows a preferred embodiment as a modified embodiment of the bank construction circuit of FIG. 16. In the construction of FIG. 16, there are arranged a plurality of busy signal lines entering the OR gates 123A, 123B of the bank busy output circuits 120A, 120B. On the other hand, in FIG. 17, a single busy signal line 163 and a single busy signal line 164 are provided in each bank. These busy signal lines 163 164 are provided with PMOS transistors Q43, Q44 for pull-up, and set at "H" level when no bank busy is outputted. In each core, transistors Q41, Q42 controlled by the outputs of the AND gates 121A, 121B are provided between the busy signal lines 163, 164 and the ground, respectively. Therefore, when the bank is busy, the transistor Q41 or Q42 is turned on, so that the signal line 163 or 164 has "L". This is inverted y inverters 161, 162, so that any one of the bank busy output circuits 120A, 120B outputs a bank busy output "H".

According to this preferred embodiment, the number of signal lines can be greatly reduced.

(Fourth Preferred Embodiment)

Figure 18:
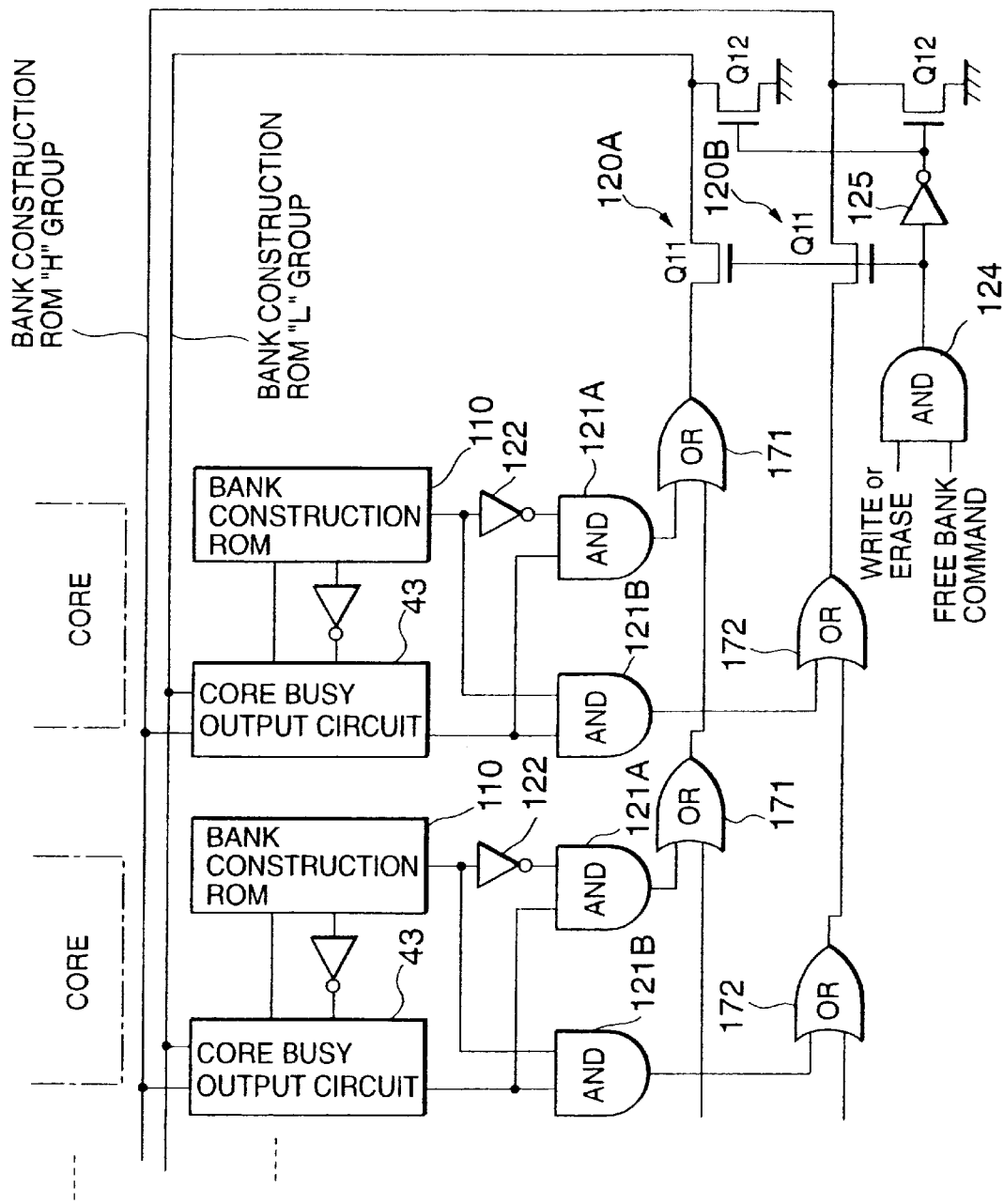
FIG. 18 is a diagram showing another example of a bank construction circuit in the preferred embodiment.

FIG. 18 shows a preferred embodiment as a modified embodiment of the bank construction circuit of FIG. 16. In this preferred embodiment, the OR gates 123A, 123B in FIG. 16 are distributed in each core part to arrange OR gates 171, 172. Also according to this preferred embodiment, the number of signal lines can be reduced. In the preferred embodiment shown in FIG. 17, current consumption occurs in the transistors Q41, Q42, whereas in this preferred embodiment, such current consumption does not occur.

(Fifth Preferred Embodiment)

Figure 19:
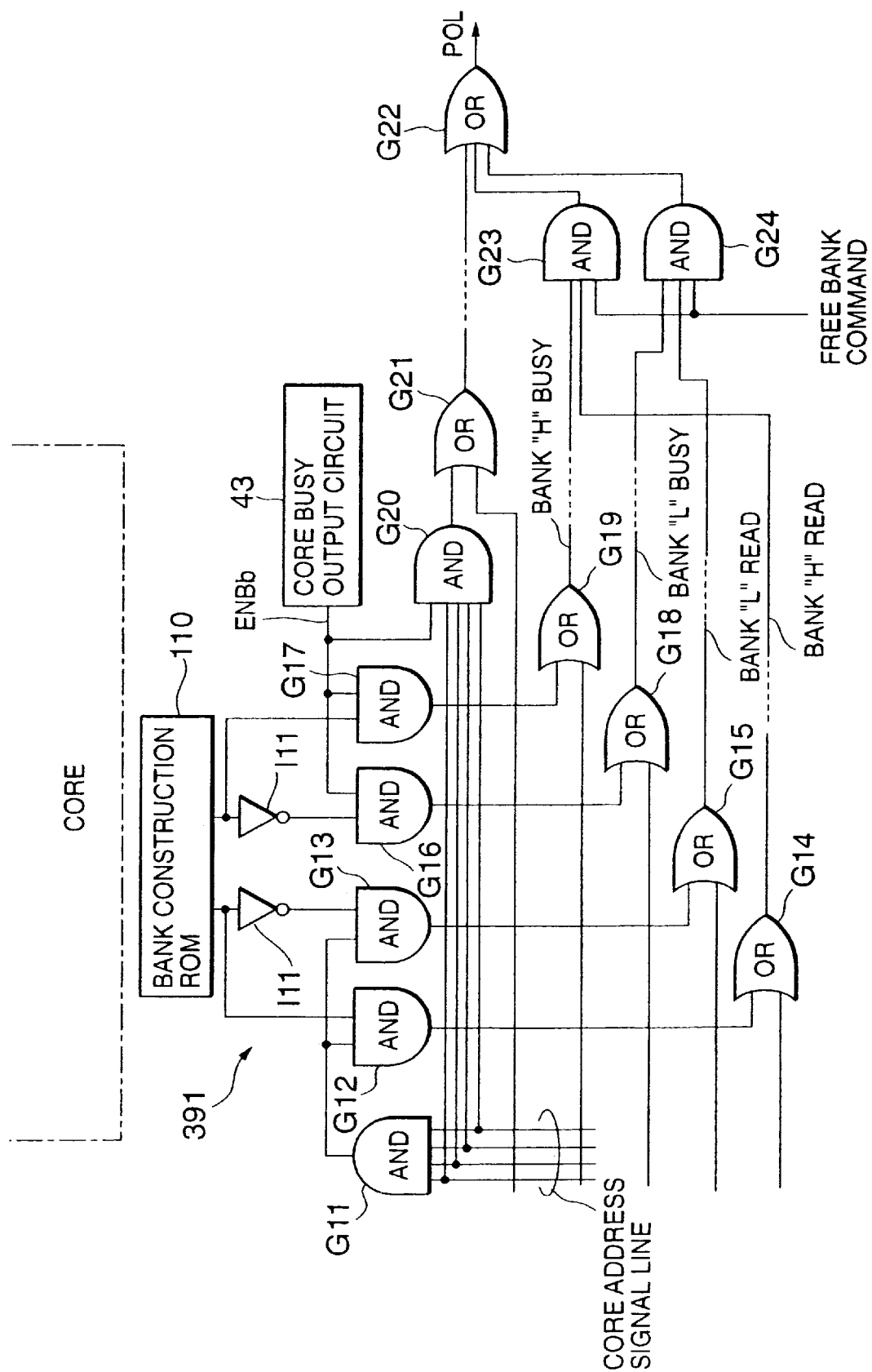
FIG. 19 is a diagram showing another example of a bank construction circuit in the preferred embodiment.

FIG. 19 shows a preferred embodiment wherein the bank construction circuit shown in FIG. 16, 17 or 18 is modified to provide a bank read output circuit 391. In the preferred embodiment shown in FIG. 16, 17 or 18, each bank busy output is fed back to the core busy output circuit of a core constituting the bank to realize a free bank system. On the other hand, in this preferred embodiment, no bank busy information is fed back, and each bank busy information is compared with each bank read information, which is obtained by the bank read output circuit 391, on the output side, to detect a read address input (read information) to a bank in a data write/erase mode to carry out the data polling to apparently realize a free bank system.

That is, when the core busy output circuit 43 selects the core as a core in a data write/erase mode to output a core busy output ENBb="H", a bank busy output is obtained in any one of AND gates G17, G16 in accordance with information on the "H" and "L" groups determined by the bank construction ROM circuit 110. These outputs are added to the bank busy outputs of other cores by OR gates G19, G18.

In addition, an AND gate G20 detects the coincidence of the output of the core busy output circuit 43 with a core selecting signal from the reading address line. When the core is in a data write/erase mode and when a subsequent read demand is made, a data polling output "H" is outputted.

On the other hand, in the bank read output circuit 391, a core selecting signal from the reading address bus line is detected by an AND gate G11. When the output of the AND gate G11 has "H", i.e., when read information is outputted, bank read information "H" is outputted to any one of AND gates G12, G13 in accordance with information on the "H" and "L" groups from the bank construction ROM circuit 110. These are also added to the read information in other cores by OR gates G14, G15, to be transferred to an output stage.

In the output stage, the coincidence detection of the bank busy information with the read information in the "H" group, and the coincidence detection of the bank busy information with the read information in the "L" group are carried out by AND gates G23, G24, respectively. The outputs of the AND gates G20, G23 and G24 are summed up by an OR gate G22. Thus, when one bank is in a data write or erase mode and when a read demand enters this bank, data polling is carried out, so that it is possible to substantially obtain a free bank system.

(Sixth Preferred Embodiment)

Figure 20:
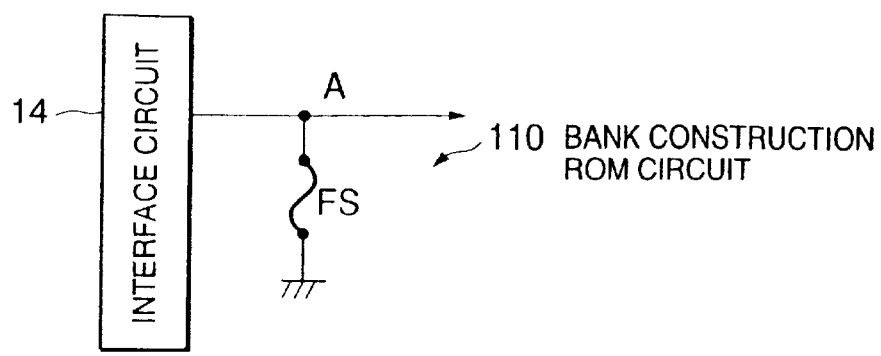
FIG. 20 is a diagram showing another example of a bank construction ROM circuit in the preferred embodiment.

FIG. 20 shows a preferred embodiment as a modified embodiment of the bank construction ROM circuit 110. In this preferred embodiment, the bank construction ROM circuit 110 is formed using a fuse FS. Also in this case, by selectively cutting the fuse FS after a memory chip is formed, it is possible to realize a bank construction of "L" and "H" groups having an optional size. However, in this system, if once the bank construction is set, the bank size can not be changed, and the free bank system can not be changed to a free core system.

(Seventh Preferred Embodiment)

A preferred embodiment for rapidly carrying out a data read operation in the flash memory described in each of the above described preferred embodiments will be described below.

In a high-speed data read mode, the reading address bus line 6a, the reading data bus line 7a, and the reading sense amplifier circuit 11a connected to the data bus line 7a are used as a first data read path. In addition, the writing/erasing address bus line 6b, the writing/erasing data bus line 7b and the verifying sense amplifier circuit 11b connected to the data bus line 7b are used as a second data read path. These data read paths are operated so as to overlap each other by a half period, to carry out a high-speed data read operation.

In order to realize such a high-speed read operation, it is required to change the core selecting circuits 32a, 32b of each core shown in FIG. 2, the power supply line switching circuit 41 shown in FIG. 5, the address buffer 10 shown in FIG. 6, the output switching circuit 904 shown in FIG. 10, and so forth.

Figure 21:
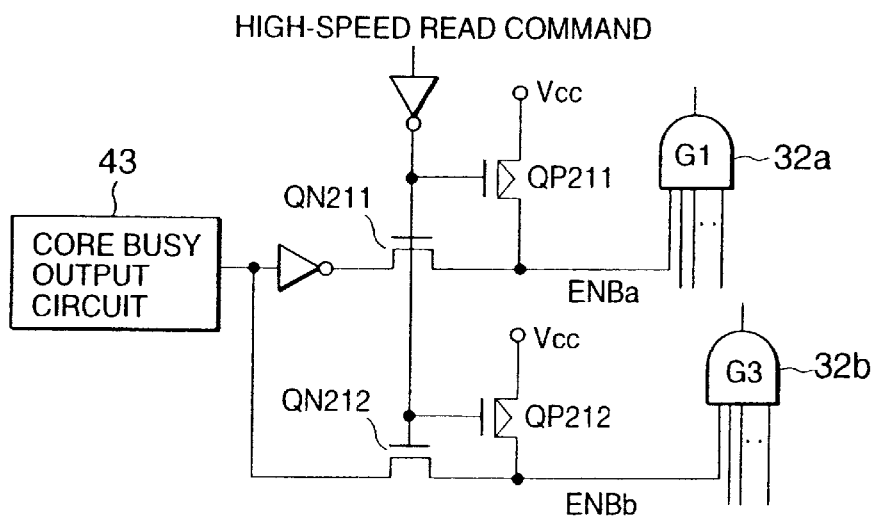
FIG. 21 is a diagram showing the construction of a switching circuit for a core busy output terminal in a preferred embodiment for carrying out a high-speed read operation.
Figure 22:
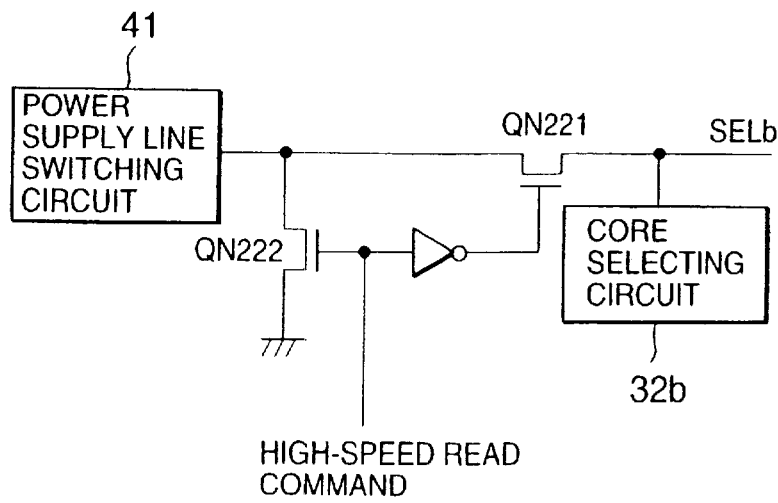
FIG. 22 is a diagram showing the construction of an input signal switching circuit to a power supply line switching circuit in the preferred embodiment for carrying out a high-speed read operation.

First, if a high-speed read command is inputted, the terminals for the enable signals ENBa, ENBb entering the core selecting circuits 32a, 32b of each core are electrically disconnected from the core busy output circuit 43 by NMOS transistors QN211, QN212 as shown in FIG. 21, so that pull-up PMOS transistors QP211, QP212 are turned on to be fixed in "H" state. Simultaneously, as shown in FIG. 22, by the high-speed read co and, an NMOS transistor QN221 on the path for the power supply switching circuit 41 of the core selecting circuit 32b is turned off, and a short-circuiting NMOS transistor QN222 is turned on, to be fixed in "L".

Thus, the core selecting signals SELa, SELb of all of cores are determined by only the core address signals of the address bus lines 6a, 6b, and the decoder power supply is always connected to the reading power supply line 8a.

Figure 23:
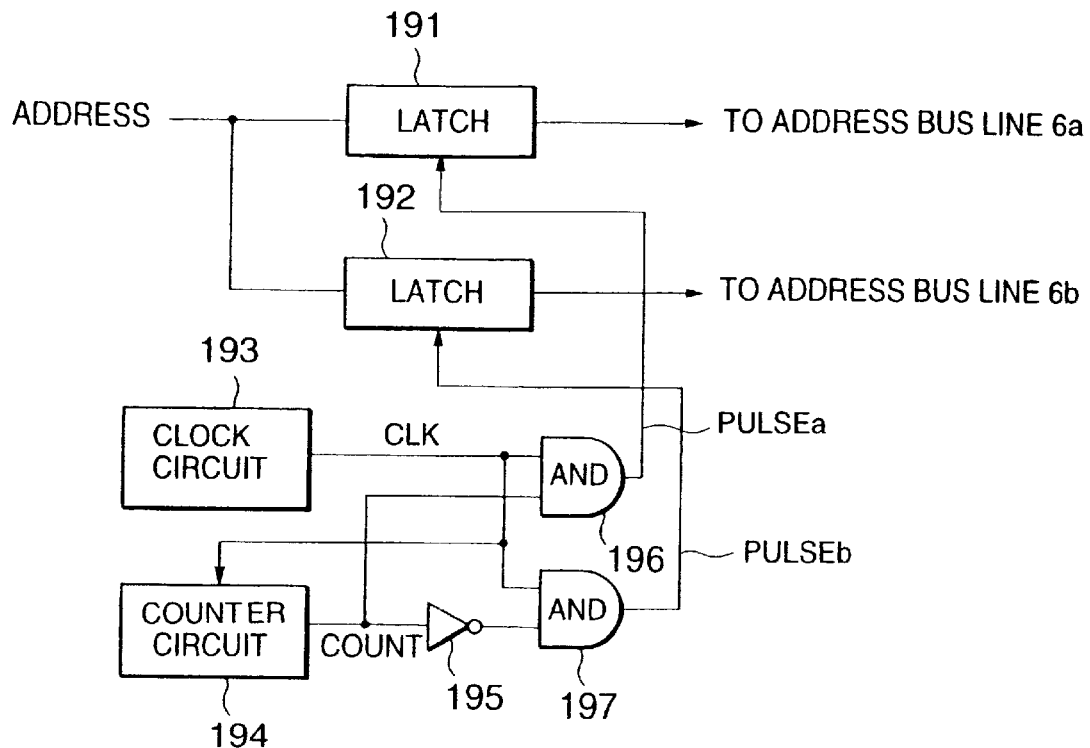
FIG. 23 is a diagram showing the construction of an address buffer in the preferred embodiment for carrying out a high-speed read operation.

The address buffer 10 is changes so that the part of the second buffer stage 502 shown in FIG. 6 has two sets of latch circuits 191, 192 as shown in FIG. 23. These latch circuits 191, 192 are provided for alternately latching the address of a memory cell to be read, by timing signals PULSEb, PULSEa to supply the address to the address bus lines 6a, 6b.

In order to generate the timing signals PULSEa, PULSEb, there are provided a clock generating circuit 193 for detecting address transition to generate a clock CLK, and a counter circuit 194 for counting the output of the clock generating circuit 193 to produce a count output COUNT having a double period. In addition, AND gates 196, 197 activated by the clock CLK are provided. The count output COUNT is inputted directly to the AND gate 196, and the count output COUNT is inverted by an inverter 195 to be inputted to the AND gate 197, so that timing signals PULSEa, PULSEb shifted by a half period from another are generated.

Figure 24:
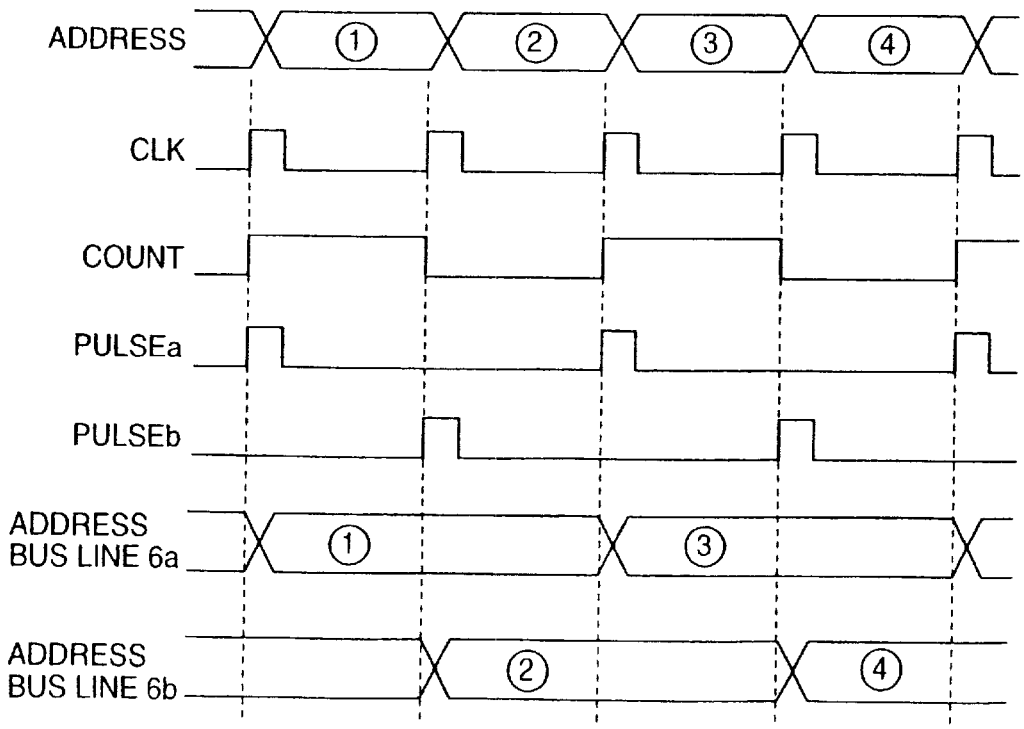
FIG. 24 is a control timing chart for an address buffer in the preferred embodiment.

FIG. 24 is a operation timing chart for the circuit of FIG. 23. As shown in this figure, a clock CLK is generated in synchronism with an input address. In response thereto, timing signals PULSEa, PULSEb are generated. By the latch circuits 192, 192 by the timing signals PULSEa, PULSEb, an address is alternately transferred to the address bus lines 6a, 6b.

The outputs of the latch circuits 191, 192 are provided with third buffer stages as shown in FIG. 6. In this case, an output comparator circuit (not shown) is provided between the latch circuits 191, 192 and the third buffer stages. This is provided for outputting a data polling signal without outputting a subsequently inputted address to the third buffer stages when the input addresses enter in the same core. By such a data polling, it is possible to prevent circuit destruction and malfunction due to the simultaneous selection of the same core.

Figure 25:
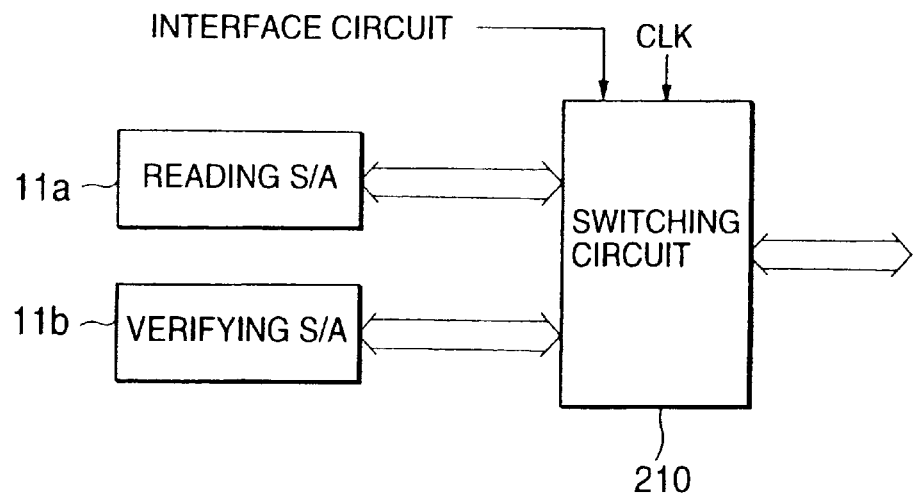
FIG. 25 is a block diagram of an output switching circuit part in the preferred embodiment.

In addition, as shown in FIG. 25, it is required to provide an output switching circuit 210 for switching the output of the verifying sense amplifier circuit 11b and the output of the reading sense amplifier circuit 11a. This output switching circuit 210 is controlled by the clock CLK to alternately switch the output of the verifying sense amplifier circuit 11b and the output of the reading sense amplifier circuit 11a to output data to the output buffer circuit.

Figure 26:
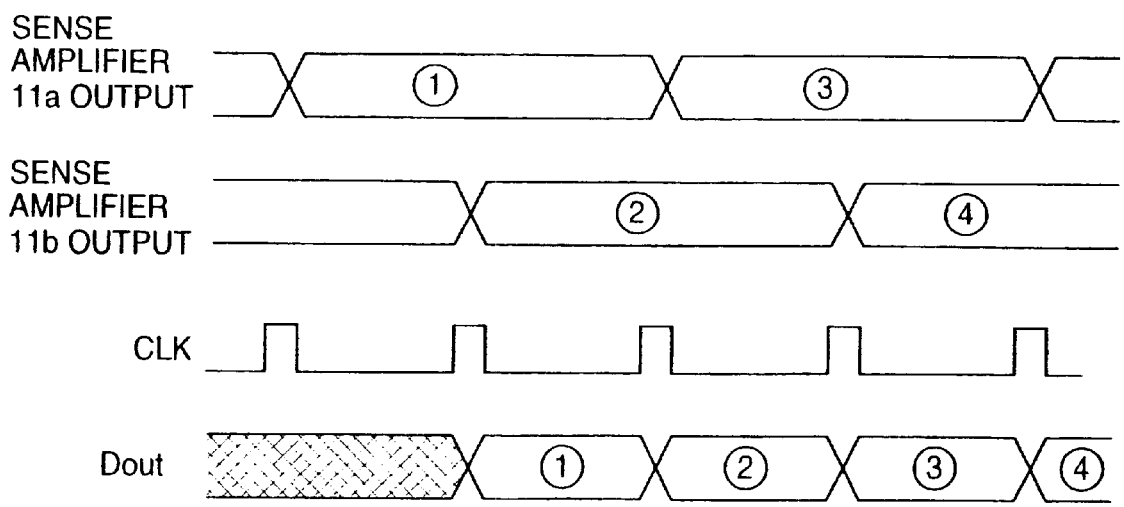
FIG. 26 is a timing chart showing a high-speed read operation in the preferred embodiment.

FIG. 26 is a timing chart for a high-speed read operation in this preferred embodiment. Read data obtained by the respective sense amplifier circuits 11a, 11b while being shifted by a half period in response to addresses ①, ②, . . . shown in FIG. 24 are controlled by the clock CLK to be outputted as a high-speed read output Dout.

According to the system in this preferred embodiment, it is possible to realize a high-speed data read operation capable of reading data to random addresses by the half of a usual period. However, read to the same core is prohibited, and data polling is carried out. In addition, since the address cycle from the outside of the chip is doubled inside of the chip, output data are shifted by one cycle. However, if such a system is recognized to form a system, it is possible to realize a high-speed chip access.

Furthermore, the high-speed read command is controlled by, e.g., a command from the outside of the chip. Alternatively, if it is used as an OTP, a high-speed command may be controlled by whether data are written in a data memory circuit comprising ROM cells provided in a chip.

Figures 27, 28:
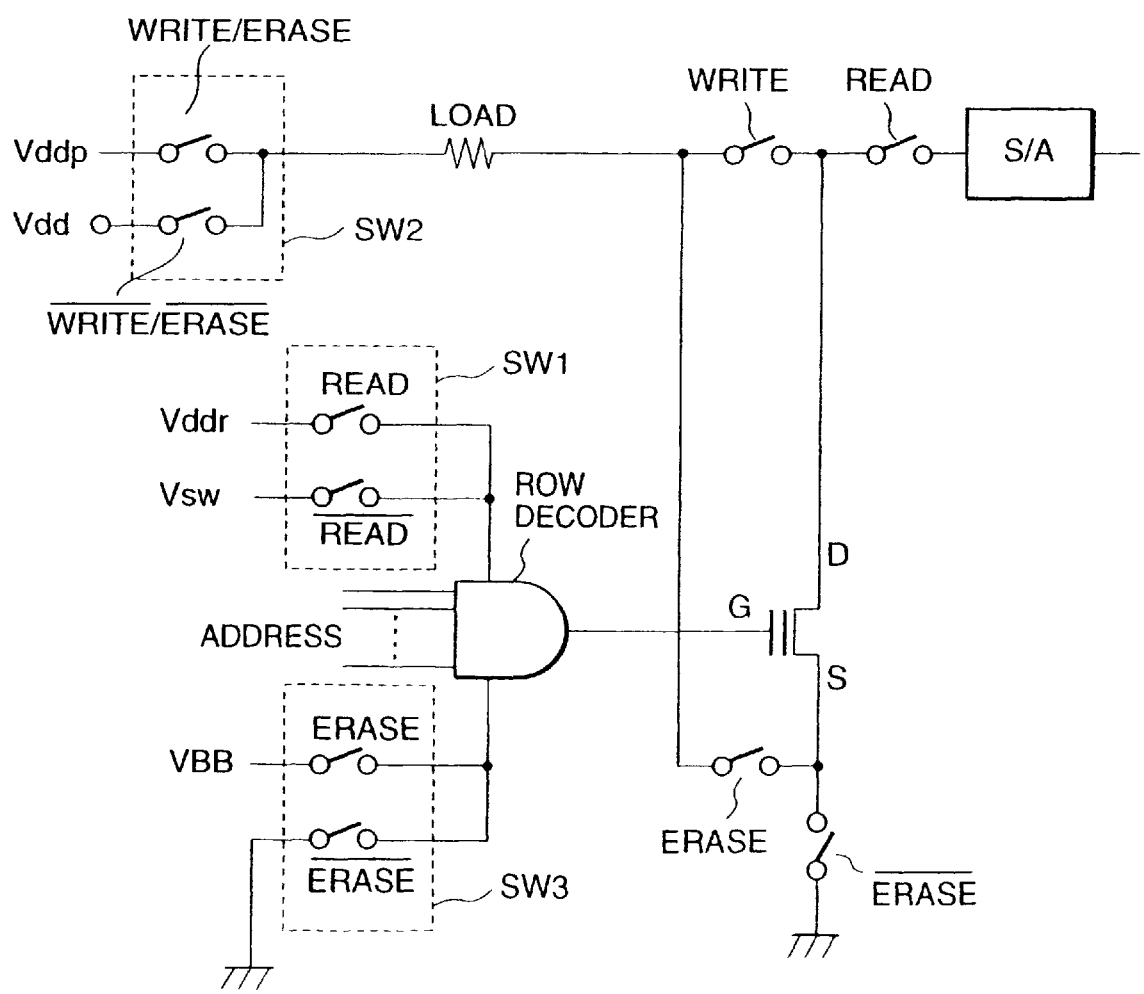
FIG. 27 is a table showing the relationship between voltages in each operation mode of a memory cell.
FIG. 28 is a circuit diagram of a voltage applying system in each operation mode of a memory cell.

A preferred embodiment of a power supply system of a flash memory according to the present invention will be described below. Before the description thereof, the relationship between operation voltages of a memory cell is shown in FIG. 27. During a data read operation, a boosted potential 5V is applied to the gate (word line) of the memory cell, 1V is applied to the drain thereof, and 0V is applied to the source thereof, so that the current passing through the cell is detected by a sense amplifier. During a data write operation, a boosted voltage is applied to the word line, 5V is applied to the drain, and 0V is applied to the source, so that hot electrons generated between the drain and the source are injected into the floating gate. During a data erase operation, the drain is open, −7V is applied to the word line, and 5V is applied to the source, so that the high voltage between the floating gate and the source causes electrons to be emitted by the FN tunneling.

FIG. 28 schematically shows a voltage applying system during read, write and erase operations with respect to a memory cell, The word line of the memory cell is driven by a row decoder. By a switch SW1, the high potential level of the row decoder is connected to Vddr=5 during a read operation, and VSW=8V during a write operation. By a switch SW3, the low potential level of the row decoder is connected to VBB=−7V during an erase operation. Thus, to the word line, i.e., the gate G, of the memory cell, 5V, 8V and −7V are applied during the read, write and erase operations, respectively.

During a read operation, the drain D of the memory cell is connected to a sense amplifier, so that 1V is applied thereto via the sense amplifier. During a write operation, the drain D of the memory cell is connected to a load LOAD, so that 5V is applied thereto via the load. During an erase operation, the drain is open.

To the source S of the memory cell, 5V is applied during an erase operation. In other modes, the source S of the memory cell is grounded. The load LOAD is connected to Vdd and a charging pump output Vddp via a switch SW2.

(Eighth Preferred Embodiment)

Figure 29:
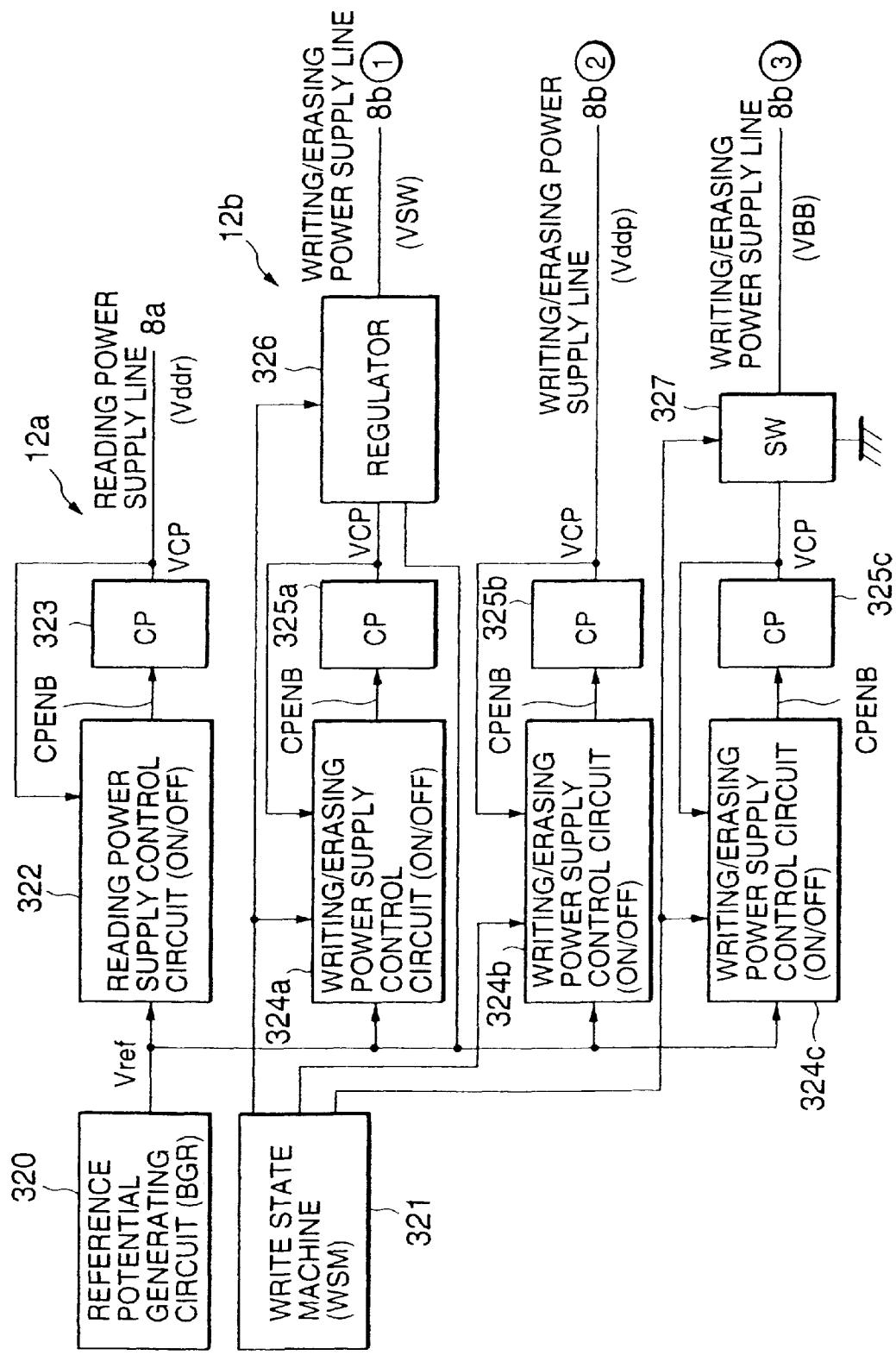
FIG. 29 is a block diagram of a power supply system in another preferred embodiment.

FIG. 29 shows an example of a reading power supply 12a and a writing/erasing power supply 12b. The reading power supply 12a and the writing/erasing power supply 12b generates a desired level on the basis of the output of a reference potential generating circuit 320 using, e.g., a band gap reference (BGR) circuit. In this case, there are the following three cases in a method for generating a desired level.

Case (1): A charging pump circuit is on-off controlled.
Case (2): The output obtained in case (1) is further controlled by a regulator.
Case (3): The output obtained in case (1) and a constant potential (e.g., VSS) are switched.

In FIG. 29, the reading power supply line 12a, and the power supply line ② of the three power supply lines 8b①~③ of the writing/erasing power supply 12b correspond to case (1). That is, the reading power supply 12a and the writing/erasing power supply line 6b ② comprise control circuits 322, 324b for on-off controlling a charging pump circuit, and charging pump circuits 323, 325b controlled by the circuits 322, 324b. In these power supply circuits, if the power supply level is a desired level or less, the charging pump circuits are driven, and if the power supply level reaches the desired level, the charging pump circuits are stopped.

The writing/erasing power supply line 8b① corresponds to case (2), and has a control circuit 324a for on-off control, a charging pump circuit 325a controlled by the circuit 324a, and a regulator control circuit 326 for controlling the output level of the charging pump circuit 325a. Specifically, this is used for carrying out an automatic data write operation for repeating write and verify operations using a write voltage of 8V and a verify reading voltage of 6.5 V, and the regulator control circuit 326 is used for such a voltage control.

The writing/erasing power supply line 8b③ corresponds to case (3), and has a control circuit 324c for on-off control, a charging pump circuit 325c for negative potential controlled by the control circuit 324c, and a switching circuit 327 for switching the output of the charging pump circuit 325c. The switching circuit is provided for outputting VSS when the charging pump 325c is not operated.

The above described three systems of writing/erasing power supply lines are activated by an auto control signal, which is outputted from a write state machine 321, in accordance with write/erase operation modes.

Figure 30:
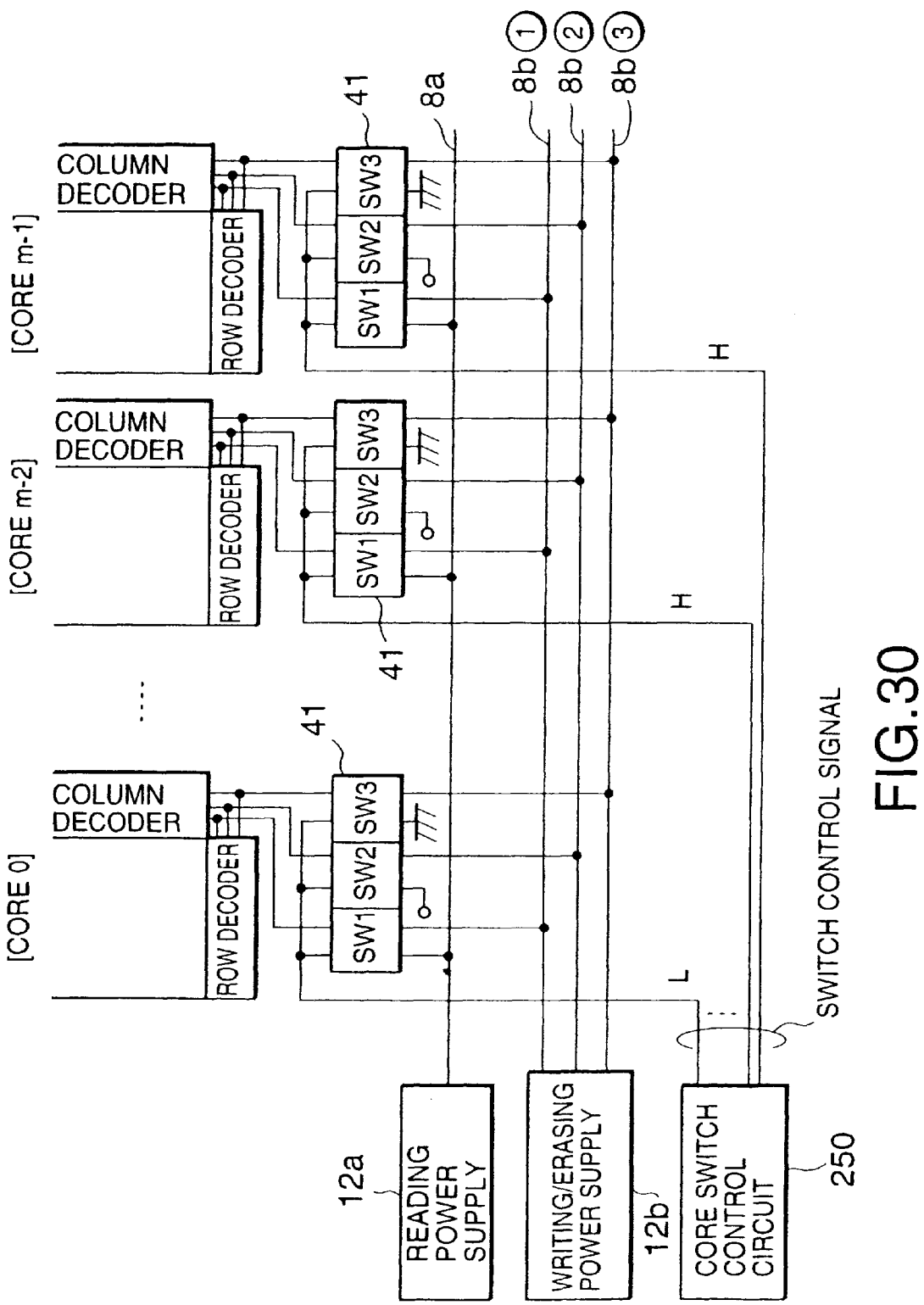
FIG. 30 is a diagram showing the construction of a power supply line switching circuit in the preferred embodiment.

FIG. 30 shows the construction of a power supply line switching circuit 16, which is a part of an address line switching circuit 3 for switching the power supply lines of the power supply circuit of FIG. 29 in accordance with an operation mode to supply a power supply line to each core. As shown in this figure, the power supply line switching circuit 16 comprises three switching circuits SW1 through SW3. These switches SW1 through SW3 are controlled by a writing/erasing enable signal ENBb, which is the output of a core switch control circuit 250 in this example (specifically, corresponding to the core busy output circuit 42 shown in FIGS. 5 and 7).

Figure 31:
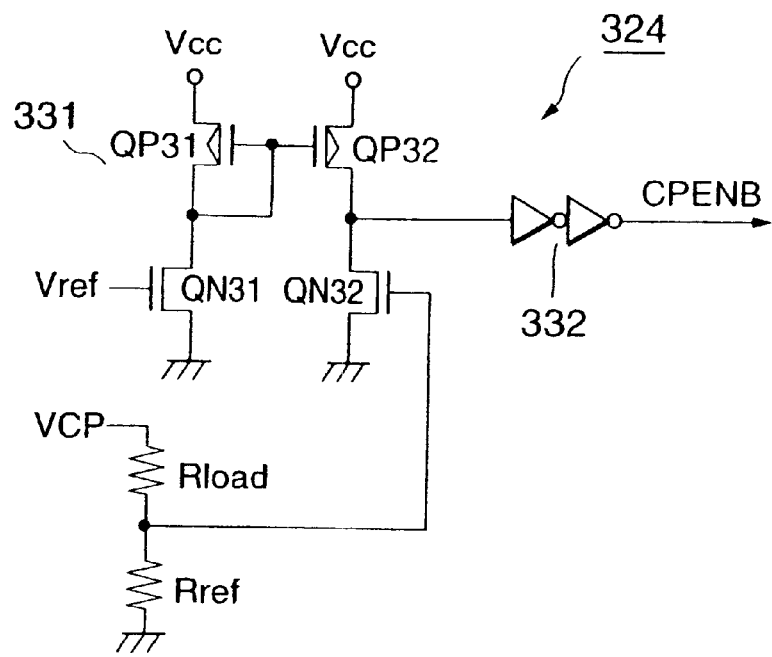
FIG. 31 is a circuit diagram of a charging pump control circuit in the preferred embodiment.

FIG. 31 shows an example of a control circuit 324 (322 is the same) for on-off controlling the charging pumps shown in FIG. 29. An operational amplifier circuit 331 is used for detecting the output VCP, which is obtained by the charging pump circuit 323, 325 and so forth, by a voltage divider circuit comprising resistors Rload and Rref and for comparing the output VCP with a reference voltage Vref. The output of the operational amplifier circuit 331 is derived from a buffer 322 as a charging pump enable signal CPENB.

Figure 32:
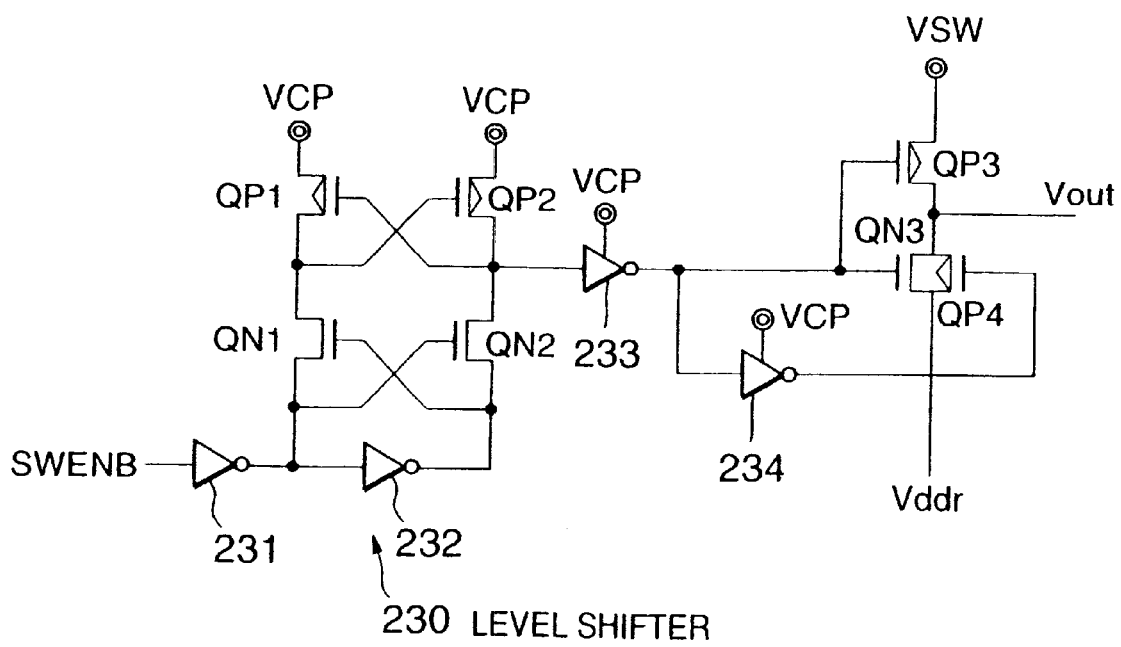
FIG. 32 is a circuit diagram of a power supply line switching circuit in the preferred embodiment.

FIG. 32 shows an example of switching circuits SW1, SW2 for switching a reading power supply, which is obtained in the reading power supply line 8b, and a positive writing/erasing power supply which is obtained in the writing/erasing power supplies 8b①, ②. A level shifter 230 controlled by an enable signal SWENB (corresponding to the enable signal ENBb in FIG. 29) generates a control signal having a voltage level, which is shifted from VCC system to a voltage between the positive high potential power supply VCP from the charging pump circuit and VSS. This control signal on-off controls output stage transistors QP3, QN3 and QP4 via inverters 233, 234. That is, if the output of the inverter 233 has "H", the NMOS transistor QN3 and the PMOS transistor QP4 are turned on to output a read power supply Vddr. If the output of the inverter 233 has "L", the PMOS transistor QP3 is turned on to output a boosted power supply VSW.

Figure 33:
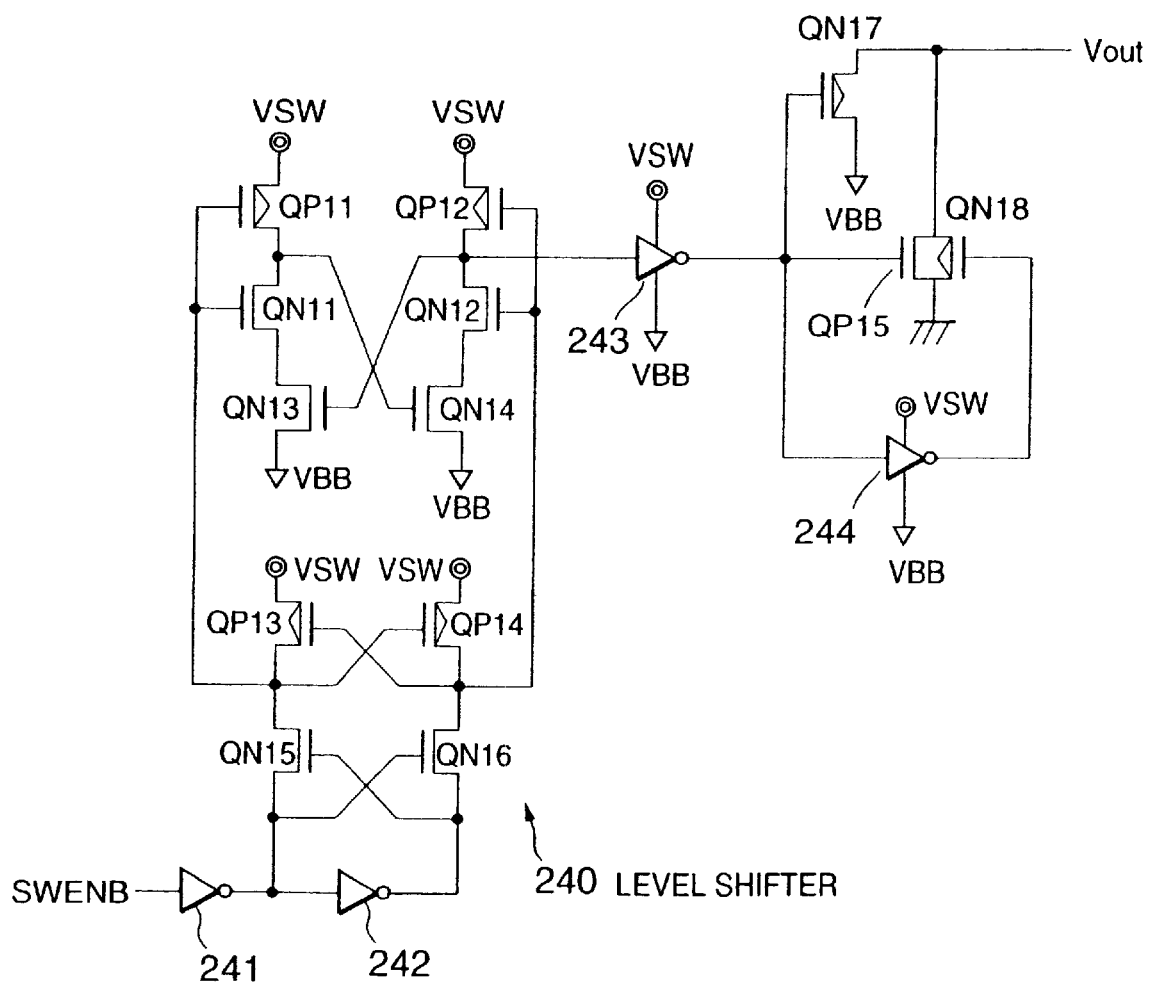
FIG. 33 is a circuit diagram of another power supply line switching circuit in the preferred embodiment.

FIG. 33 shows an example of a switching circuit SW3 for switching a negative power supply potential VBB obtained in the writing/erasing power supply line 8b③, and the ground potential VSS. A level shifter 240 controlled by an enable signal SWENB generates a control signal having a voltage level shifted from VCC system to a voltage between an intermediate potential power supply VSW and the negative power supply potential VBB. This control signal controls output stage transistors QN17, QN18 and QP15 via inverters 243, 244. That is, if the output of the inverter 243 has "H", the NMOS transistor QN17 is turned on to output a negative power supply VBB. If the output of the inverter 243 has "L", the PMOS transistor QP15 and the NMOS transistor QN18 are turned on to output VSS.

In the power supply switch control system shown in FIG. 30, the power supply of each core is fixed to the reading power supply or the writing/erasing power supply during a data write or erase operation. Therefore, in the case of a free bank system wherein a write/erase operation is carried out over a plurality of cores, the power supply transition can be carried out regardless of the address switching of core selection. However, in the free bank system, the capacity driven by the power supply varies in accordance with the number of selected cores of a block register. Therefore, the power supply transition time varies in accordance with the number of selected cores, or there is the possibility that the power supply transition oscillates when the number of selected cores is mall.

As methods for solving such a problem, the following two methods are considered. First, the magnitude of the load of a power supply control circuit (regulator) is held to be substantially constant regardless of the number of selected cores. Specifically, dummy load capacity selectively connected to a power supply control circuit is provided, and an internal power supply voltage or an external power supply voltage is detected to control the load capacity in accordance with the detected results. Secondly, the driving capability is switched in accordance with the number of selected cores. Also in this case, specifically, an internal power supply voltage or an external power supply voltage is detected to switch the driving power in accordance with the detected signal.

Specifically, such a preferred embodiment of a voltage control circuit according to the present invention will be described below.

(Ninth Preferred Embodiment)

Figure 34:
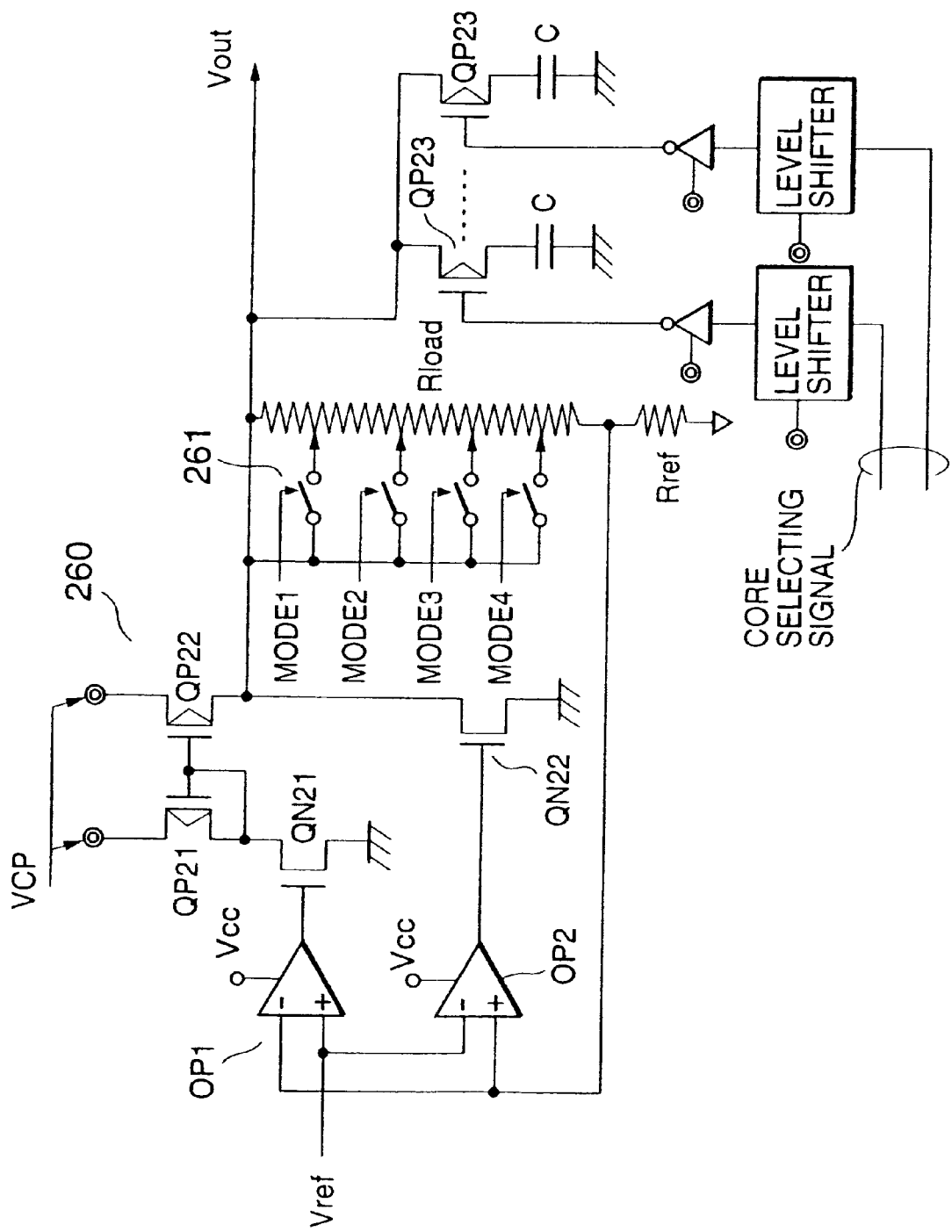
FIG. 34 is a circuit diagram of a regulator type power supply control circuit, to which a dummy load is applied.

FIG. 34 shows a preferred embodiment of a voltage addition type power supply control circuit according to the first method. A regulator body 260 has PMOS transistors QP21, QP22 and NMOS transistors QN21, QN22, which constitute a differential circuit for level-controlling and deriving the output VCP of a charging pump circuit, and two operational amplifiers OP1, OP2 for controlling the differential circuit in accordance with the output level. The output level is monitored as a divided voltage output of resistors Rload and Rref, and fed back to the operational amplifiers OP1, OP2 to obtain a predetermined voltage level. The resistor Rload can be switched by a switch 261, which is controlled by mode signals MODE1 through MODE4, so that a required power supply level is controlled.

In this preferred embodiment, a plurality of dummy core capacities C are optionally selected to be connected to the output terminal of such a voltage control type regulator body 260. The dummy core capacities C are selectively connected to the output terminal by a PMOS transistor QP23 which is controlled by a core selecting signal. Specifically, the dummy core capacities C are connected so that the load of the regulator is coincident with the capacity when all of cores are selected.

By the above described control of the addition of the dummy core capacities, it is possible to realize a predetermined power supply transition regardless of the number of selected cores.

Specifically, assuming that the capacity of one core is C (core), the number of selected cores is m (select) and the total number of cores is m (total), the added dummy core capacity C (dummy) may be controlled so as to meet the following formula (1).

$$C(\text{dummy}) = \{m(\text{total}) - m(\text{select})\} \cdot C(\text{core}) \tag{1}$$

(Tenth Preferred Embodiment)

Figure 35:
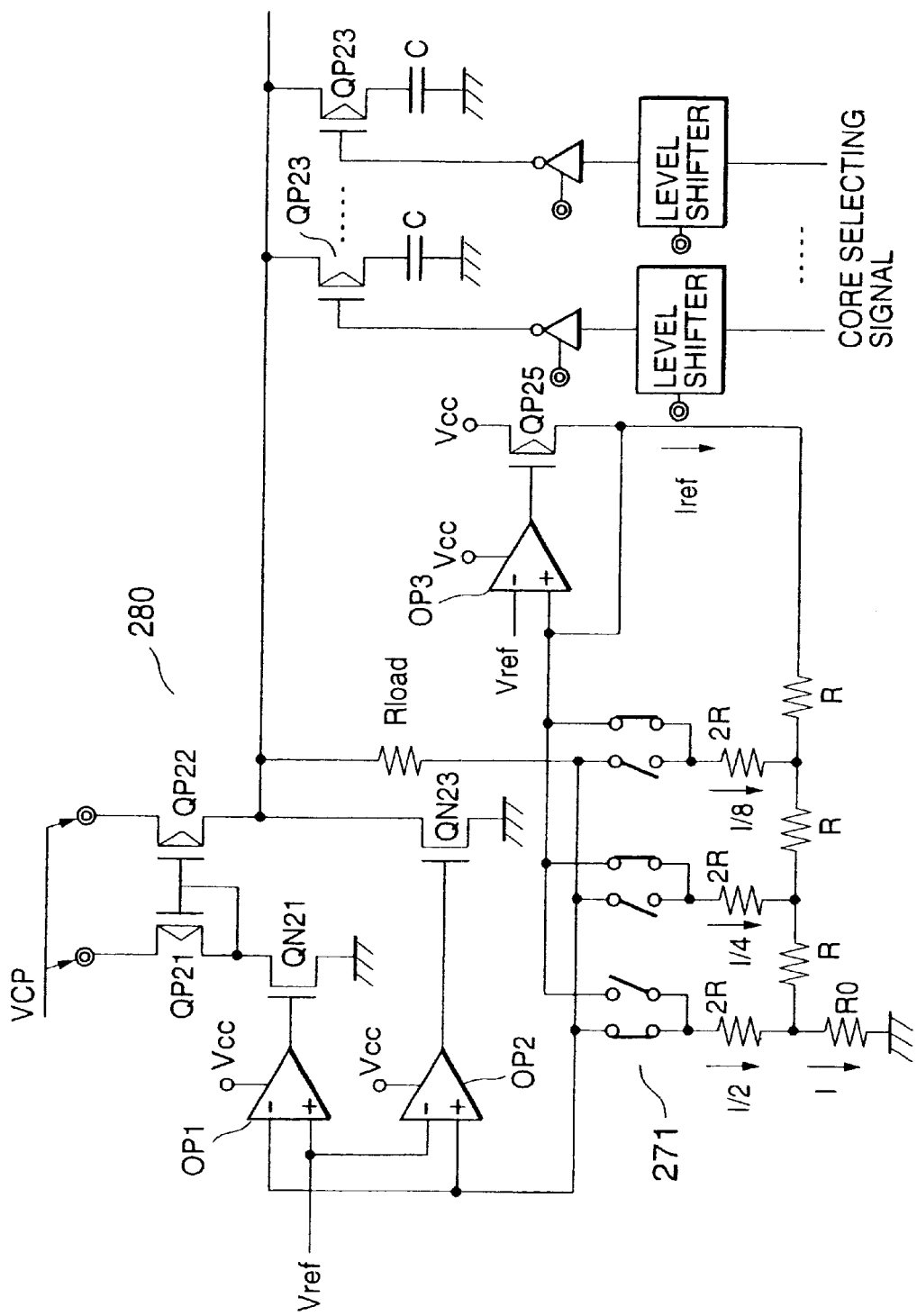
FIG. 35 is a circuit diagram of another example of a regulator type power supply control circuit, to which a dummy load is applied.

FIG. 35 shows another preferred embodiment according to the first method. In this preferred embodiment, a current addition type power supply control circuit is similarly devised. A regulator body 280 is a known regulator body, and utilizes a current addition system which uses an R/2R rudder circuit for monitoring the output voltage and a switch 271 for switching the current path. Also in this case, by selectively connecting dummy core capacities C to the output terminal of a regulator 208, the load capacity is always the same as that when all of cores are selected, similar to the above described preferred embodiment.

Thus, it is possible to realize a predetermined power supply transition regardless of the number of cores.

(Eleventh Preferred Embodiment)

Figure 36:
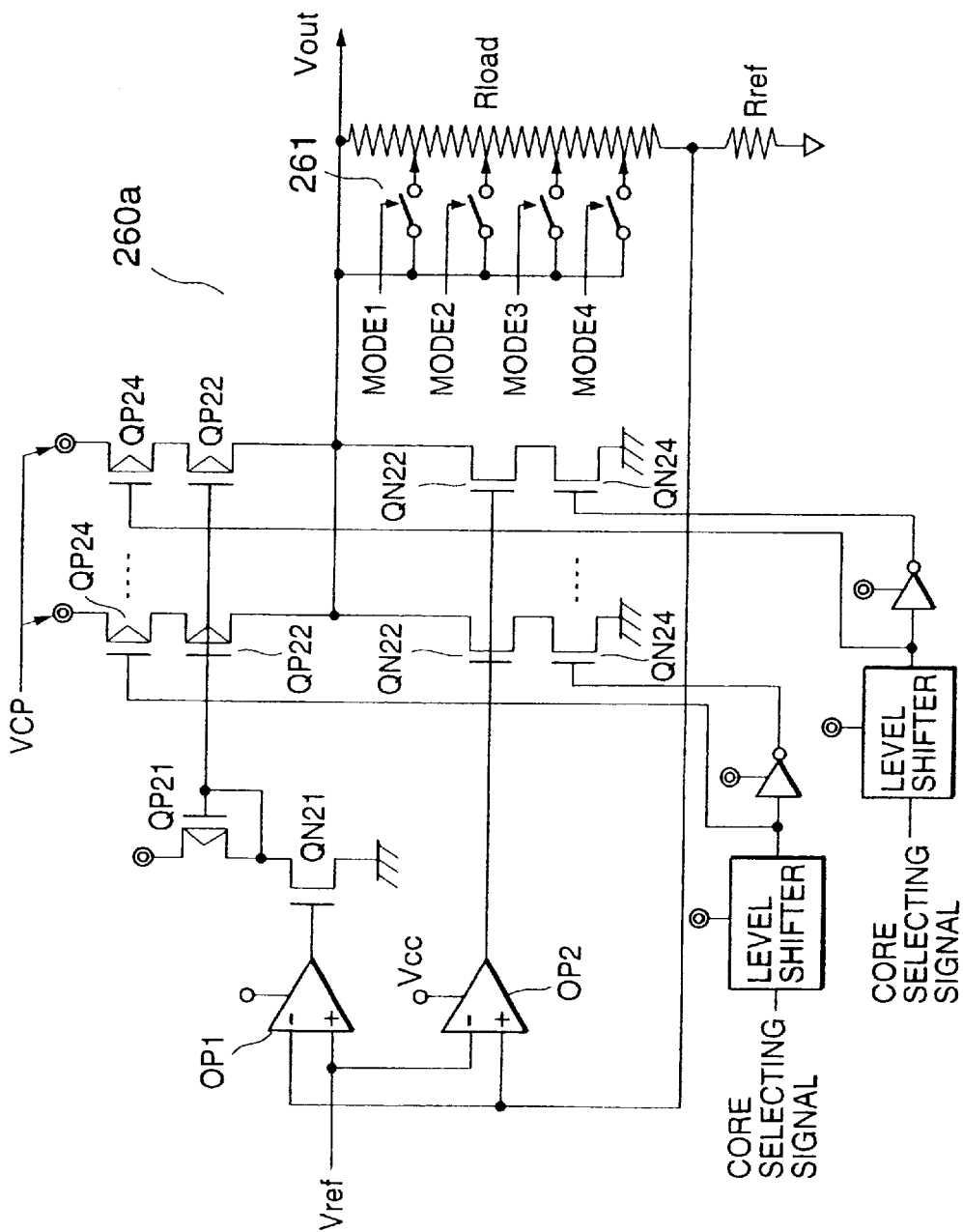
FIG. 36 is a circuit diagram of a regulator type power supply control circuit capable of switching a driving capability.

FIG. 36 shows a preferred embodiment according to the second method. A regulator 260a basically has a voltage addition type regulator body 260 shown in FIG. 34, and has driving PMOS transistors QP22 and NMOS transistors QN22 as a plurality of systems which are arranged in parallel. In each of these systems, switching PMOS transistors QP24 and NMOS transistors QN24 are inserted to be selectively controlled in accordance with the state of core selection.

Specifically, assuming that the number of selected cores is m (select), the transistor size of aunit driver/load is W (unit), the transistor size of a driver/load controlled in accordance with the number of cores is W (control), the control may be carried out so as to meet W(control)=m(select)·W(unit).

Thus, the switching of the driving capability of the power supply circuit (specifically, the substantial switching of the transistor size) can be carried out in accordance with the number of selected cores to realize a predetermined power supply transition regardless of the number of cores.

(Twelfth Preferred Embodiment)

Figure 37:
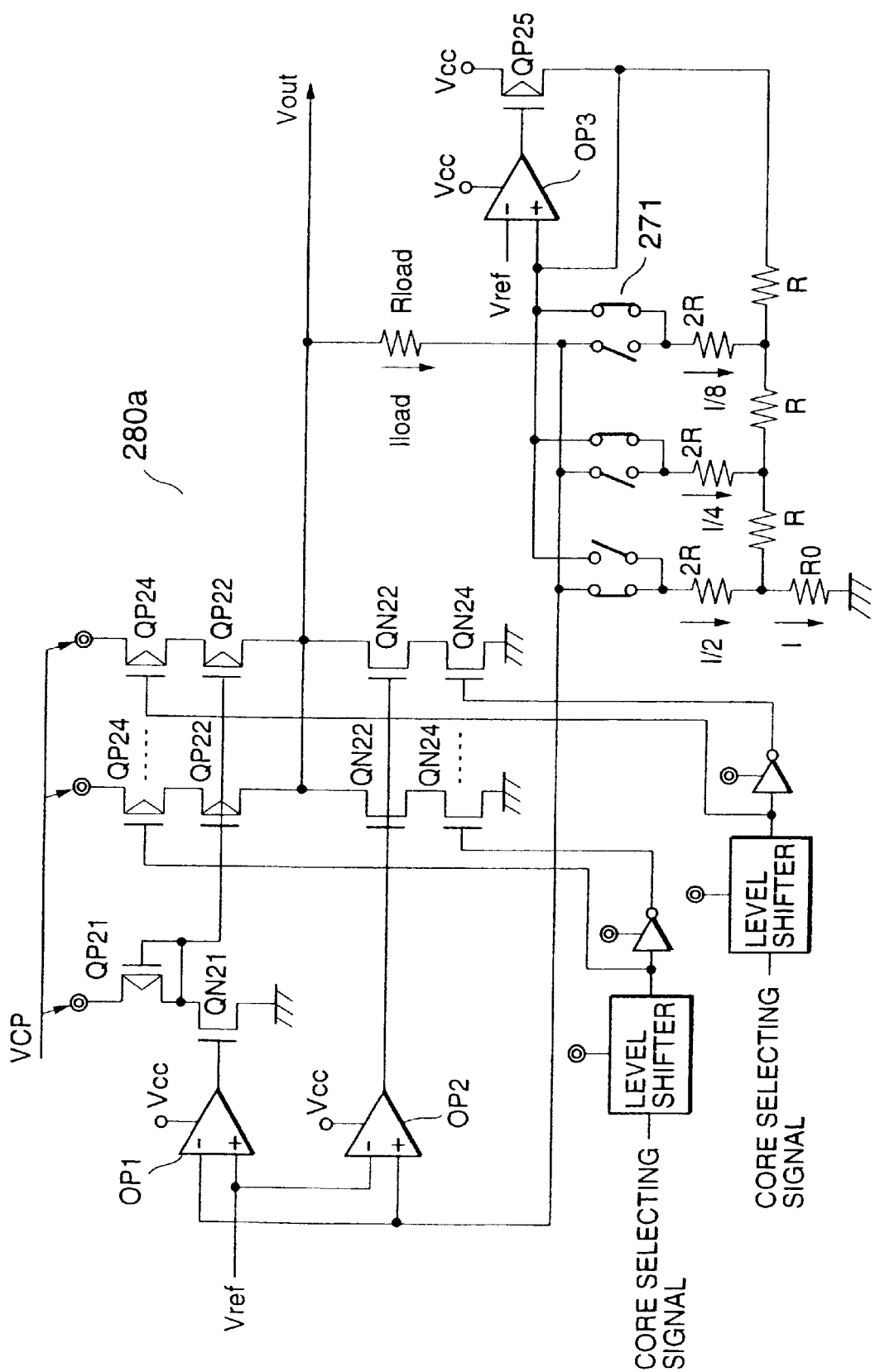
FIG. 37 is a circuit diagram of another regulator type power supply control circuit capable of switching a driving capability.

FIG. 37 shows another preferred embodiment according to the second method. A regulator 280a basically has a current addition type regulator body 280 shown in FIG. 35, and has load PMOS transistors QP22 and driver NMOS transistors QN22 as a plurality of systems which are arranged in parallel. In each of these systems, switching PMOS transistors QP24 and NMOS transistors QN24 are inserted to be selectively on-off controlled in accordance with the state of core selection.

Thus, similar to FIG. 36, the switching of the driving capability of the power supply circuit can be carried out in accordance with the number of selected cores to realize a predetermined power supply transition regardless of the number of cores.

(Thirteenth Preferred Embodiment)

Figure 38:
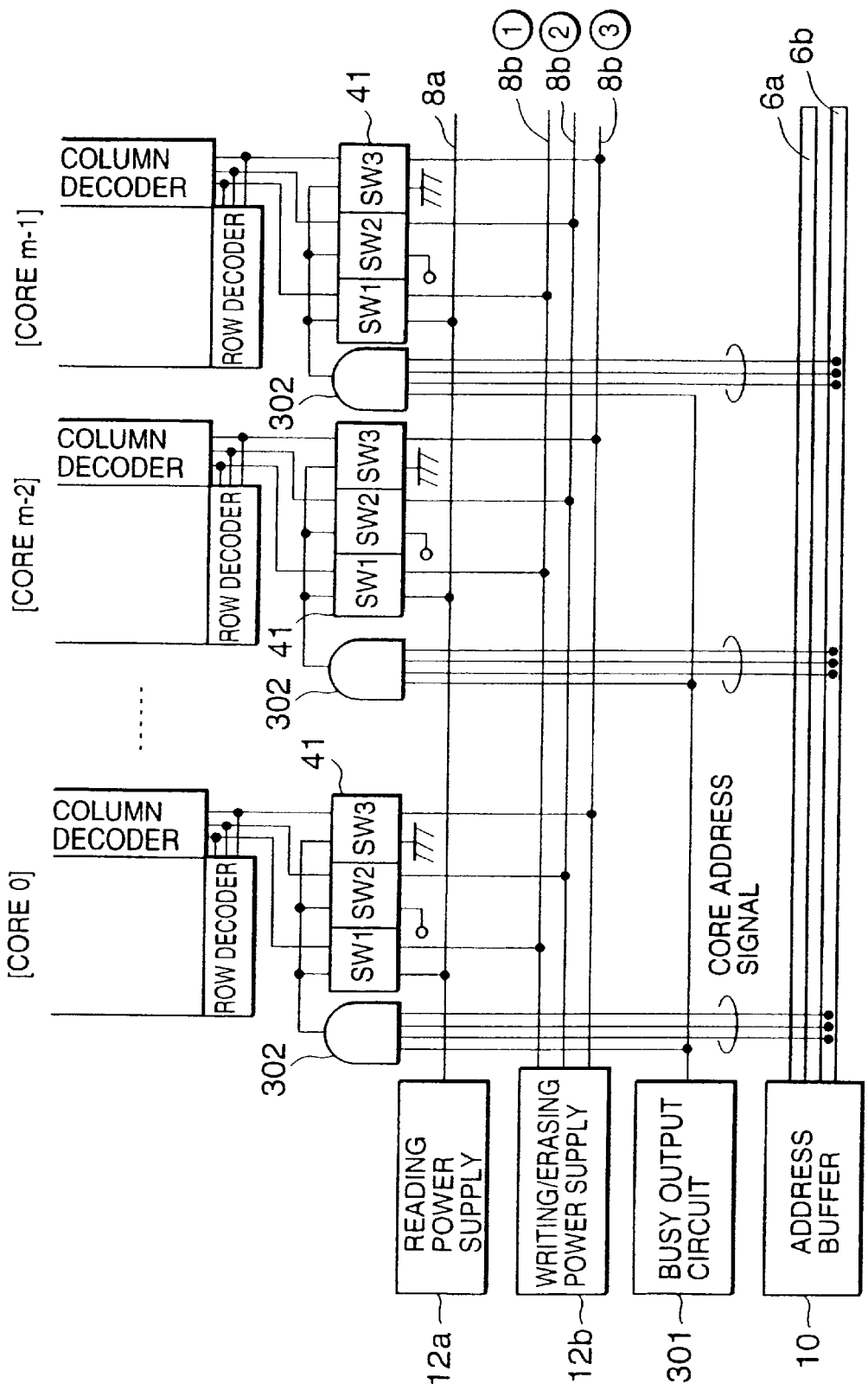
FIG. 38 is a diagram showing the construction of a power supply line switching circuit as a modification of the power supply line switch of FIG. 30.
Figure 39:
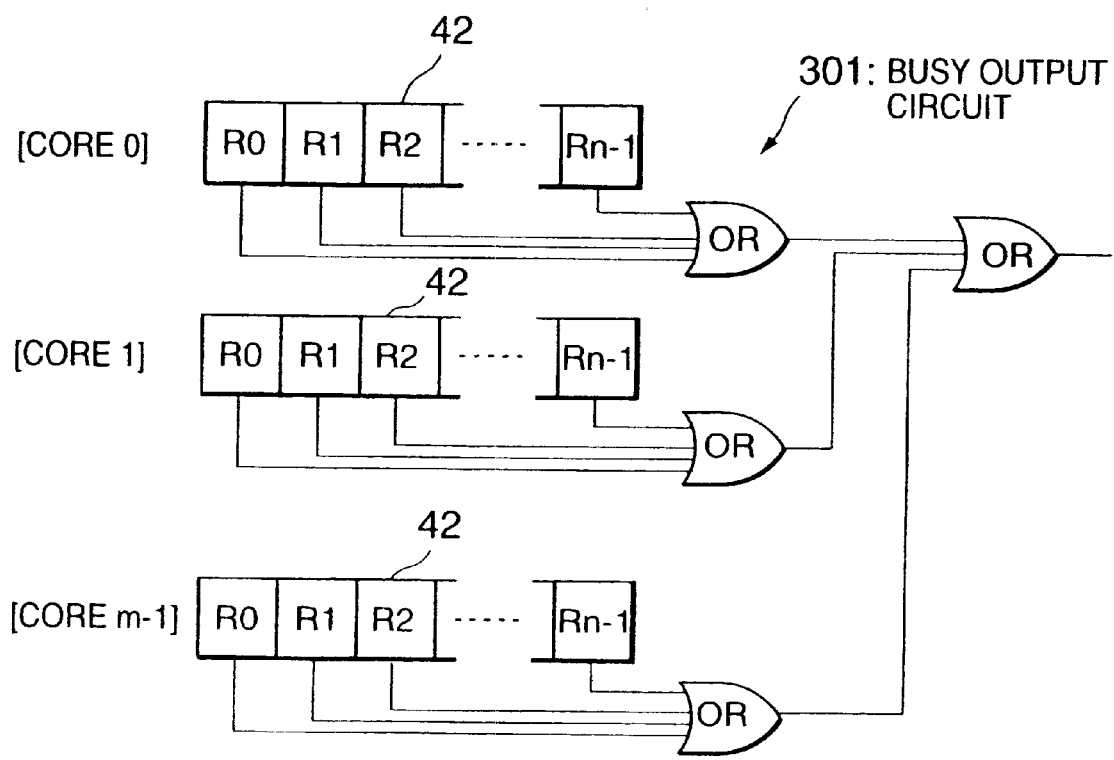
FIG. 39 is a diagram showing a busy output circuit for all of cores.

FIG. 38 shows a preferred embodiment as a modified embodiment of the power supply line switching circuit shown in FIG. 30. In this preferred embodiment, the coincidence of the output of a busy output circuit 301 with a core address signal is detected by an AND gate 302 to control a power supply line switch 16. In this case, as shown in FIG. 39, the busy output circuit 301 derives OR of all registers of each core block register 42 to output a busy output.

In the system in this preferred embodiment, the number of cores connected to the writing/erasing power supply line 8b is always one. Therefore, the capacity added to the writing/erasing power supply is always constant, so that controllability of the writing/erasing power supply (fluctuation in level in a short time) and stability (oscillation resistance) are excellent. On the other hand, the number of cores connected to the reading power supply line is the number of all cores, or the number of cores, from which one core in a write/erase mode is removed. Thus, the capacity added to the reading power supply is substantially constant, so that the controllability and stability are excellent.

(Fourteenth Preferred Embodiment)

A preferred control method for switching a reading power supply and a writing/erasing power supply will be described below.

Figure 40:
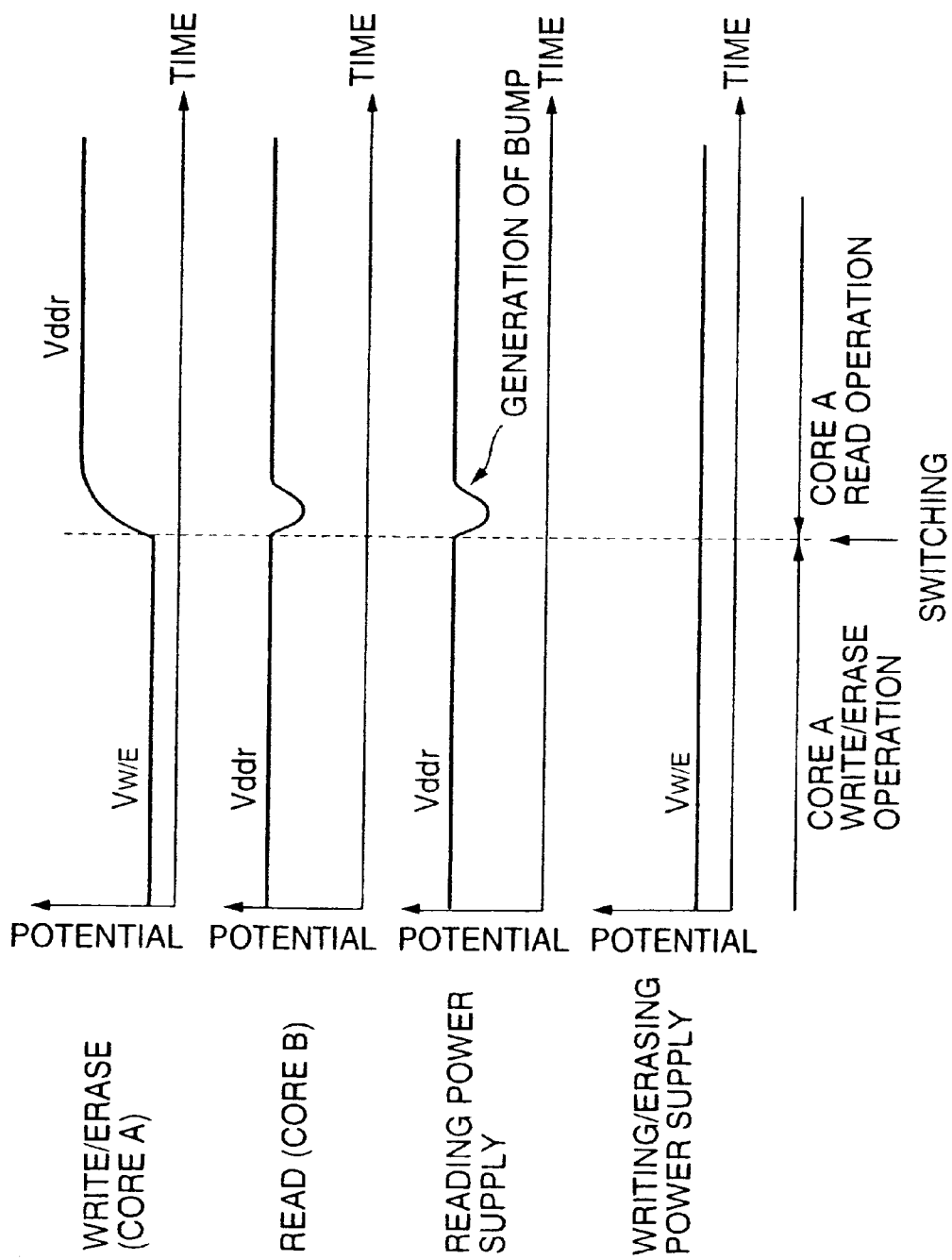
FIG. 40 is a waveform illustration for explaining a problem in the switching of a power supply.

In both of the free core system and the free bank system, only one set of reading power supply and power supply line, and only one set of writing/erasing power supply and power supply line are prepared in a chip. Therefore, if the writing/erasing power supply is switched to the reading power supply when the data write or erase operation is completed, the fluctuation in power supply potential occurs due to the switching. This state is shown in FIG. 40. When the data write/erase operation in core A and the data read operation in core B are simultaneously carried out, if the operation of core A is completed to switch the power supply, a bump is produced in the reading power supply potential as shown in FIG. 40, so that there is the possibility that the fluctuation in power supply causes an access lag and the output of error data in core B, in which a read operation is being carried out.

Figure 41:
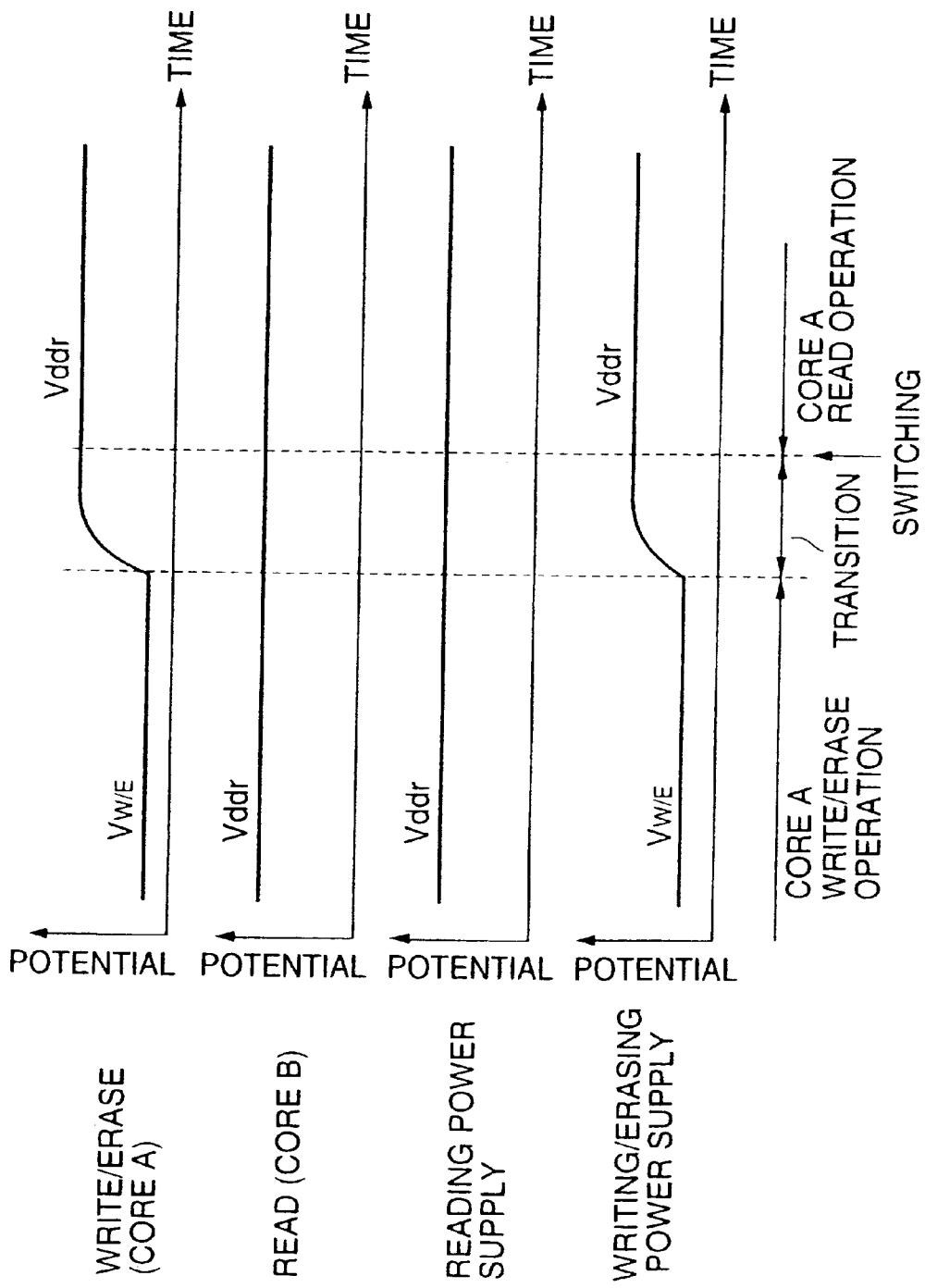
FIG. 41 is a waveform illustration for explaining a preferred embodiment of a power supply switching system according to the present invention.

In order to prevent this, as shown in FIG. 41, the writing/erasing power supply gives a power supply transition prior to switching so as to have the same potential as the reading power supply when the selected core is switched to the reading power supply. By carrying out such a switching control, it is possible to prevent the fluctuation in reading power supply potential, and simultaneously, it is possible to prevent malfunction of a core, in which a read operation is being carried out.

(Fifteenth Preferred Embodiment)

Figure 42:
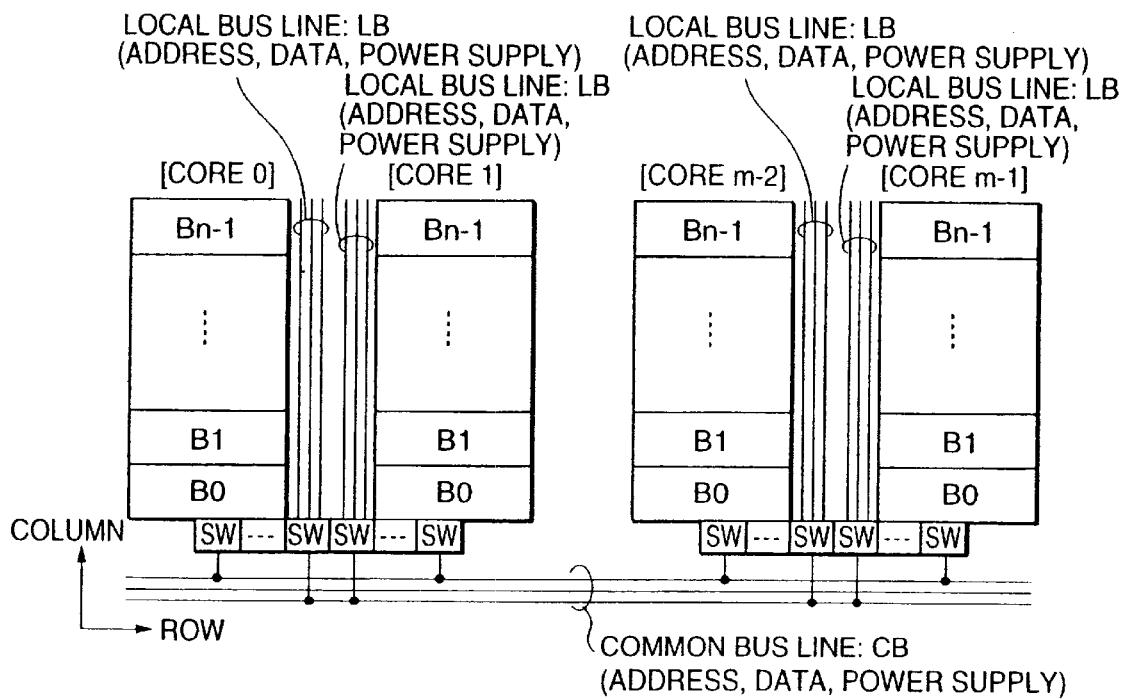
FIG. 42 is a drawing showing an example of a preferred layout of cores.
Figure 43:
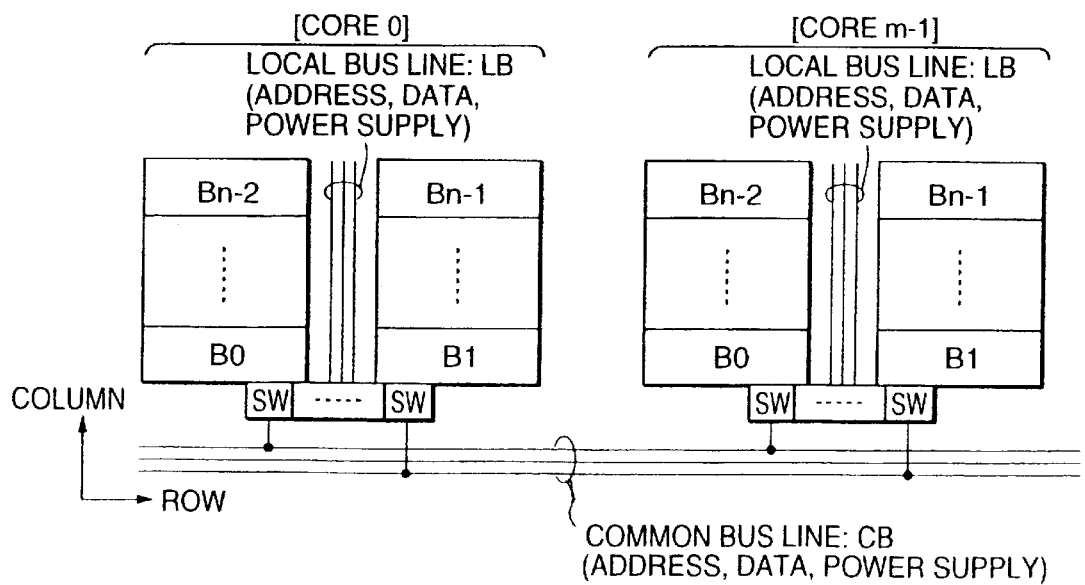
FIG. 43 is a drawing showing another example of a preferred layout of cores.

A preferred embodiment of the efficient relationship between the arrangement of cell array blocks in cores and the arrangement of address bus lines, data bus lines and power supply lines will be described below. FIGS. 42 and 43 show examples of such preferred layouts.

When one core comprises n array blocks, one core comprise 1 row x n columns as shown in FIG. 42, or 2 rows x (n/2) columns as shown in FIG. 43.

When one core comprises two rows as shown in FIG. 43, although there is an advantage in that local bus lines LB (including address lines, data lines and power supply lines) in cores can be commonly used for adjacent blocks, the layout area of common bus lines CB (including address lines, data lines and power supply lines) increases. In view of the whole layout area, it is determined whether one-row or two-row construction is selected. If one core comprises three rows or more, the length of the common bus lines CB increases, so that the layout is not minimum.

When one core comprises two rows, if n is an odd number, the core comprises 2 rows x [(n+1)/2] columns.

By arranging the common bus CB in each core in row directions and by arranging a switching circuit (an address line switch, a data line switch and a power supply line switch) in each core, the address, data and power supply lines are arranged between the common bus CB and each core at the minimum distance, so that an efficient layout can be obtained. Moreover, by arranging the address line switch, the data line switch and the power supply line switch in row directions as a switching circuit for each core, the layout has a closer pattern. The local address line switch for each core is arranged in parallel to the common bus lines CB, or below the common bus lines CB when a multi-layer metallization is used.

Comparing the core comprising one row in FIG. 42 with the core comprising two rows in FIG. 43, the core comprising one row has longer local bus lines LB although it has a smaller layout of common bus lines CB and switching circuit.

On the basis of the length of the common bus lines CB plus the length of the local bus lines LB in the whole chip, it is determined whether the one-row construction or the two-row construction is selected. This point will be described in detail below.

Now, as shown in FIG. 1, it is assumed that the total number of cores is m (total), the number of blocks in one core is n, the length of one block in row directions is x (Block) and the length of one block in column directions is y (Block). Then, the length of the common bus line CB plus the length of the local bus lines LB (one row) in the core comprising one row is expressed by the following formula (2).

$$l(\text{one row}) = y(\text{Block}) \times n \times m(\text{total}) + x(\text{Block}) \times m(\text{total}) \quad (2)$$

On the other hand, the length of the common bus lines CB plus the length of the local bus lines LB (two rows) in the core comprising two rows is expressed by the following formula (3).

$$l(\text{two rows}) = (1/2) \times y(\text{Block}) \times n \times m(\text{total}) + 2 \times x(\text{Block}) \times m(\text{total}) \quad (3)$$

The relationship in large and small between these cores is l(one row)<l(two rows) when $(1/2) \times n \times y(\text{Block}) < x(\text{Block})$. In this case, the core comprising one row is advantageous. In the opposite case, the core comprising two rows is advantageous.

However, the above described formulae are established when the number n of blocks is an even number. When the number n of blocks is an odd number, (n+1) may be substituted for n.

With the above described construction, it is possible to realize a closest layout in a free bank system or a free core system.

(Sixteenth Preferred Embodiment)

Figure 44:
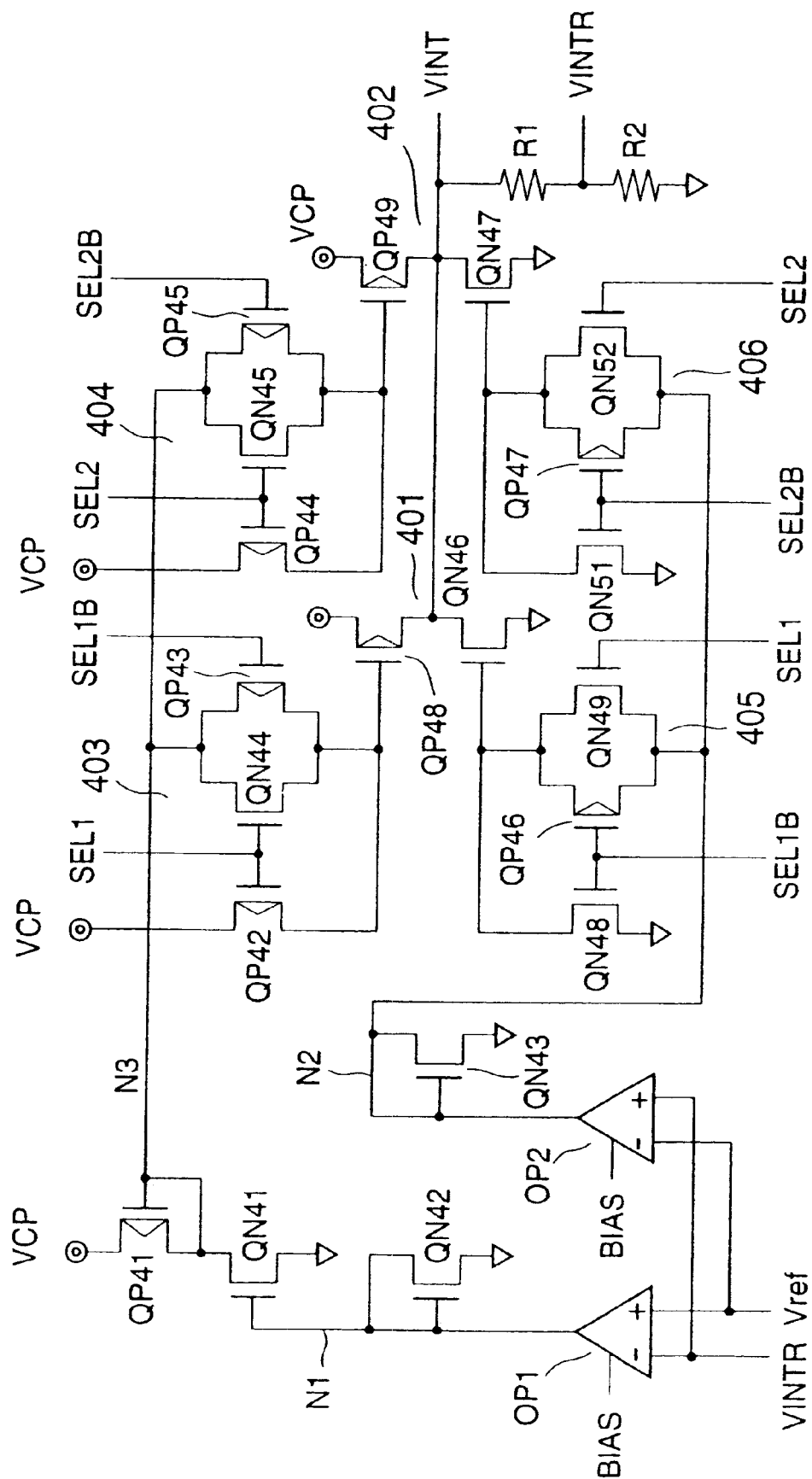
FIG. 44 is a circuit diagram of another preferred embodiment of a power supply circuit according to the present invention.

FIG. 44 shows a preferred embodiment as a modified embodiment of the regulator power supply 260a shown in FIG. 36. When a voltage VINTER detected by registers R1, R2 connected to a power supply output terminal is fed back so that an internal power supply potential VINT has a predetermined control level, operational amplifiers OP1 and OP2 control the whole circuit so that VINTER=Vref. In the operational amplifiers OP1 and OP2, diode connected transistors QN42 and QN43 provided for leakage. There are provided two drive circuits 401 and 402 having different driving capabilities for supplying current to a load capacity by a charging pump circuit output VCP on the basis of the current of a current source PMOS transistor QP41 controlled by the operational amplifier OP1.

The PMOS transistors QP48 and QP40 of the drive circuits 401 and 402 are selectively connected to a node N3 of a current source, which is controlled by the operational amplifier OP1, or to the terminal of the boosted voltage VCP, by means of switching circuits 403 and 404. The gates of the NMOS transistors QN46 and QN47 of the drive circuits 401 and 402 are selectively connected to an output node N2 of the operational amplifier OP2 or the ground potential by means of switching circuits 405 and 406.

The switching circuits 403 and 405 are controlled by a control signal SEL1 and a signal SEL1B which is complementary thereto. The switching circuits 404 and 406 are controlled by a control signal SEL2 and a signal SEL2B which is complementary thereto.

When the control signal SEL1="H", the PMOS transistor QP38 and NMOS transistor QN46 of the drive circuit 401 are controlled by the nodes N3 and N2, respectively, so as to supply current from the voltage VCP to the output terminal. When the control signal SEL2="H", the PMOS transistor QP49 and NMOS transistor QN47 of the drive circuit 402 are controlled by the nodes N3 and N2, respectively, so as to supply current from the voltage VCP to the output terminal. In addition, if both of the control signals SEL1 and SEL2 have "H", both of the drive circuits 401 and 402 can be activated.

For example, the driving capability of one drive circuit 401 is designed to be double the driving capability of the other drive circuit. These drive circuits 401 and 402 are switched by the control signals SEL1 and SEL2 in accordance with the load capacity. That is, if the drive circuit 402 is designed to be activated in an operation mode, in which the load capacity is small, and if the drive circuit 401 is designed to be activated in an operation mode, in which the load capacity is large, it is possible to prevent the transition lag and oscillation of the power supply potential.

Figure 45:
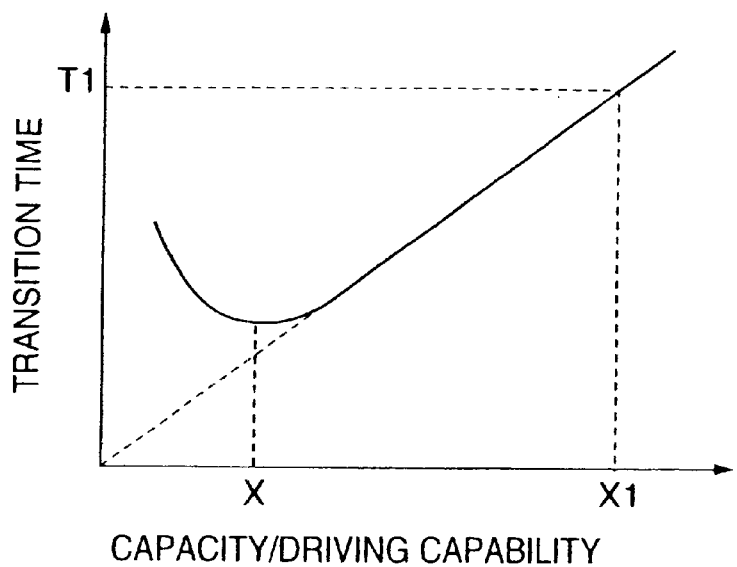
FIG. 45 is a graph showing the relationship between the load capacity and driving capability and transition time of a power supply circuit.

Effectiveness in such a control for switching the driving capability of a power supply will be described in detail below. FIG. 45 shows the relationship between a ratio of a load capacity (c) to driving capability (W) of a power supply and a power supply transition time. Assuming that C/W capable of carrying out an earliest transition is X, a transition lag occurs due to oscillation and so forth when C/W<X. When C/W>X, a stable operation is carried out on a theoretical straight line wherein the transition time increases in proportion as the increase of C/W. The reason why the transition time is gradually shifted from the theoretical line as C/W approaches X is that it takes a lot of time due to overshoot or undershoot of the internal power supply until the stable operation is carried out. In order to achieve the stable transition of the internal power supply in a certain transition time T1 or less, it must be set so that X<C/W<X1. Therefore, when the load capacity C has a plurality of different values, it is effective to switch the driving capability W.

Specifically, in the power supply regulator of FIG. 44, when the control signal SEL1 has "H", the load capacity is set to be double that when the SEL2 has "H". In addition, it is assumed that only one drive circuit exists in FIG. 44, and it is assumed to set so that C/W=X1 in order to allow the driving capability to cause the power supply transition at time T1 on the basis of the load condition of the control signal SEL2="H". Then, under the load condition of the control signal SEL1="H", C/W is 2·X1, so that the transition time greatly exceeds a specified transition time. Therefore, as described above, by preparing the drive circuit 401 which is selected by the control signal SEL1 and which is separate from the drive circuit 402 controlled by the control signal SEL2, and by setting the driving capability of the drive circuit 401 to be double that of the drive circuit 402, it is possible to obtain the specified transition time regardless of the load capacity.

Figure 46:
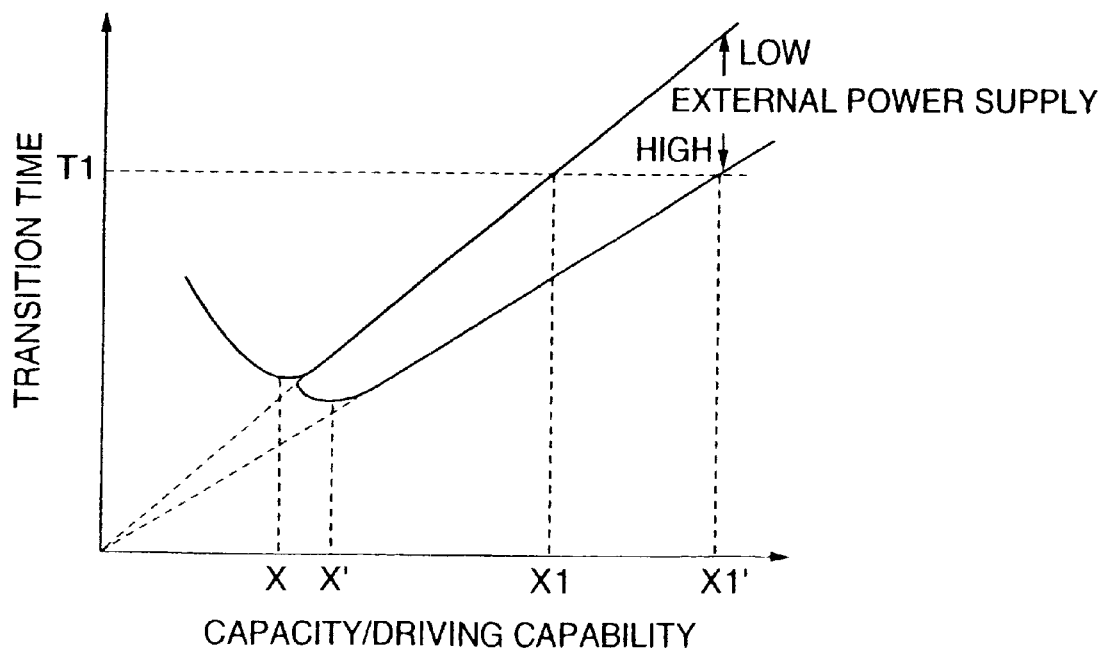
FIG. 46 is a graph showing the relationship between the load capacity and driving capability and transition time of a power supply circuit by an external power supply.

This preferred embodiment is also effective against the fluctuation in external power supply level. FIG. 46 shows the relationship between C/W of an internal power supply and a power supply transition time with respect to different external power supply levels. That is, when the external power supply is low, C/W capable of carrying out the earliest transition without causing oscillation is X, whereas when the external power supply increases, this C/W is X'. This means that even if the load capacity and driving capability of the internal power supply are the same, when the external power supply is high, the capability of the driving transistor is high to rapidly cause charge and discharge, so that the internal power supply is easy to oscillate. In a case where the transition of the internal power supply is intended to be caused in time T1, when the external power supply is low, X<C/W<X1, whereas when the external power supply is high, X'<C/W<X1', so that C/W slides toward a high value.

Therefore, when the driving capability is not designed to be variable, the driving capability and load must be set in the range of X'<C/W<X1 in order to meet the condition of transition in the non-oscillated time T1, so that the allowable range of design is narrow. On the other hand, by switching the driving capability as shown in FIG. 44, it is possible to widen the setting range. In this case, the output of an external power supply detecting circuit and so forth are used as the control signals SEL1 and SEL2.

(Seventeenth Preferred Embodiment)

In the above described preferred embodiments, flash memories have been mainly described. As shown in FIG. 1, when a large number of cores are arranged in a large scale flash memory, data bus lines, address bus lines and so forth, which are used commonly for each core, are usually arranged outside of the region of cores. The same layout is not utilized only for flash memories, but it is also utilized for various semiconductor integrated circuits wherein a plurality of functional blocks are arranged. However, if the number of cores and functional blocks increases, the area of the chip occupied by the region of bus lines increases, so that the area penalty increases.

Figure 47:
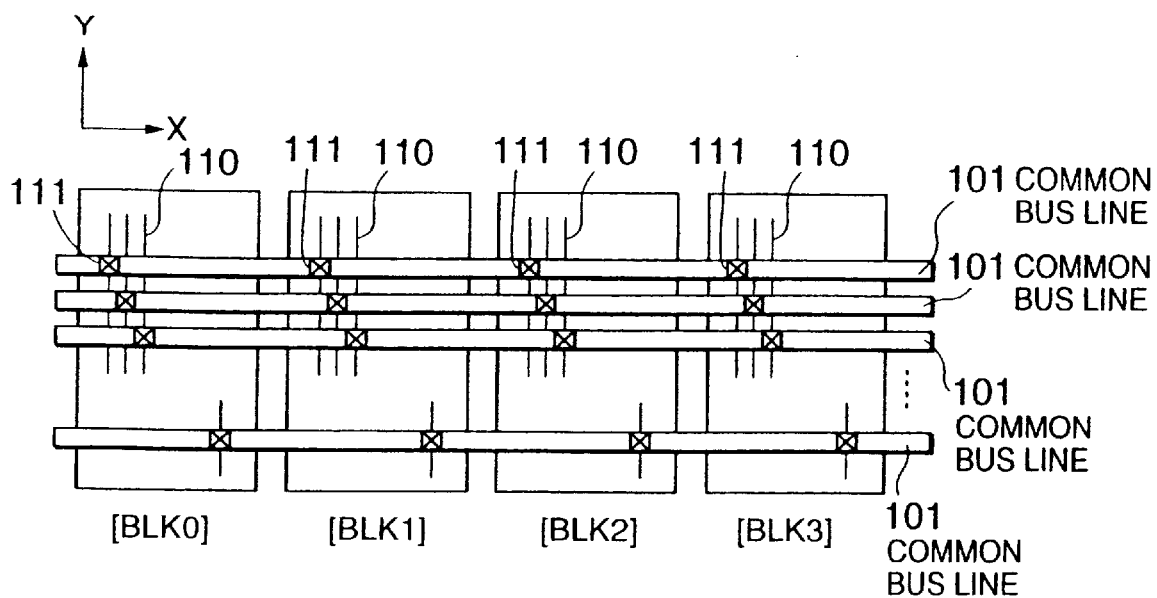
FIG. 47 is a layout drawing of a semiconductor device in another preferred embodiment.

Therefore, a preferred embodiment capable of reducing such an area penalty, thus, of reducing the chip size, is shown in FIG. 47. In FIG. 47, a plurality of functional blocks BLKi (i=0~3 in the case of the shown embodiment) are arranged in row (X) directions. The respective functional blocks BLKi may be the same kind of memory core circuits as described in the preceding preferred embodiments, or may be circuits other than memory circuits, e.g., logical circuit blocks. That is, each of the functional blocks BLKi is arranged as a set of certain circuit functions. In each of the functional blocks BLKi, signal lines 110 are formed for receiving and transmitting signals in and from the outside.

In this preferred embodiment, common bus lines 101 used commonly for the respective functional blocks BLKi are provided over the region of the respective functional blocks BLKi so as to extend over the respective functional blocks BLKi in X directions. The signal lines 110 on the region of the respective functional blocks BLKi are lines in a lower layer, and the common bus lines 101 are lines in an upper layer formed on the signal lines 110 via an interlayer insulator film. The common bus lines 101 are connected to the signal lines 110 of the respective functional blocks BLKi at suitable places by means of contacts 111.

By adopting such a layout, it is possible to reduce the chip size in comparison with the case where the region of common bus lines is provided separately from the region of functional blocks BLKi. In addition, it is not required to arrange incoming lines for drawing the common bus lines into the respective functional blocks BLKi.

(Eighteenth Preferred Embodiment)

Figure 48:
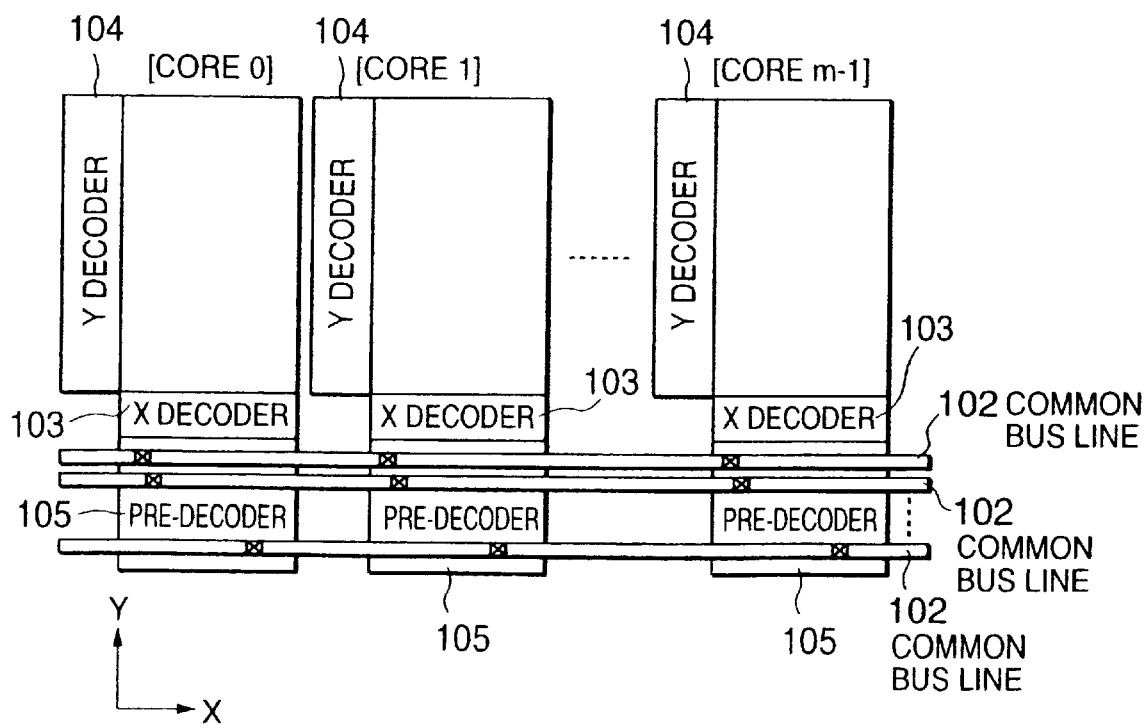
FIG. 48 is a layout drawing of a flash memory in another preferred embodiment.

FIG. 48 shows a preferred embodiment wherein the same technique as that in the above described seventeenth preferred embodiment is applied to a flash memory shown in FIG. 1. That is, cores constituting cell arrays of a flash memory are arranged in X directions as those corresponding to functional blocks BLKi of FIG. 47. As a decoder circuit (corresponding to the matrix decoder 2 in FIG. 1), attached to each core, for decoding address signals, there are provided a pre-decoder 105 for selecting cores, and a row (X) decoder 103 and column (Y) decoder 104 for decoding an output decode signal of the pre-decoder 105 to select rows and columns.

In this preferred embodiment, common bus lines 102 commonly used in all of cores are provided continuously in X directions over the region of the pre-decoder 105 attached to each core.

Thus, it is possible to reduce the chip size in comparison with the case where the region of common bus lines is provided outside of the region of cores. In addition, it is not required to arrange incoming lines for drawing the common bus lines into each core region.

(Ninth Preferred Embodiment)

Figure 49:
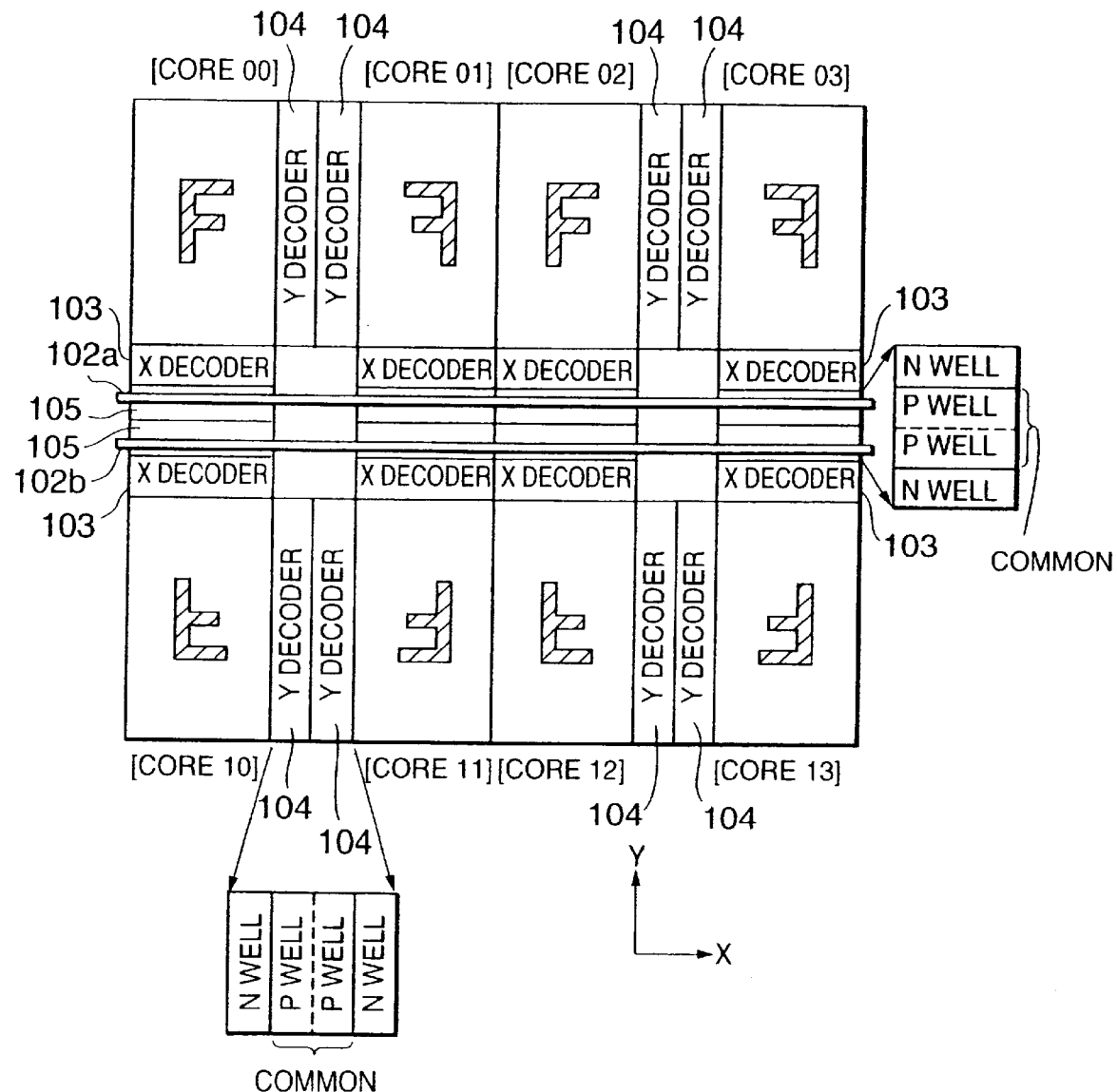
FIG. 49 is a layout drawing of a flash memory in another preferred embodiment.

FIG. 49 shows a preferred embodiment as a modified embodiment of the preferred embodiment of FIG. 48. In this preferred embodiment, cores are arranged in the form of a matrix. The adjacent cores in X directions are line-symmetrically arranged, and the adjacent cores in Y directions are also line-symmetrically arranged on both sides of the X decoder 103 and the pre-decoder 105. In the figure, F-shaped patterns show the symmetry of the layout. In FIG. 49, there are provided common bus lines 102a commonly utilized for a plurality of cores (00, 01, 02, 03) in the upper portion in Y directions, and common bus lines 102b commonly utilize for a plurality of cores (10, 11, 12, 13) in the lower portion.

In addition to the adoption of such a layout, adjacent cores share a part of a conductive type well region of a decoder circuit for the adjacent cores. That is, although the Y decoder 104 for adjacent cores in X directions has N wells for forming PMOS transistors, and P wells for forming NMOS transistors, the P or N wells, the P wells in the example of FIG. 49, are integrally formed as a common P well without providing any element isolating films therebetween.

Similarly, the pre-decoder 105 for adjacent cores in Y directions shares the P wells of the P and N wells are shared.

Thus, by line-symmetrically arranging the cores in the form of the matrix and by sharing the wells of the decoder, area penalty can be further reduced.

(Twentieth Preferred Embodiment)

Figure 50:
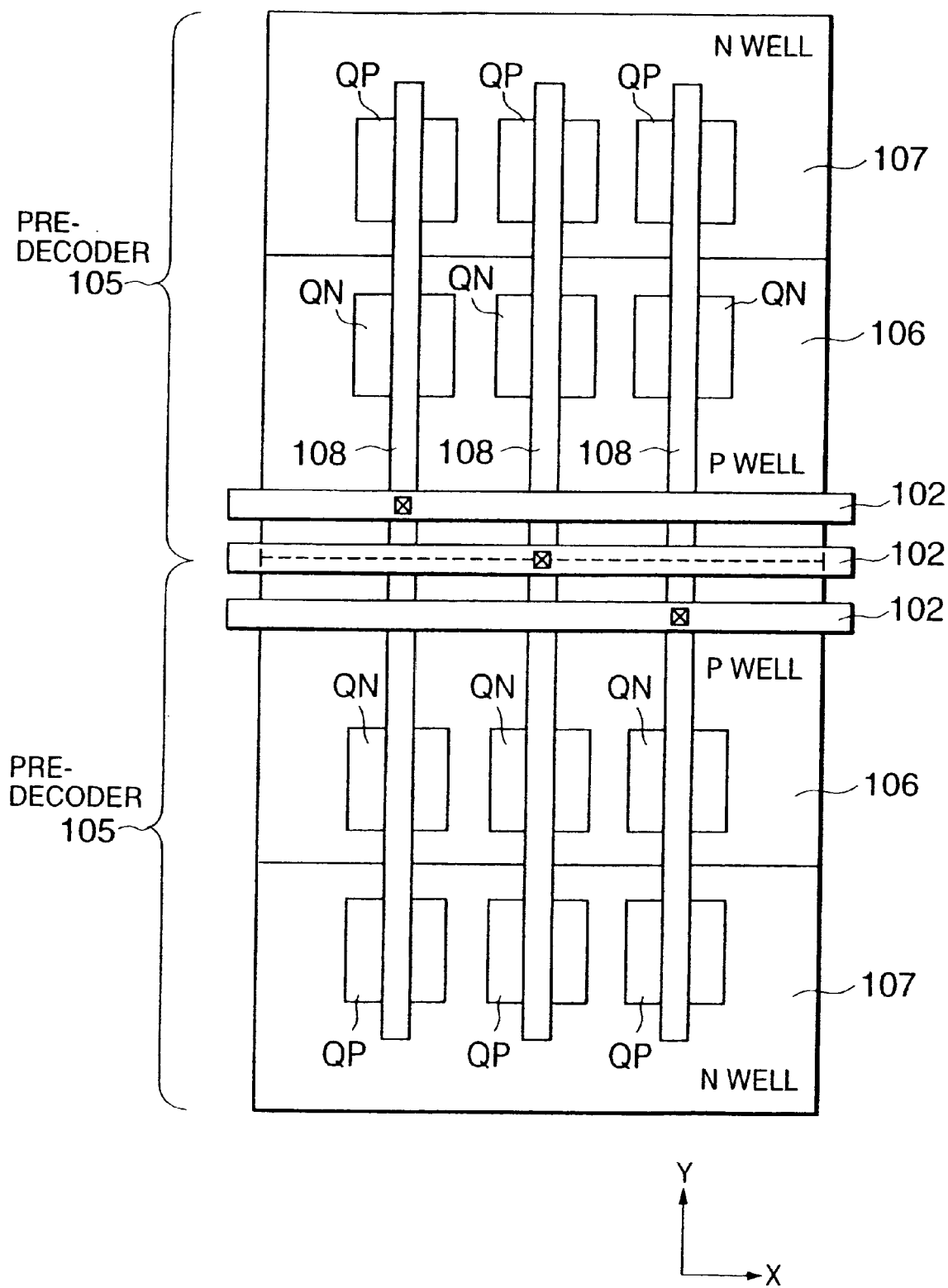
FIG. 50 is a layout drawing of a preferred embodiment as a modification of the preferred embodiment of FIG. 49.

While the common bus lines 102a and 102b have been provided separately for the upper and lower cores in FIG. 49, these common bus lines 102a and 102b may be shared. A preferred embodiment of such a layout is shown in FIG. 50. In FIG. 50, pre-decoders 105 for upper and lower cores in Y directions are enlarged. Each of the pre-decoders 105 comprises PMOS transistors QP and NMOS transistors QN which are formed in an N well 107 and a P well, respectively. As described above, the upper and lower pre-decoders 105 share the P well 106.

The common bus lines 102 shared by the upper and lower cores are provided over the boundary region between the pre-decoders 105 for the upper and lower cores. The common bus lines 102 are formed as lines in a layer above the signal lines 108 provided in each of the pre-decoders 105, and connected to the signal lines 108 via contacts at suitable places. In the shown example, the signal lines 108 are address signal lines connected to the gates of the respective transistors of the pre-decoders 105. Therefore, the common bus lines 102 are also address bus lines.

By thus sharing the common bus lines by the cores, it is possible to reduce current consumption in comparison with that in the preferred embodiment shown in FIG. 49.

(Twenty-first Preferred Embodiment)

Figure 51A:
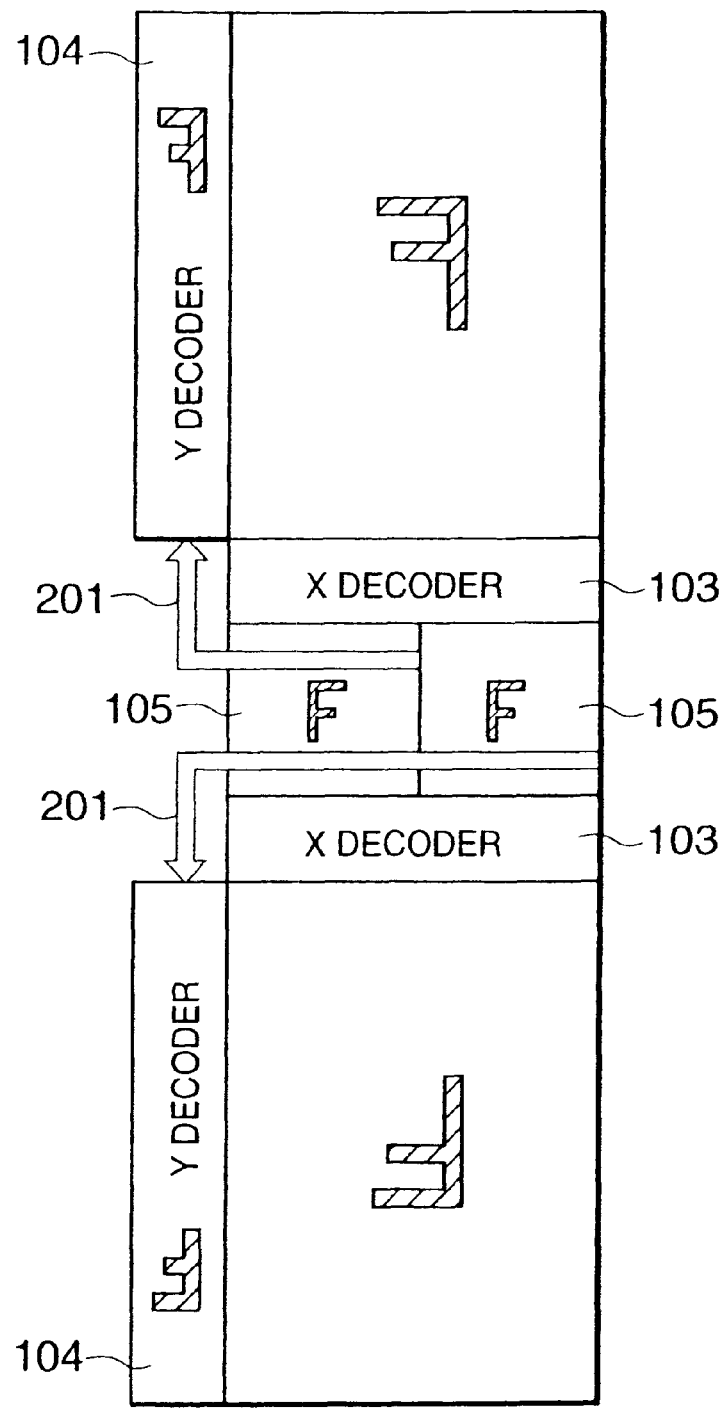
FIG. 51A is a layout drawing of another preferred embodiment as a modification of the preferred embodiment of FIG. 49.
Figure 51B:
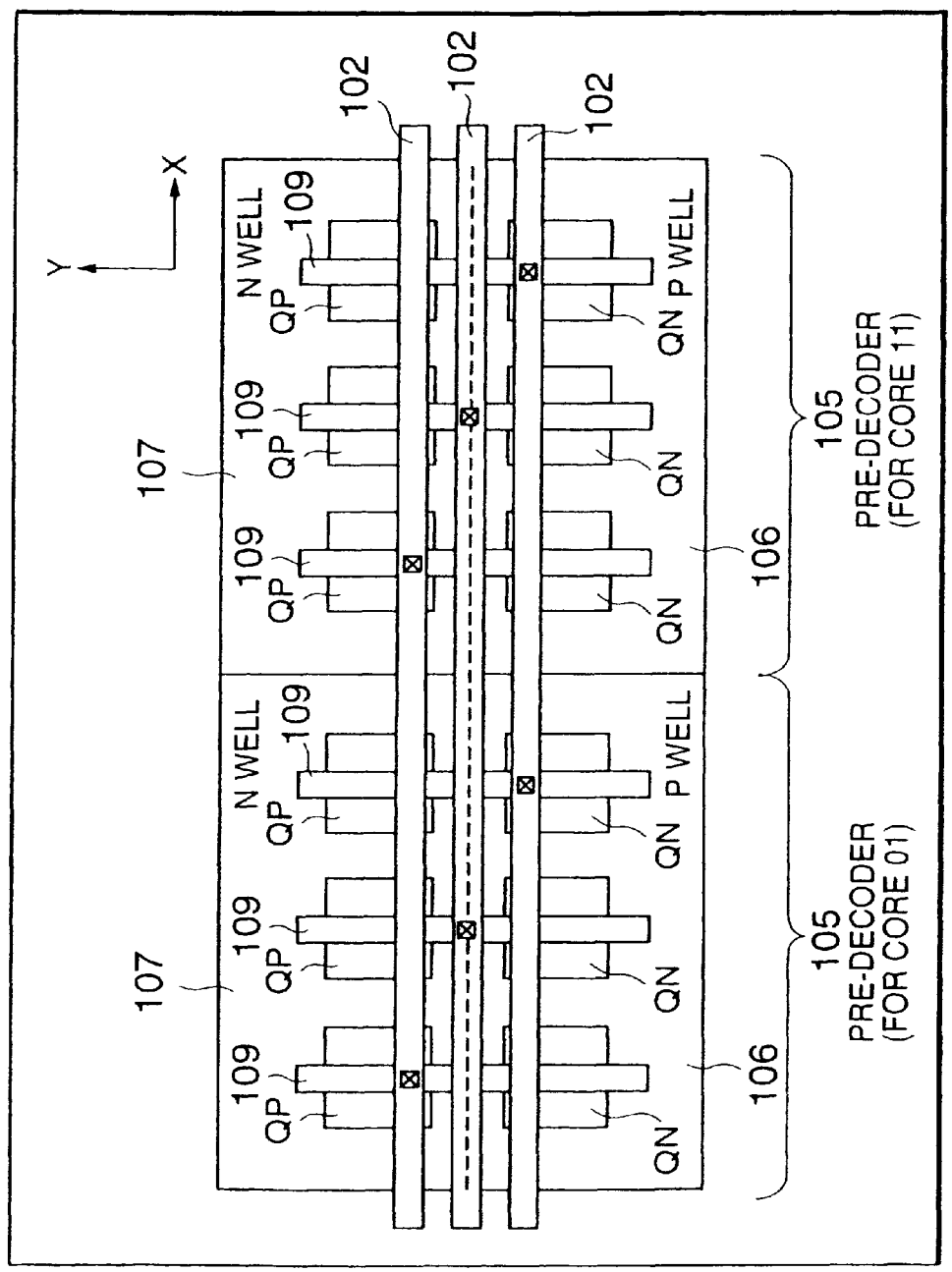
FIG. 51B is a layout drawing of a pre-decoder part in the preferred embodiment.

FIGS. 51A and 51B show a preferred embodiment as a modified embodiment of the preferred embodiment of FIG.49. In these figures, adjacent cores 01 and 11 in Y directions in FIG. 49 are extracted. In FIG. 49, the pre-decoders 105 for the upper and lower cores in Y directions are adjacent in Y directions. On the other hand, in this preferred embodiment, the pre-decoders 105 for the upper and lower cores are arranged in X directions. If the area of two pre-decoders 105 for the upper and lower cores in FIG. 49 is not substantially changed, the area of one pre-decoder 105 in the case of FIG. 51A has a size in X direction, which is about half of that in FIG. 49, and a size in Y direction, which is about double that in FIG. 49.

In addition, in this preferred embodiment, transistors QP and QN of the pre-decoders 105 are arranged below common bus lines 102 as shown in FIG. 51B. In this case, the common bus lines 102 can be connected directly to the gate electrodes 109 of the transistors via contacts. Thus, it is possible to further reduce area penalty.

However, in this preferred embodiment, the two pre-decoders 105 shown in FIG. 51Aa are not line-symmetrical in X directions, so that decode output lines 201 from each of the pre-decoders 105 are extended in the same X directions to enter the Y decoders 104 in the upper and lower cores. Therefore, the decode output lines 201 are concentrated in the input part to the Y decoders 104.

(Twenty-second Preferred Embodiment)

Figure 52A:
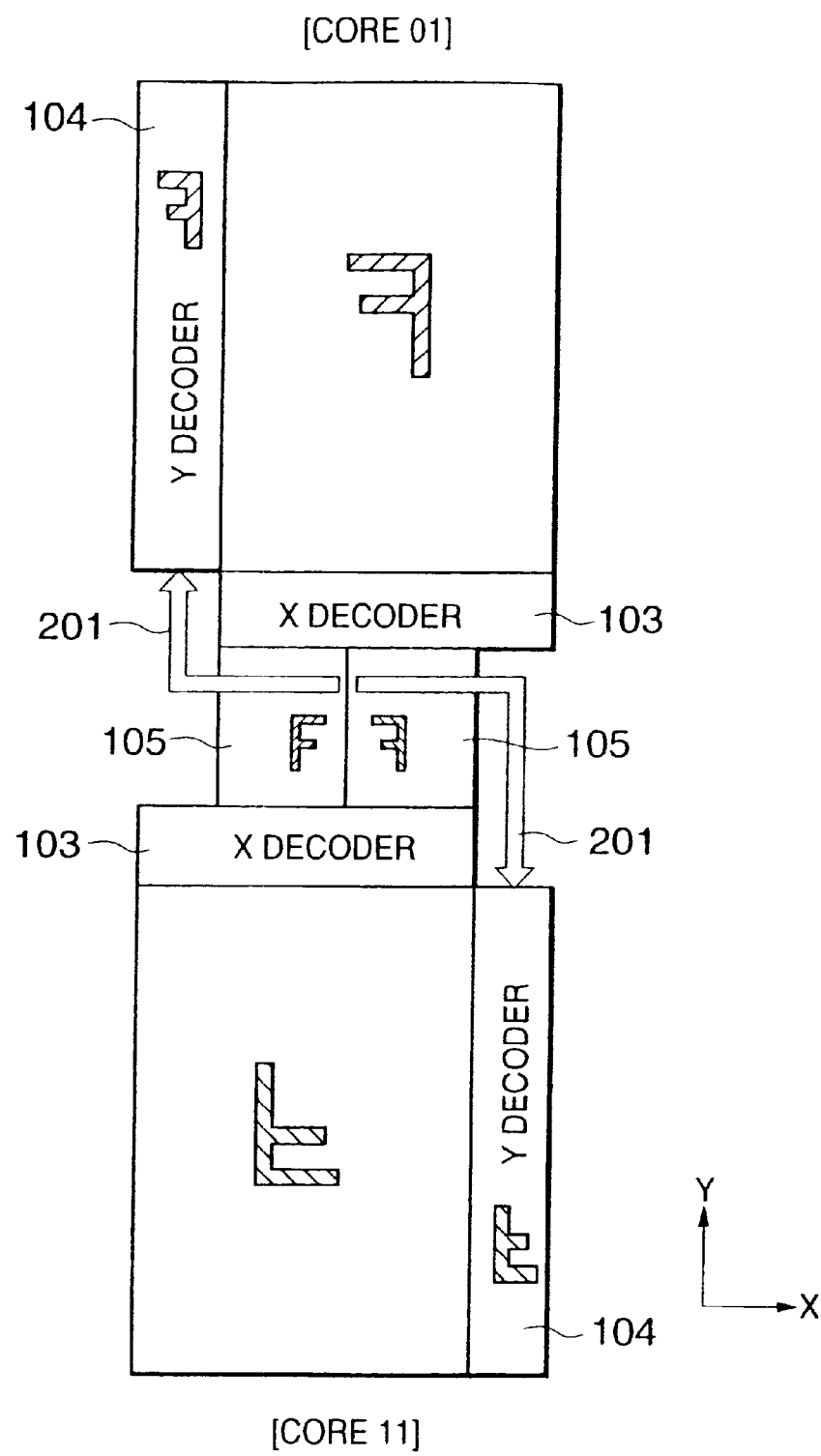
FIG. 52A is a layout drawing of another preferred embodiment as a modification of the preferred embodiment of FIG. 49.
Figure 52B:
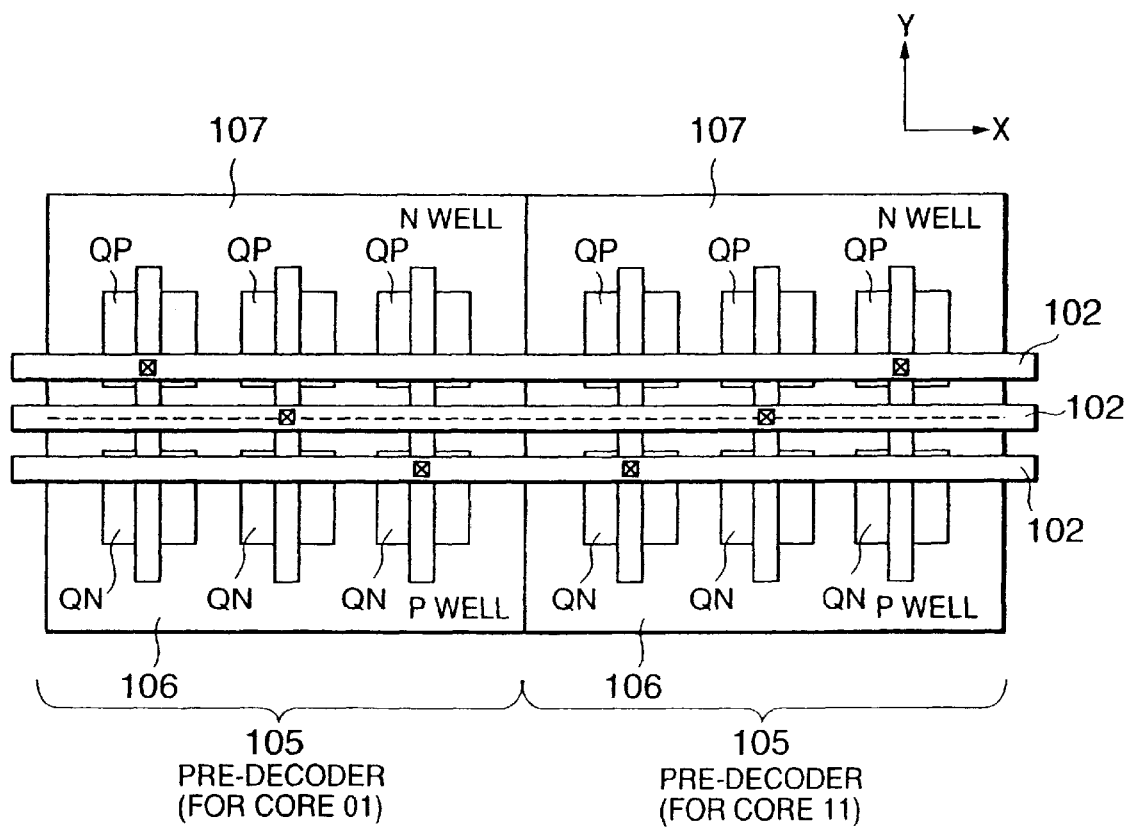
FIG. 52B is a layout drawing of a pre-decoder part in the preferred embodiment.

FIGS. 52A and 52B show a preferred embodiment wherein the concentration of the decode output lines 201 in the preferred embodiment shown in FIGS. 51A and 51B is avoided. In this preferred embodiment, the pre-decoders 105 in the upper and lower cores in the preferred embodiment shown in FIGS. 51A and 51B are arranged line-symmetrically in X directions, and the body parts and Y decoders 104 in the upper and lower cores are arranged rotation-symmetrically.

As shown in FIG. 52A, the decode output lines 201 of each of the Y decoders 105 are extended on both sides in X directions to enter the Y decoders 104. Therefore, in comparison with the preferred embodiment shown in FIGS. 51A and 51B, the concentration of the lines in the Y decoders 104 is relieved, so that it is possible to reduce area penalty.

(Twenty-third Preferred Embodiment)

A preferred embodiment wherein the technique for providing the common bus lines in the preferred embodiment shown in FIGS. 52A and 52B is applied to a flash memory of a redundant circuit system will be described below.

In a flash memory using nonvolatile memory cells having a stacked gate structure for electrically writing/erasing data by utilizing tunnel current, if in a block serving a unit of batch erase has even one defective row wherein a word line is short-circuited with a channel, the block is defective. Because the erase voltage during data erase is not applied to the whole block due to the short-circuit of the single word line. Therefore, in order to cope with such a defect, a redundant block is provided for using a block redundancy for relieving a defect.

In order to realize the block redundancy when a core comprising a set of a plurality of blocks as described in the first preferred embodiment, an individual decoder circuit is preferably provided without attaching the redundant block to the core so that the redundant block can be replaced with an optional block in the core. A preferred embodiment of a layout having such a redundant block is shown in FIG. 53.

Figure 53:
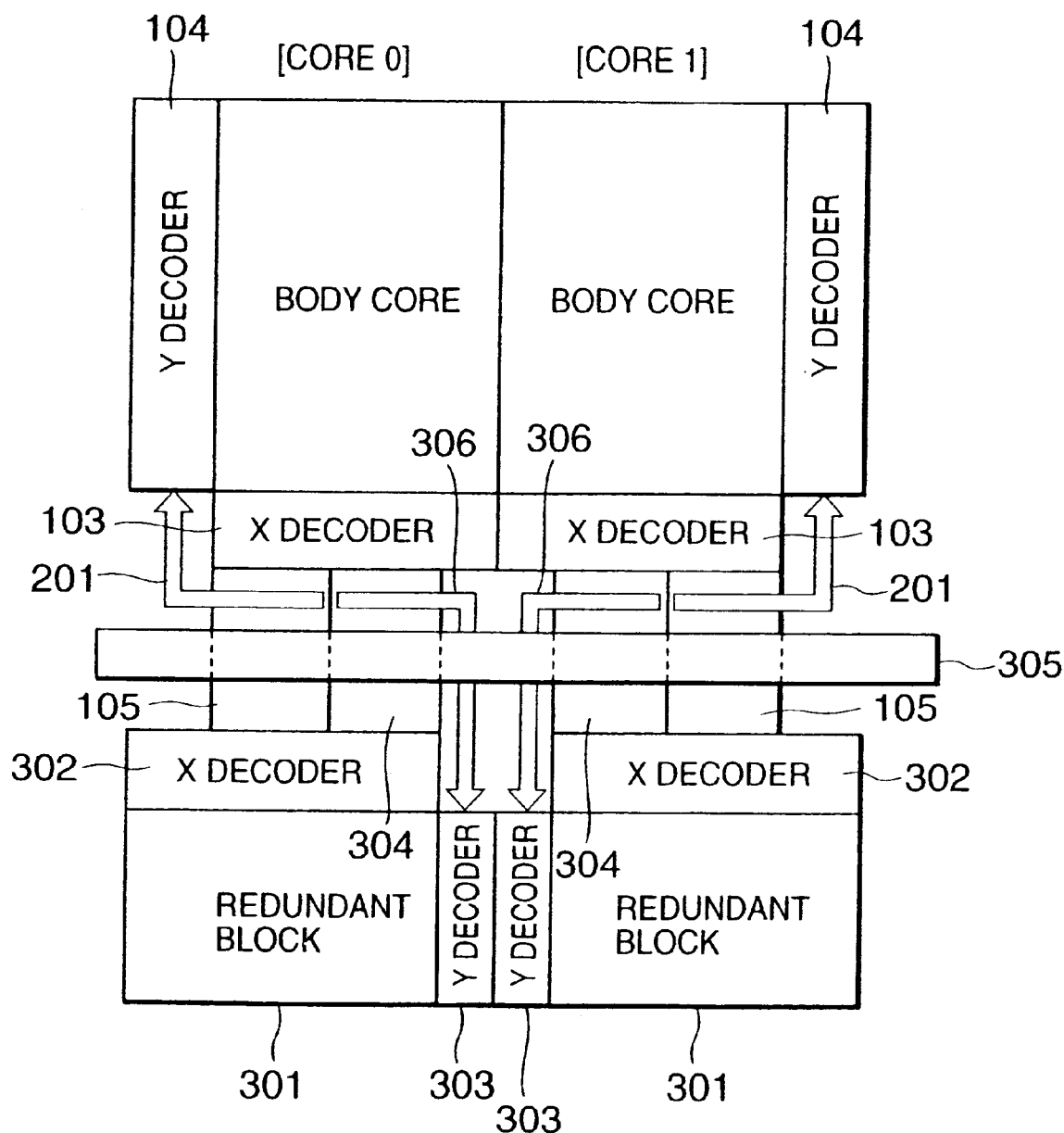
FIG. 53 is a layout drawing of another preferred embodiment of a flash memory according to the present invention, which has a redundant block.

FIG. 53 shows two cores each of which comprises a plurality of blocks. A redundant block 301 is provided with an X decoder 301 and a Y decoder 303, which are independent of the cores as described above, and a pre-decoder 304 at the front stage thereof. In addition, a pre-decoder 105 for the core body, and the pre-decoder 303 of the redundant block 301 are arranged by the same layout as the relationship between the two pre-decoders of the upper and lower cores in the preceding preferred embodiment shown in FIG. 52A and 52B.

That is, the pre-decoder 105 on the core side and the pre-decoder 304 on the redundant block 301 side are arranged in a region between the body core and the redundant block 301 so as to be line-symmetric in X directions. In addition, on the region of the pre-decoders 105 and 304, a common bus line 305 is provided continuously in X directions. Similar to the twenty-second preferred embodiment, the common bus line 305 is connected to the input signal lines of the respective pre-decoder 105 and 304 via contacts. Similar to the case of FIG. 52A, the decode output lines 201 and 306 of the respective pre-decoders 105 and 304 are distributed to be connected to the Y decoders 104 and 303 of the core and the redundant block 301, respectively.

Thus, also in the flash memory of the redundant circuit system, it is possible to effectively reduce area penalty by taking account of the arrangement of the common bus line.

(Twenty-fourth Preferred Embodiment)

A preferred embodiment of a sense amplifier according to the present invention, which is applied to a flash memory capable of simultaneously carrying out a data write/erase operation and a data read operation in the first preferred embodiment, will be described below.

Figure 54:
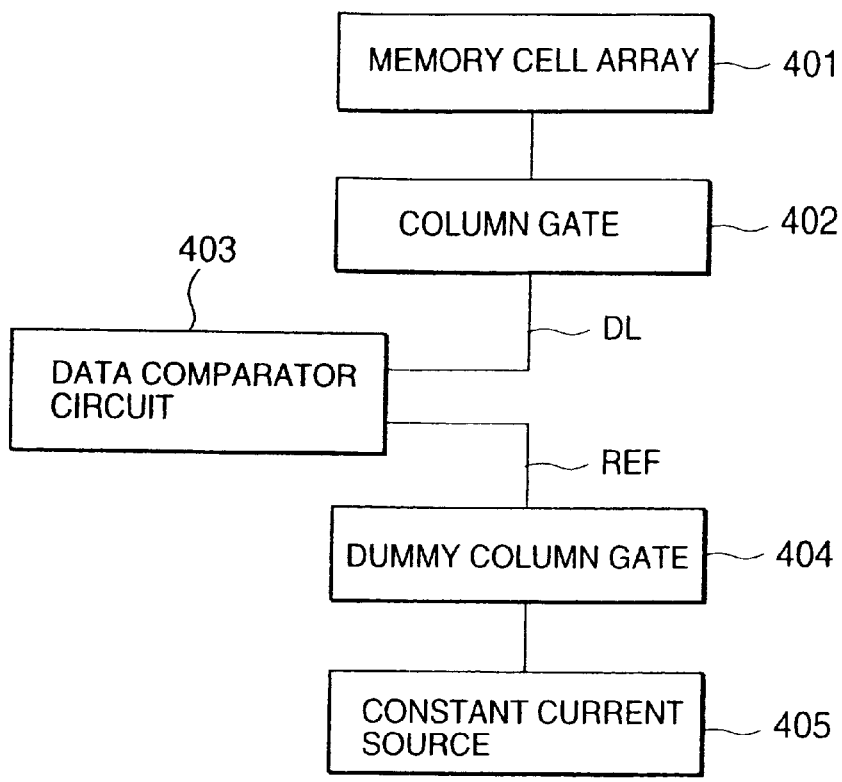
FIG. 54 is a diagram showing a typical read system of a flash memory.

Usually, a data read system used for a flash memory of this type is formed as shown in FIG. 54. A data line DL selected from a cell array 401 by a column gate 402 enters one input terminal of a data comparator circuit 403. A reference data line REF connected to the other input terminal of the data comparator circuit 403 is connected to a constant current source 405 via a dummy column gate 404. Thus, by comparing the current of the data line DL with the current of the reference data line PEF, data "0" or "1" is determined.

Figure 55:
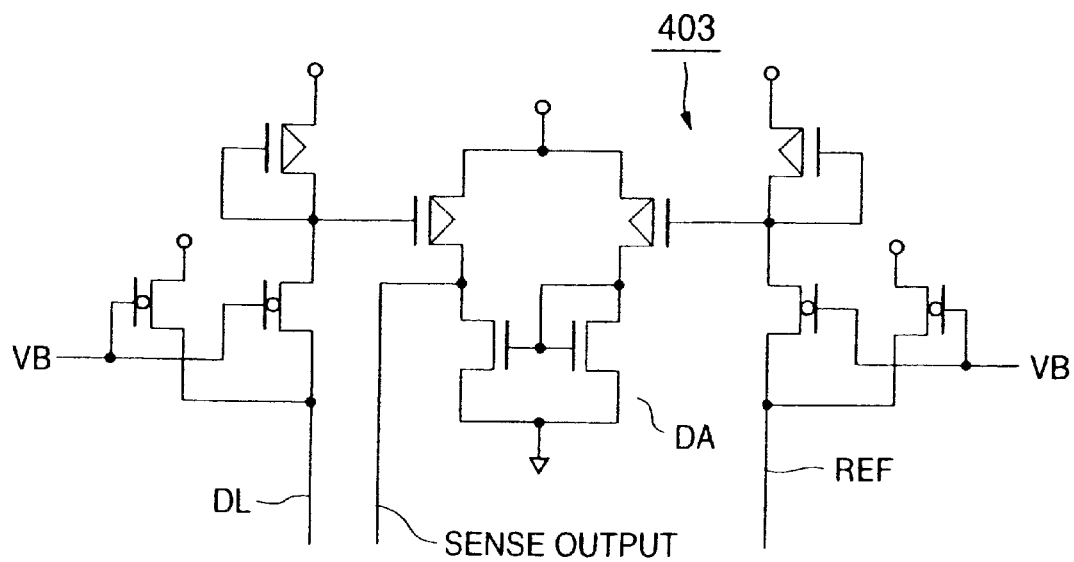
FIG. 55 is a circuit diagram of an example of a data comparator circuit for use in the read system.
Figure 56:
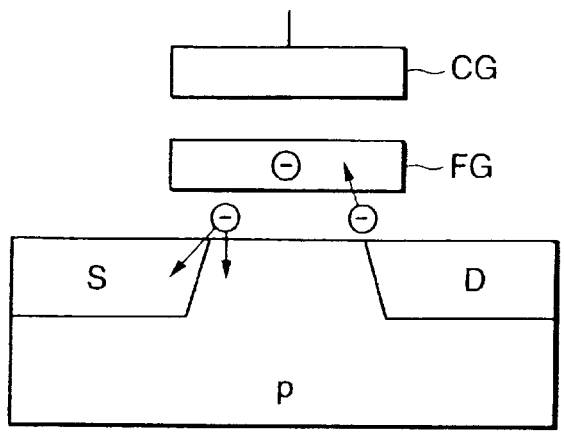
FIG. 56 is a diagram showing a write/erase operation in a memory cell.

For example, it is assumed that a flat memory is a NOR type flash memory. Then, as shown in FIG. 56, electrons are accumulated in a floating gate FG of a memory cell by the hot electron injection from the drain side, so that the memory cell is in a high threshold voltage state (e.g., "0" state). In addition, by discharging the electrons of the floating gate FG to the channel side, the memory cell is in a low threshold voltage state (e.g., "1" state). By comparing and detecting the presence of the drawing of current due to the difference between the threshold voltages, by means of the data comparator circuit 403, data are discriminated. For example, the data comparator circuit 403 mainly comprises a CMOS differential amplifier DA as shown in FIG. 55.

Although a verify read operation for verifying a write or erase state is carried out in a data write/erase operation, a constant current source generally used for the verify read operation can be common to that used for a usual data read operation. However, in a flash memory capable of simultaneously carrying out a data write/erase operation and a data read operation, a usual data read operation and a verify read operation are asynchronously carried out. In this case, since it is required to carry out data line equalization, it is difficult to share the constant current source. The data line equalization means to short-circuit the data line DL and reference data line REF, which are shown in FIG. 54, to initialize these lines in the same potential state in order to accelerate a data read operation.

Therefore, usually, constant current sources for a usual data read system and a verify read system are separately prepared. This causes another problem. That is, if there is dispersion in the respective constant current sources, a threshold voltage for a memory cell detected by a verify read operation is different from a threshold voltage detected by a usual read operation, so that error read is caused.

Figure 57:
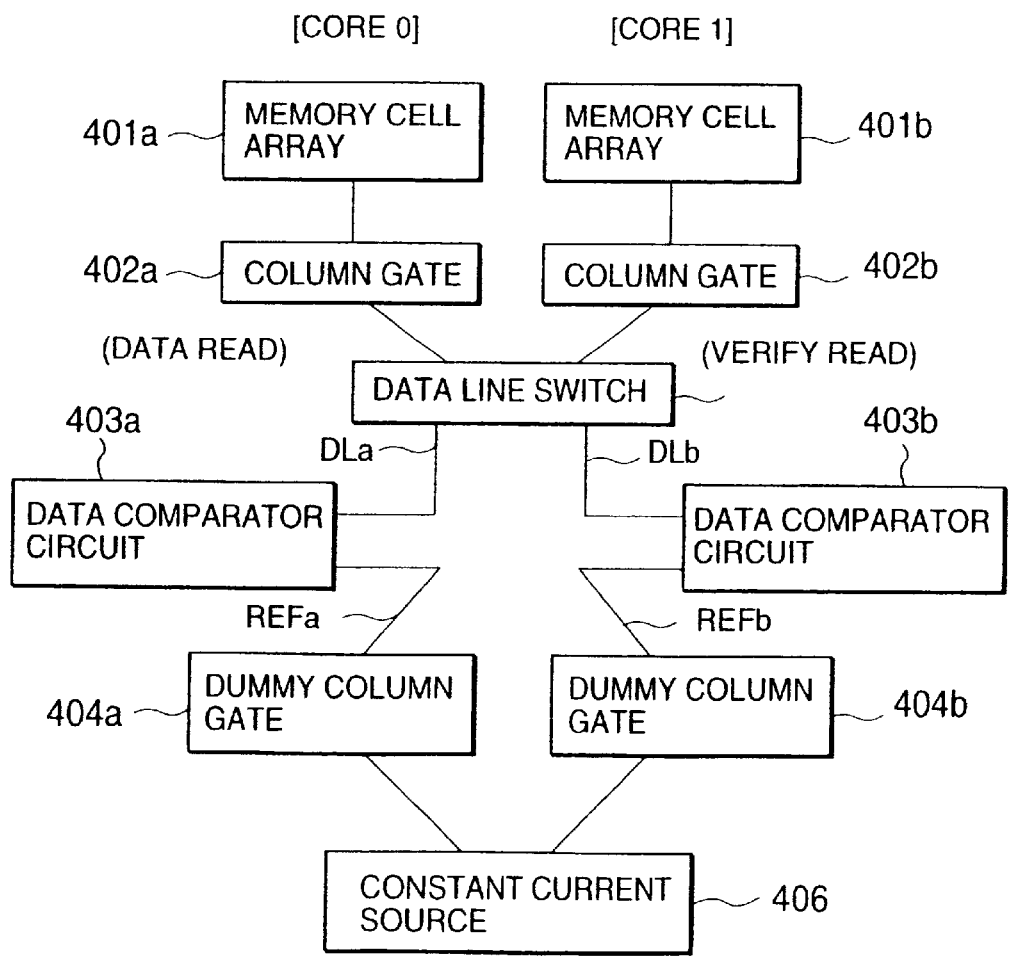
FIG. 57 is a diagram showing a read system in the preferred embodiment.

Therefore, in this preferred embodiment, a read system configuration is formed so that the constant current source for the usual read operation and the constant current source for the verify read operation have the same current value. This read system configuration is shown in FIG. 57. This figure shows read systems of two cores, core 0 in a data write/erase mode and core 1 in a data read mode. The bit lines of the memory cell arrays 401a and 401b of the respective cores are selected by column gates 402a and 402b, respectively. The output of each system is optionally switched by a data line switch 407. The effective data lines DLa nd DLb selected by the data line switch 407 enter data comparator circuits 403a and 403b, respectively. The reference signal lines REFa and REFb of the respective data comparator circuits 403a and 403b are connected to a common constant current source 406 via dummy column gates 404a and 404b, respectively.

Figure 58:
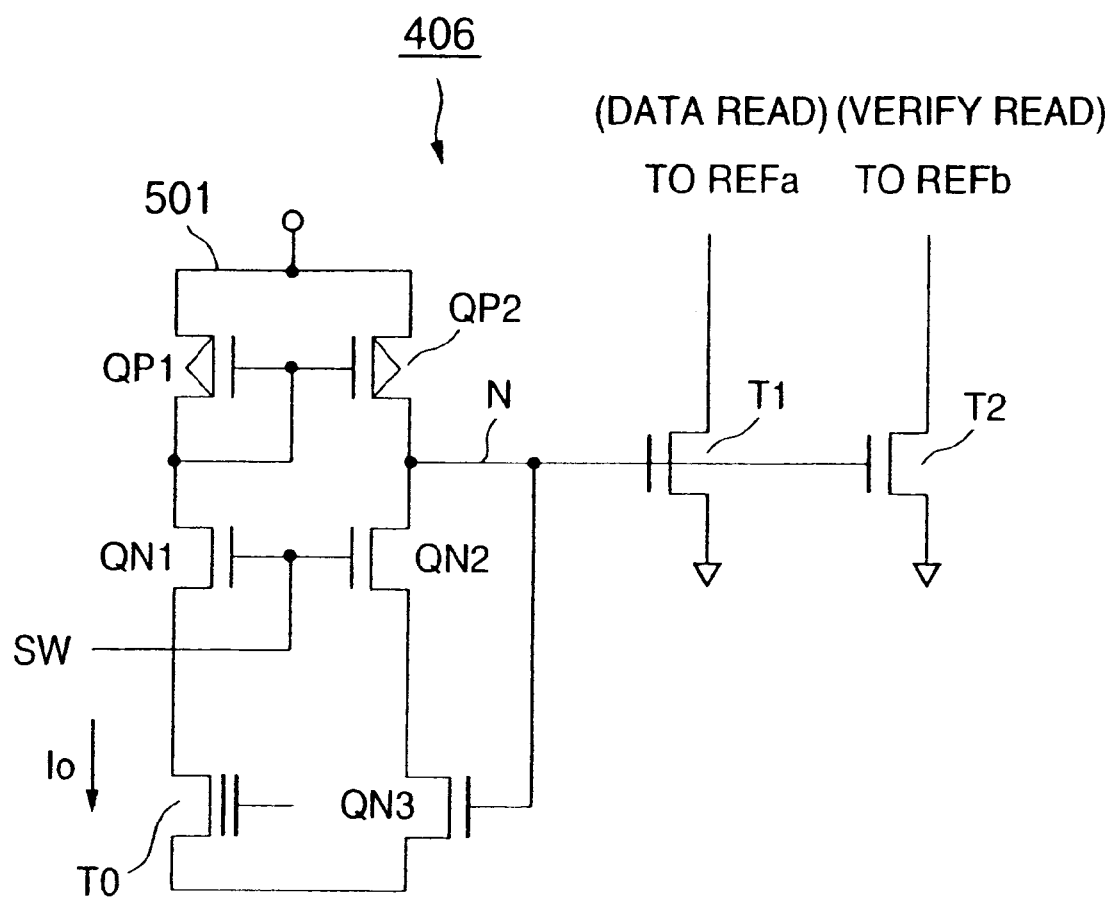
FIG. 58 is a circuit diagram of a constant current source for use in the read system.

The constant current source 406 is formed as shown in FIG. 58. A reference constant current source 501 has a PMOS current mirror using a pair of PMOS transistors QP1 and QP2, a reference current source transistor T0 connected to the PMOS transistor QP1 via a switching NMOS transistor QN1, and an NMOS transistor QN3 connected to the PMOS transistor QP2 via a switching MOS transistor QN2. The NMOS transistors QN1 and QN2 are driven by a control signal SW to control the activation and deactivation of the reference constant current source 501. The NMOS transistor QN3 is diode-connected via the NMOS transistor QN2.

The current IO passing through the reference current source transistor T0 is a reference current. If the PMOS transistors QP1 and QP2 are the same element parameter, the reference current I0 passes through the NMOS transistor QN3 by the function of the PMOS current mirror. In addition, there are provided two current source NMOS transistors T1 and T2 which are driven in parallel by the potential of the output node N of the reference constant current source 501 determined by the reference current I0. These two NMOS transistors T1 and T2 have the same element parameter, and the drains thereof are connected to reference signal lines REFa and REFb, respectively.

Thus, since the same current pass through the current source transistors T1 and T2, even if the set current value is shifted, the current values of the reference signal lines REFa and REFb in the usual read operation and the verify read operation are always the same, so that it is possible to obtain a high read margin.

In this preferred embodiment, the reference current source transistor T0 of the reference current source 501 is preferably an electrically rewritable nonvolatile memory cell which is the same as a nonvolatile memory cell used for a memory cell array. In this case, by rewriting the reference current source transistor T0, the reference current value I0 can be changed, so that the current values of the reference signal lines REFa and REFb can be change. Thus, even if the reference current value I0 is changed, the current values of the reference signal lines REFa and REFb are the same values.

As described above, according to this preferred embodiment, the current passing through the reference signal lines of the usual read system and verify read system can be always maintained at the same value, so that it is possible to surely prevent the deterioration of the read margin and error read.

As described above, according to the present invention, it is possible to obtain a flash memory of a free core system wherein a memory cell array comprises a plurality of cores, each of which comprises one block or a set of a plurality of blocks, each of which constitutes an erase unit of a flash memory, and an optional core can be selected to execute a data write or erase operation while executing a data read operation in another optional core. Unlike conventional flash memories, the range of simultaneously executing a data write or erase operation and a data read operation is not fixed, so that it is possible to obtain a flash memory having a high degree of freedom.

In addition, according to the present invention, an optionally selected core is used as a first bank and the rest of cores is a second bank by means of a bank setting memory circuit, so that it is possible to obtain a flash memory of a free bank system capable of optionally setting the bank size. Thus, while a data write or erase operation is carried out in an optional block in the first bank, a data read operation can be carried out in the second bank.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A semiconductor device comprising:
   a memory cell array having an arrangement of a plurality of cores, each of which comprises one block or a set of a plurality of blocks, each block defining a range of memory cells serving as a unit of data erase, each of said memory cells being an electrically rewritable nonvolatile memory cell;
   a core selecting portion configured to select an optional number of cores from said plurality of cores for writing or erasing data;
   a data writing portion configured to write data in a selected memory cell in a core selected by said core selecting portion;
   a data erasing portion configured to erase data from a selected block in a core selected by said core selecting portion;
   a data reading portion configured to read data out from a memory cell in a core which is not selected by said core selecting portion; and
   a bank setting memory circuit configured to select an optional number of cores of said plurality of cores as a first bank and to set the remaining cores as a second bank, so as to allow a data read operation to be carried out in one of said first and second banks while a data write or erase operation is carried out in the other of said first and second banks.

2. The semiconductor device as set forth in claim 1, which further comprises:
   a first data bus line which is provided commonly for said plurality of cores and which is used during a data read operation;
   a first sense amplifier circuit which is connected to said first data bus line and which is used during the data read operation;
   a second data bus line which is provided commonly for said plurality of cores and which is used during a data write or erase operation; and
   a second sense amplifier circuit which is connected to said second data bus line and which is used for carrying out a verify read operation during the data write or erase operation.

3. The semiconductor device as set forth in claim 1, which further comprises:
   a first address bus line which is provided commonly for said plurality of cores and which is used during a data read operation;
   a second address bus line which is provided commonly for said plurality of cores which is used during data write or erase operation;
   a first data bus line which is provided commonly for said plurality of cores and which is used during the data read operation;
   a first sense amplifier circuit which is connected to said first data bus line and which is used during the data read operation;
   a second data bus line which is provided commonly for said plurality of cores and which is used during the data write or erase operation;
   a second sense amplifier circuit which is connected to said second data bus line and which is used for carrying out a verify read operation during the data write or erase operation;
   a decoder circuit, provided for each of said plurality of cores, for allowing simultaneous execution of a data write or erase operation in an optional core in one of said first and second banks and a data read operation in the other of said first and second banks;
   an address line switching circuit, provided for each of said plurality of cores, for selectively supplying one of an address signal of said first address bus line and an address signal of said second address bus line to said decoder circuit, in accordance with whether a corresponding one of said plurality of cores is in a data read mode or a data write or erase mode; and a data line switching circuit, provided for each of said plurality of cores, for selectively connecting one of said first data bus line and said second data bus line to a data line of a corresponding one of said plurality of cores, in accordance with whether the corresponding one of said plurality of cores is in the data read mode or the data write or erase mode.

4. The semiconductor device as set forth in claim 3, which further comprises an address buffer which supplies an inputted address signal to said first address bus line without latching said inputted address signal during a data read operation, which latches and supplies an inputted address signal to said second address bus line during a data write operation, and which supplies an internal address signal, which is generated by a counter circuit, to said second address bus line during a data erase operation.

5. The semiconductor device as set forth in claim 1, which further comprises:
    a first power supply line which is provided commonly for said plurality of cores and which is used during the data read operation;
    a second power supply line which is provided commonly for said plurality of cores and which is used during the data write or erase operation; and
    a power supply line switching circuit, provided for each of said plurality of cores, for selectively supplying one of a data reading power supply potential of said first power supply line and a data writing or erasing power supply potential of said second power supply line to said decoder circuit in each of said plurality of cores, in accordance with whether a corresponding one of said plurality of cores is in a data read mode or a data write or erase mode.

6. The semiconductor device as set forth in claim 5, which further comprises:
    a core block register, provided for each block in each of said plurality of cores, for holding a data write or erase flag during a data write or erase operation when a data write or erase command for a block is inputted; and
    a core busy output circuit for monitoring said data write or erase flag of said core block register to output a core busy output serving as a data write or erase enable signal.

7. The semiconductor device as set forth in claim 3, wherein said address line switching circuit has therein a data polling signal generating circuit which generates a data polling signal informing the outside that a core is in a data write or erase mode, when a data read demand is inputted to the core while the mode of the core is selected as the data write or erase mode.

8. The semiconductor device as set forth in claim 1, which further comprises:
    a first address bus line which is provided commonly for said plurality of cores and which is used during the data read operation;
    a second address bus line which is provided commonly for said plurality of cores and which is used during the data write or erase operation;
    a first data bus line which is provided commonly for said plurality of cores and which is used during the data read operation;
    a first sense amplifier circuit which is connected to said first data bus line and which is used during the data read operation;
    a second data bus line which is provided commonly for said plurality of cores and which is used during the data write or erase operation; and
    a second sense amplifier circuit which is connected to said second data bus line and which is used for carrying out a verify read operation during the data write or erase operation,
    wherein said first address bus line, said first data bus line and said first sense amplifier circuit connected to said first data bus line are associated with each other for constituting a first data read path, and said second address bus line, said second data bus line and said second sense amplifier circuit connected to said second data bus line are associated with each other for constituting a second data read path, and the semiconductor device has a high-speed data read mode, in which the operations of said first and second data read paths overlap with each other by a half period to carry out a high-speed data read.

9. The semiconductor device as set forth in claim 8, which further comprises:
    a clock generating circuit which detects a transition in inputted address to generate a clock; and
    first and second latches which alternately latches the inputted address in synchronism with said clock generated by said clock generating circuit, to transfer the inputted address to said first and second address bus lines.

10. The semiconductor device as set forth in claim 5, which further comprises a dummy load capacity connected to said second power supply line in accordance with the number of selected cores.

11. The semiconductor device as set forth in claim 5, wherein driving capability of a data writing or erasing power supply connected to said second power supply line is switched in accordance with the number of selected cores.

12. The semiconductor device as set forth in claim 5, wherein said power supply switching circuit is switched and controlled while causing a power supply transition so that said first and second power supply lines have the same potential.

13. The semiconductor device as set forth in claim 1, wherein each of said plurality of cores has said plurality of blocks which are arranged in column directions by one or two columns and in row directions.

14. The semiconductor device as set forth in claim 1,
    a first address bus line which is provided commonly for said plurality of cores and which is used during the data read operation;
    a second address bus line which is provided commonly for said plurality of cores and which is used during the data write or erase operation;
    a first data bus line which is provided commonly for said plurality of cores and which is used during the data read operation;
    a first sense amplifier circuit which is connected to said first data bus line and which is used during the data read operation;
    a second data bus line which is provided commonly for said plurality of cores and which is used during the data write or erase mode operation; and
    a second sense amplifier circuit which is connected to said second data bus line and which is used for carrying out a verify read operation during the data write or erase operation, wherein said plurality of cores has said plurality of blocks which are arranged in column directions by one or two columns and in row directions, and said first and second address bus lines and said first and second data bus lines are arranged in row directions in parallel to the arrangement of said cores.

15. The semiconductor device as set forth in claim 5, wherein said plurality of cores has said plurality of blocks which are arranged in column directions by one or two columns and in row directions, and said first and second power supply lines are arranged in row directions in parallel to the arrangement of said cores.

16. The semiconductor device as set forth in claim 3, wherein said plurality of cores has said plurality of blocks which are arranged in column directions by one or two columns and in row directions, said first and second address bus lines and said first and second data bus lines are arranged in row directions in parallel to the arrangement of said cores, and said address line switching circuit and said data line switching circuit are arranged in row directions in parallel to the arrangement of said cores.

17. The semiconductor device as set forth in claim 5, wherein said plurality of cores has said plurality of blocks which are arranged in column direction by one or two columns and in row directions, said first and second power supply lines are arranged in row directions in parallel to the arrangement of said cores, and said power supply line switching circuit is arranged in row directions in parallel to the arrangement of said cores.

18. The semiconductor device as set forth in claim 5, which further comprises:

a first address bus line which is provided commonly for said plurality of cores and which is used during a data read operation; and a second address bus line which is provided commonly for said plurality of cores and which is used during a data write or erase operation, wherein said power supply line switching circuit supplies the potential of said second power supply line to said decoder circuit in each of said cores, which is selected by said second address bus line.

* * * * *